(12) United States Patent
Blank et al.

(10) Patent No.: US 11,577,652 B2
(45) Date of Patent: *Feb. 14, 2023

(54) VEHICULAR VIDEO CAMERA DISPLAY SYSTEM

(71) Applicant: MAGNA MIRRORS OF AMERICA, INC., Holland, MI (US)

(72) Inventors: Rodney K. Blank, Zeeland, MI (US); Mark L. Larson, Grand Haven, MI (US); Niall R. Lynam, Holland, MI (US)

(73) Assignee: MAGNA MIRRORS OF AMERICA, INC., Holland, MI (US)

( * ) Notice: Subject to any disclaimer, the term of this patent is extended or adjusted under 35 U.S.C. 154(b) by 64 days.

This patent is subject to a terminal disclaimer.

(21) Appl. No.: 17/303,404

(22) Filed: May 28, 2021

(65) Prior Publication Data
US 2021/0284070 A1 Sep. 16, 2021

Related U.S. Application Data

(63) Continuation of application No. 16/812,864, filed on Mar. 9, 2020, now Pat. No. 11,021,107, which is a
(Continued)

(51) Int. Cl.
*H04N 5/262* (2006.01)
*B60R 1/12* (2006.01)
(Continued)

(52) U.S. Cl.
CPC .............. *B60R 1/12* (2013.01); *G02B 27/01* (2013.01); *G02F 1/157* (2013.01); *G02F 1/1533* (2013.01);
(Continued)

(58) Field of Classification Search
CPC .............. B60R 1/12; B60R 2001/1215; B60R 2001/1253; G02B 2027/0118;
(Continued)

(56) References Cited

U.S. PATENT DOCUMENTS 2,166,303 A 7/1939 Hodney et al.
2,414,223 A 1/1947 De Virgilis
(Continued)

*Primary Examiner* — Md N Haque
(74) *Attorney, Agent, or Firm* — Honigman LLP

(57) ABSTRACT

A vehicular video camera display system includes an interior rearview mirror assembly having a casing and an electro-optic reflective element, with a video display device disposed in the casing behind the electro-optic reflective element. With the interior rearview mirror assembly mounted at the interior cabin portion of the vehicle, a video display screen of the video display device is operable to display video images that are viewable through the electro-optic reflective element by a driver of the vehicle. A rearward-viewing video camera is disposed at a rear portion of the vehicle and views at least rearward of the vehicle. Control circuitry is disposed at the interior rearview mirror assembly. Image data captured by the rearward-viewing video camera is communicated from the rearward-viewing video camera via a twisted pair wire to the control circuitry disposed at the interior rearview mirror assembly.

79 Claims, 31 Drawing Sheets

Related U.S. Application Data continuation of application No. 15/344,865, filed on Nov. 7, 2016, now Pat. No. 10,583,782, which is a continuation of application No. 12/578,732, filed on Oct. 14, 2009, now Pat. No. 9,487,144.

(60) Provisional application No. 61/219,214, filed on Jun. 22, 2009, provisional application No. 61/187,069, filed on Jun. 15, 2009, provisional application No. 61/117,301, filed on Nov. 24, 2008, provisional application No. 61/105,903, filed on Oct. 16, 2008.

(51) Int. Cl.

| | | |
|---|---|---|
| *G02B 27/01* | (2006.01) | |
| *G02F 1/153* | (2006.01) | |
| *G02F 1/157* | (2006.01) | |
| *H01L 27/32* | (2006.01) | |
| *H04N 5/232* | (2006.01) | |
| *G02B 5/00* | (2006.01) | |

(52) U.S. Cl.
CPC ...... *H01L 27/3232* (2013.01); *H01L 27/3234* (2013.01); *H04N 5/23293* (2013.01); *B60R 2001/1215* (2013.01); *B60R 2001/1253* (2013.01); *G02B 5/003* (2013.01); *G02B 2027/014* (2013.01); *G02B 2027/0118* (2013.01); *G02B 2027/0138* (2013.01)

(58) Field of Classification Search
CPC ...... G02B 2027/0138; G02B 2027/014; G02B 27/01; G02B 5/003; H04N 5/23293
See application file for complete search history.

(56) References Cited

U.S. PATENT DOCUMENTS

| | | |
|---|---|---|
| 3,004,473 A | 10/1961 | Athur et al. |
| 3,075,430 A | 1/1963 | Woodward et al. |
| 3,141,393 A | 7/1964 | Platt |
| 3,152,216 A | 10/1964 | Woodward |
| 3,185,020 A | 5/1965 | Thelen |
| 3,280,701 A | 10/1966 | Donnelly et al. |
| 3,432,225 A | 3/1969 | Rock |
| 3,451,741 A | 6/1969 | Manos |
| 3,453,038 A | 7/1969 | Kissa et al. |
| 3,467,465 A | 9/1969 | Van Noord |
| 3,521,941 A | 7/1970 | Deb et al. |
| 3,543,018 A | 11/1970 | Barcus et al. |
| 3,557,265 A | 1/1971 | Chisholm et al. |
| 3,565,985 A | 2/1971 | Schrenk et al. |
| 3,628,851 A | 12/1971 | Robertson |
| 3,676,668 A | 7/1972 | Collins et al. |
| 3,689,695 A | 9/1972 | Rosenfield et al. |
| 3,711,176 A | 1/1973 | Alfrey, Jr. et al. |
| 3,781,090 A | 12/1973 | Sumita |
| 3,806,229 A | 4/1974 | School et al. |
| 3,807,832 A | 4/1974 | Castellion |
| 3,821,590 A | 6/1974 | Kosman et al. |
| 3,860,847 A | 1/1975 | Carley |
| 3,870,404 A | 3/1975 | Wilson et al. |
| 3,876,287 A | 4/1975 | Sprokel |
| 3,978,190 A | 8/1976 | Kurz, Jr. et al. |
| 3,985,424 A | 10/1976 | Steinacher |
| 4,006,546 A | 2/1977 | Anderson et al. |
| 4,035,681 A | 7/1977 | Savage, Jr. |
| 4,052,712 A | 10/1977 | Ohama et al. |
| 4,075,468 A | 2/1978 | Marcus |
| 4,088,400 A | 5/1978 | Assouline et al. |
| 4,093,364 A | 6/1978 | Miller |
| 4,109,235 A | 8/1978 | Bouthors |
| 4,139,234 A | 2/1979 | Morgan |
| 4,171,875 A | 10/1979 | Taylor et al. |
| 4,174,152 A | 11/1979 | Giglia et al. |
| 4,211,955 A | 7/1980 | Ray |
| 4,214,266 A | 7/1980 | Myers |
| 4,221,955 A | 9/1980 | Joslyn |
| 4,228,490 A | 10/1980 | Thillays |
| 4,247,870 A | 1/1981 | Gabel et al. |
| 4,257,703 A | 3/1981 | Goodrich |
| 4,277,804 A | 7/1981 | Robison |
| 4,281,899 A | 8/1981 | Oskam |
| 4,288,814 A | 9/1981 | Talley et al. |
| 4,306,768 A | 12/1981 | Egging |
| 4,310,851 A | 1/1982 | Pierrat |
| 4,331,382 A | 5/1982 | Graff |
| 4,338,000 A | 7/1982 | Kamimori et al. |
| 4,377,613 A | 3/1983 | Gordon |
| 4,398,805 A | 8/1983 | Cole |
| 4,419,386 A | 12/1983 | Gordon |
| 4,420,238 A | 12/1983 | Felix |
| 4,425,717 A | 1/1984 | Marcus |
| 4,435,042 A | 3/1984 | Wood et al. |
| 4,435,048 A | 3/1984 | Kamimori et al. |
| 4,436,371 A | 3/1984 | Wood et al. |
| 4,443,057 A | 4/1984 | Bauer et al. |
| 4,446,171 A | 5/1984 | Thomas |
| 4,465,339 A | 8/1984 | Baucke et al. |
| 4,473,695 A | 9/1984 | Wrighton et al. |
| 4,490,227 A | 12/1984 | Bitter |
| 4,499,451 A | 2/1985 | Suzuki et al. |
| 4,524,941 A | 6/1985 | Wood et al. |
| 4,546,551 A | 10/1985 | Franks |
| 4,561,625 A | 12/1985 | Weaver |
| 4,580,196 A | 4/1986 | Task |
| 4,581,827 A | 4/1986 | Higashi |
| 4,588,267 A | 5/1986 | Pastore |
| 4,603,946 A | 8/1986 | Kato et al. |
| 4,626,850 A | 12/1986 | Chey |
| 4,630,109 A | 12/1986 | Barton |
| 4,630,904 A | 12/1986 | Pastore |
| 4,638,287 A | 1/1987 | Umebayashi et al. |
| 4,646,210 A | 2/1987 | Skogler et al. |
| 4,652,090 A | 3/1987 | Uchikawa et al. |
| 4,665,430 A | 5/1987 | Hiroyasu |
| 4,671,619 A | 6/1987 | Kamimori et al. |
| 4,692,798 A | 9/1987 | Seko et al. |
| 4,694,295 A | 9/1987 | Miller et al. |
| 4,702,566 A | 10/1987 | Tukude |
| 4,712,879 A | 12/1987 | Lynam et al. |
| 4,713,685 A | 12/1987 | Nishimura et al. |
| 4,729,076 A | 3/1988 | Masami et al. |
| 4,731,669 A | 3/1988 | Hayashi et al. |
| 4,733,335 A | 3/1988 | Serizawa et al. |
| 4,733,336 A | 3/1988 | Skogler et al. |
| 4,740,838 A | 4/1988 | Mase et al. |
| 4,761,061 A | 8/1988 | Nishiyama et al. |
| 4,780,752 A | 10/1988 | Angerstein et al. |
| 4,781,436 A | 11/1988 | Armbruster |
| 4,789,904 A | 12/1988 | Peterson |
| 4,793,690 A | 12/1988 | Gahan et al. |
| 4,793,695 A | 12/1988 | Wada et al. |
| 4,799,768 A | 1/1989 | Gahan |
| 4,807,096 A | 2/1989 | Skogler et al. |
| 4,825,232 A | 4/1989 | Howdle |
| 4,826,289 A | 5/1989 | Vandenbrink et al. |
| 4,847,772 A | 7/1989 | Michalopoulos et al. |
| 4,855,161 A | 8/1989 | Moser et al. |
| 4,859,867 A | 8/1989 | Larson et al. |
| 4,862,594 A | 9/1989 | Schierbeek et al. |
| 4,871,917 A | 10/1989 | O'Farrell et al. |
| 4,872,051 A | 10/1989 | Dye |
| 4,882,565 A | 11/1989 | Gallmeyer |
| 4,883,349 A | 11/1989 | Mittelhauser |
| 4,886,960 A | 12/1989 | Molyneux et al. |
| 4,892,345 A | 1/1990 | Rachael, III |
| 4,902,108 A | 2/1990 | Byker |
| 4,910,591 A | 3/1990 | Petrossian et al. |
| 4,916,374 A | 4/1990 | Schierbeek et al. |
| 4,926,170 A | 5/1990 | Beggs et al. |
| 4,930,742 A | 6/1990 | Schofield et al. |
| 4,935,665 A | 6/1990 | Murata |
| 4,936,533 A | 6/1990 | Adams et al. |

(56) References Cited

U.S. PATENT DOCUMENTS

| | | |
|---|---|---|
| 4,937,796 A | 6/1990 | Tendler |
| 4,937,945 A | 7/1990 | Schofield et al. |
| 4,943,796 A | 7/1990 | Lee |
| 4,948,242 A | 8/1990 | Desmond et al. |
| 4,953,305 A | 9/1990 | Van Lente et al. |
| 4,956,591 A | 9/1990 | Schierbeek et al. |
| 4,959,247 A | 9/1990 | Moser et al. |
| 4,959,865 A | 9/1990 | Stettiner et al. |
| 4,970,653 A | 11/1990 | Kenue |
| 4,973,844 A | 11/1990 | O'Farrell et al. |
| 4,987,357 A | 1/1991 | Masaki |
| 4,996,083 A | 2/1991 | Moser et al. |
| 5,001,558 A | 3/1991 | Burley et al. |
| 5,005,213 A | 4/1991 | Hanson et al. |
| 5,006,971 A | 4/1991 | Jenkins |
| 5,014,167 A | 5/1991 | Roberts |
| 5,016,996 A | 5/1991 | Ueno |
| 5,027,200 A | 6/1991 | Petrossian et al. |
| 5,038,255 A | 8/1991 | Nishihashi et al. |
| 5,056,899 A | 10/1991 | Warszawski |
| 5,058,851 A | 10/1991 | Lawlor et al. |
| 5,066,108 A | 11/1991 | McDonald |
| 5,066,112 A | 11/1991 | Lynam et al. |
| 5,073,012 A | 12/1991 | Lynam |
| 5,076,673 A | 12/1991 | Lynam et al. |
| 5,076,674 A | 12/1991 | Lynam |
| 5,096,287 A | 3/1992 | Kakinami et al. |
| 5,100,095 A | 3/1992 | Haan et al. |
| 5,105,127 A | 4/1992 | Lavaud et al. |
| 5,115,346 A | 5/1992 | Lynam |
| 5,117,346 A | 5/1992 | Gard |
| 5,121,200 A | 6/1992 | Choi |
| 5,128,799 A | 7/1992 | Byker |
| 5,131,154 A | 7/1992 | Schierbeek et al. |
| 5,135,298 A | 8/1992 | Feltman |
| 5,136,483 A | 8/1992 | Schoniger et al. |
| 5,140,455 A | 8/1992 | Varaprasad et al. |
| 5,142,407 A | 8/1992 | Varaprasad et al. |
| 5,151,816 A | 9/1992 | Varaprasad et al. |
| 5,151,824 A | 9/1992 | O'Farrell |
| 5,160,200 A | 11/1992 | Cheselske |
| 5,160,201 A | 11/1992 | Wrobel |
| 5,173,881 A | 12/1992 | Sindle |
| 5,178,448 A | 1/1993 | Adams et al. |
| 5,179,471 A | 1/1993 | Caskey et al. |
| 5,184,956 A | 2/1993 | Langlais et al. |
| 5,189,537 A | 2/1993 | O'Farrell |
| 5,193,029 A | 3/1993 | Schofield et al. |
| 5,197,562 A | 3/1993 | Kakinami et al. |
| 5,207,492 A | 5/1993 | Roberts |
| 5,214,408 A | 5/1993 | Asayama |
| 5,217,794 A | 6/1993 | Schrenk |
| 5,223,814 A | 6/1993 | Suman |
| 5,223,844 A | 6/1993 | Mansell et al. |
| 5,229,975 A | 7/1993 | Truesdell et al. |
| 5,230,400 A | 7/1993 | Kakinami et al. |
| 5,233,461 A | 8/1993 | Dornan et al. |
| 5,235,316 A | 8/1993 | Qualizza |
| 5,239,405 A | 8/1993 | Varaprasad et al. |
| 5,239,406 A | 8/1993 | Lynam |
| 5,243,417 A | 9/1993 | Pollard |
| 5,245,422 A | 9/1993 | Borcherts et al. |
| 5,252,354 A | 10/1993 | Cronin et al. |
| 5,253,109 A | 10/1993 | O'Farrell et al. |
| 5,255,442 A | 10/1993 | Schierbeek et al. |
| 5,277,986 A | 1/1994 | Cronin et al. |
| 5,280,555 A | 1/1994 | Ainsburg |
| 5,285,060 A | 2/1994 | Larson et al. |
| 5,289,321 A | 2/1994 | Secor |
| 5,296,924 A | 3/1994 | de Saint Blancard et al. |
| 5,303,205 A | 4/1994 | Gauthier et al. |
| 5,304,980 A | 4/1994 | Maekawa |
| 5,305,012 A | 4/1994 | Faris |
| 5,307,136 A | 4/1994 | Saneyoshi |
| 5,313,335 A | 5/1994 | Gray et al. |
| 5,325,096 A | 6/1994 | Pakett |
| 5,325,386 A | 6/1994 | Jewell et al. |
| 5,327,288 A | 7/1994 | Wellington et al. |
| 5,330,149 A | 7/1994 | Haan et al. |
| 5,331,312 A | 7/1994 | Kudoh |
| 5,331,358 A | 7/1994 | Schurle et al. |
| 5,339,075 A | 8/1994 | Abst et al. |
| 5,339,529 A | 8/1994 | Lindberg |
| 5,341,437 A | 8/1994 | Nakayama |
| D351,370 S | 10/1994 | Lawlor et al. |
| 5,355,118 A | 10/1994 | Fukuhara |
| 5,355,284 A | 10/1994 | Roberts |
| 5,361,190 A | 11/1994 | Roberts et al. |
| 5,371,659 A | 12/1994 | Pastrick et al. |
| 5,373,482 A | 12/1994 | Gauthier |
| 5,386,285 A | 1/1995 | Asayama |
| 5,406,395 A | 4/1995 | Wilson et al. |
| 5,406,414 A | 4/1995 | O'Farrell et al. |
| 5,408,357 A | 4/1995 | Beukema |
| 5,410,346 A | 4/1995 | Saneyoshi et al. |
| 5,414,461 A | 5/1995 | Kishi et al. |
| 5,416,313 A | 5/1995 | Larson et al. |
| 5,416,478 A | 5/1995 | Morinaga |
| 5,418,610 A | 5/1995 | Fischer |
| 5,422,756 A | 6/1995 | Weber |
| 5,424,726 A | 6/1995 | Beymer |
| 5,424,865 A | 6/1995 | Lynam |
| 5,424,952 A | 6/1995 | Asayama |
| 5,430,431 A | 7/1995 | Nelson |
| 5,432,496 A | 7/1995 | Lin |
| 5,439,305 A | 8/1995 | Santo |
| 5,444,478 A | 8/1995 | Lelong et al. |
| 5,446,576 A | 8/1995 | Lynam et al. |
| 5,455,716 A | 10/1995 | Suman et al. |
| 5,461,361 A | 10/1995 | Moore |
| 5,469,298 A | 11/1995 | Suman et al. |
| 5,475,366 A | 12/1995 | Van Lente et al. |
| 5,475,494 A | 12/1995 | Nishida et al. |
| 5,481,409 A | 1/1996 | Roberts |
| 5,483,453 A | 1/1996 | Uemura et al. |
| 5,485,161 A | 1/1996 | Vaughn |
| 5,485,378 A | 1/1996 | Franke et al. |
| 5,487,522 A | 1/1996 | Hook |
| 5,488,496 A | 1/1996 | Pine |
| 5,497,305 A | 3/1996 | Pastrick et al. |
| 5,497,306 A | 3/1996 | Pastrick |
| 5,500,760 A | 3/1996 | Varaprasad et al. |
| 5,510,983 A | 4/1996 | Lino |
| 5,515,448 A | 5/1996 | Nishitani |
| 5,519,621 A | 5/1996 | Wortham |
| 5,521,760 A | 5/1996 | De Young et al. |
| 5,523,811 A | 6/1996 | Wada et al. |
| 5,525,264 A | 6/1996 | Cronin et al. |
| 5,528,474 A | 6/1996 | Roney et al. |
| 5,529,138 A | 6/1996 | Shaw et al. |
| 5,530,240 A | 6/1996 | Larson et al. |
| 5,530,420 A | 6/1996 | Tsuchiya et al. |
| 5,530,421 A | 6/1996 | Marshall et al. |
| 5,535,056 A | 7/1996 | Caskey et al. |
| 5,535,144 A | 7/1996 | Kise |
| 5,539,397 A | 7/1996 | Asanuma et al. |
| 5,541,590 A | 7/1996 | Nishio |
| 5,550,677 A | 8/1996 | Schofield et al. |
| 5,566,224 A | 10/1996 | ul Azam et al. |
| 5,567,360 A | 10/1996 | Varaprasad et al. |
| 5,568,316 A | 10/1996 | Schrenk et al. |
| 5,570,127 A | 10/1996 | Schmidt |
| 5,572,354 A | 11/1996 | Desmond et al. |
| 5,574,443 A | 11/1996 | Hsieh |
| 5,576,687 A | 11/1996 | Blank et al. |
| 5,576,854 A | 11/1996 | Schmidt et al. |
| 5,576,975 A | 11/1996 | Sasaki et al. |
| 5,587,236 A | 12/1996 | Agrawal et al. |
| 5,602,542 A | 2/1997 | Widmann |
| 5,608,550 A | 3/1997 | Epstein et al. |
| 5,610,756 A | 3/1997 | Lynam et al. |
| 5,611,966 A | 3/1997 | Varaprasad et al. |
| 5,615,023 A | 3/1997 | Yang |
| 5,615,857 A | 4/1997 | Hook |

(56) References Cited

U.S. PATENT DOCUMENTS

| | | |
|---|---|---|
| 5,617,085 A | 4/1997 | Tsutsumi et al. |
| 5,626,800 A | 5/1997 | Williams et al. |
| 5,631,089 A | 5/1997 | Center, Jr. et al. |
| 5,631,638 A | 5/1997 | Kaspar et al. |
| 5,631,639 A | 5/1997 | Hibino et al. |
| 5,632,092 A | 5/1997 | Blank et al. |
| 5,632,551 A | 5/1997 | Roney et al. |
| 5,634,709 A | 6/1997 | Iwama |
| 5,642,238 A | 6/1997 | Sala |
| 5,644,851 A | 7/1997 | Blank et al. |
| 5,646,614 A | 7/1997 | Abersfelder et al. |
| 5,649,756 A | 7/1997 | Adams et al. |
| 5,649,758 A | 7/1997 | Dion |
| 5,650,765 A | 7/1997 | Park |
| 5,661,455 A | 8/1997 | Van Lente et al. |
| 5,662,375 A | 9/1997 | Adams et al. |
| 5,666,157 A | 9/1997 | Aviv |
| 5,668,663 A | 9/1997 | Varaprasad et al. |
| 5,668,675 A | 9/1997 | Fredricks |
| 5,669,698 A | 9/1997 | Zeldman et al. |
| 5,669,699 A | 9/1997 | Pastrick et al. |
| 5,669,704 A | 9/1997 | Pastrick |
| 5,669,705 A | 9/1997 | Pastrick et al. |
| 5,670,935 A | 9/1997 | Schofield et al. |
| 5,671,996 A | 9/1997 | Bos et al. |
| 5,673,994 A | 10/1997 | Fant, Jr. et al. |
| 5,673,999 A | 10/1997 | Koenck |
| 5,680,123 A | 10/1997 | Lee |
| 5,680,245 A | 10/1997 | Lynam |
| 5,686,975 A | 11/1997 | Lipton |
| 5,689,241 A | 11/1997 | Clarke, Sr. et al. |
| 5,691,848 A | 11/1997 | Van Lente et al. |
| 5,692,819 A | 12/1997 | Mitsutake et al. |
| 5,699,044 A | 12/1997 | Van Lente et al. |
| 5,708,410 A | 1/1998 | Blank et al. |
| 5,708,415 A | 1/1998 | Van Lente et al. |
| 5,708,857 A | 1/1998 | Ishibashi |
| 5,715,093 A | 2/1998 | Schierbeek et al. |
| 5,724,187 A | 3/1998 | Varaprasad et al. |
| 5,724,316 A | 3/1998 | Brunts |
| 5,729,194 A | 3/1998 | Spears et al. |
| 5,737,226 A | 4/1998 | Olson et al. |
| 5,741,966 A | 4/1998 | Handfield et al. |
| 5,745,050 A | 4/1998 | Nakagawa |
| 5,745,266 A | 4/1998 | Smith |
| 5,748,287 A | 5/1998 | Takahashi et al. |
| 5,751,211 A | 5/1998 | Shirai et al. |
| 5,751,246 A | 5/1998 | Hertel |
| 5,751,390 A | 5/1998 | Crawford et al. |
| 5,751,489 A | 5/1998 | Caskey et al. |
| 5,754,099 A | 5/1998 | Nishimura et al. |
| 5,760,828 A | 6/1998 | Cortes |
| 5,760,931 A | 6/1998 | Saburi et al. |
| 5,760,962 A | 6/1998 | Schofield et al. |
| 5,761,094 A | 6/1998 | Olson et al. |
| 5,762,823 A | 6/1998 | Hikmet |
| 5,767,793 A | 6/1998 | Agravante et al. |
| 5,775,762 A | 7/1998 | Vitito |
| 5,786,772 A | 7/1998 | Schofield et al. |
| 5,788,357 A | 8/1998 | Muth et al. |
| 5,790,973 A | 8/1998 | Blaker et al. |
| 5,793,308 A | 8/1998 | Rosinski et al. |
| 5,793,420 A | 8/1998 | Schmidt |
| 5,796,094 A | 8/1998 | Schofield et al. |
| 5,796,176 A | 8/1998 | Kramer et al. |
| 5,798,057 A | 8/1998 | Hikmet |
| 5,798,575 A | 8/1998 | O'Farrell et al. |
| 5,798,688 A | 8/1998 | Schofield |
| 5,802,727 A | 9/1998 | Blank et al. |
| 5,803,579 A | 9/1998 | Turnbull et al. |
| 5,805,367 A | 9/1998 | Kanazawa |
| 5,806,879 A | 9/1998 | Hamada et al. |
| 5,806,965 A | 9/1998 | Deese |
| 5,808,197 A | 9/1998 | Dao |
| 5,808,566 A | 9/1998 | Behr et al. |
| 5,808,589 A | 9/1998 | Fergason |
| 5,808,713 A | 9/1998 | Broer et al. |
| 5,808,777 A | 9/1998 | Lynam et al. |
| 5,808,778 A | 9/1998 | Bauer et al. |
| 5,812,321 A | 9/1998 | Schierbeek et al. |
| 5,813,745 A | 9/1998 | Fant, Jr. et al. |
| 5,818,625 A | 10/1998 | Forgette et al. |
| 5,820,097 A | 10/1998 | Spooner |
| 5,820,245 A | 10/1998 | Desmond et al. |
| 5,823,654 A | 10/1998 | Pastrick et al. |
| 5,825,527 A | 10/1998 | Forgette et al. |
| 5,837,994 A | 11/1998 | Stam et al. |
| 5,844,505 A | 12/1998 | Van Ryzin |
| 5,848,373 A | 12/1998 | DeLorme et al. |
| 5,850,176 A | 12/1998 | Kinoshita et al. |
| 5,863,116 A | 1/1999 | Pastrick et al. |
| 5,867,801 A | 2/1999 | Denny |
| 5,871,275 A | 2/1999 | O'Farrell et al. |
| 5,877,707 A | 3/1999 | Kowalick |
| 5,877,897 A | 3/1999 | Schofield et al. |
| 5,878,353 A | 3/1999 | ul Azam et al. |
| 5,878,370 A | 3/1999 | Olson |
| 5,879,074 A | 3/1999 | Pastrick |
| 5,883,605 A | 3/1999 | Knapp |
| 5,883,739 A | 3/1999 | Ashihara et al. |
| 5,888,431 A | 3/1999 | Tonar et al. |
| 5,899,551 A | 5/1999 | Neijzen et al. |
| 5,899,956 A | 5/1999 | Chan |
| 5,904,729 A | 5/1999 | Ruzicka |
| 5,910,854 A | 6/1999 | Varaprasad et al. |
| 5,914,815 A | 6/1999 | Bos |
| 5,917,664 A | 6/1999 | O'Neill et al. |
| 5,918,180 A | 6/1999 | Dimino |
| 5,923,027 A | 7/1999 | Stam et al. |
| 5,923,457 A | 7/1999 | Byker et al. |
| 5,924,212 A | 7/1999 | Domanski |
| 5,928,572 A | 7/1999 | Tonar et al. |
| 5,929,786 A | 7/1999 | Schofield et al. |
| 5,938,321 A | 8/1999 | Bos et al. |
| 5,938,721 A | 8/1999 | Dussell et al. |
| 5,940,011 A | 8/1999 | Agravante et al. |
| 5,940,120 A | 8/1999 | Frankhouse et al. |
| 5,940,201 A | 8/1999 | Ash et al. |
| 5,942,895 A | 8/1999 | Popovic et al. |
| 5,949,331 A | 9/1999 | Schofield et al. |
| 5,956,079 A | 9/1999 | Ridgley |
| 5,956,181 A | 9/1999 | Lin |
| 5,959,367 A | 9/1999 | O'Farrell et al. |
| 5,959,555 A | 9/1999 | Furuta |
| 5,959,577 A | 9/1999 | Fan et al. |
| 5,963,247 A | 10/1999 | Banitt |
| 5,965,247 A | 10/1999 | Jonza et al. |
| 5,971,552 A | 10/1999 | O'Farrell et al. |
| 5,973,760 A | 10/1999 | Dehmlow |
| 5,975,715 A | 11/1999 | Bauder |
| 5,984,482 A | 11/1999 | Rumsey et al. |
| 5,986,730 A | 11/1999 | Hansen et al. |
| 5,990,469 A | 11/1999 | Bechtel et al. |
| 5,998,617 A | 12/1999 | Srinivasa et al. |
| 5,998,929 A | 12/1999 | Bechtel et al. |
| 6,000,823 A | 12/1999 | Desmond et al. |
| 6,001,486 A | 12/1999 | Varaprasad et al. |
| 6,002,511 A | 12/1999 | Varaprasad et al. |
| 6,002,544 A | 12/1999 | Yatsu |
| 6,007,222 A | 12/1999 | Thau |
| 6,008,486 A | 12/1999 | Stam et al. |
| 6,008,871 A | 12/1999 | Okumura |
| 6,009,359 A | 12/1999 | El-Hakim et al. |
| 6,016,035 A | 1/2000 | Eberspacher et al. |
| 6,016,215 A | 1/2000 | Byker |
| 6,019,411 A | 2/2000 | Carter et al. |
| 6,019,475 A | 2/2000 | Lynam et al. |
| 6,021,371 A | 2/2000 | Fultz |
| 6,023,229 A | 2/2000 | Bugno et al. |
| 6,025,872 A | 2/2000 | Ozaki et al. |
| 6,037,689 A | 3/2000 | Bingle et al. |
| 6,042,253 A | 3/2000 | Fant, Jr. et al. |
| 6,045,243 A | 4/2000 | Muth et al. |
| 6,045,643 A | 4/2000 | Byker et al. |

(56) References Cited

U.S. PATENT DOCUMENTS

| | | |
|---|---|---|
| 6,046,766 A | 4/2000 | Sakata |
| 6,046,837 A | 4/2000 | Yamamoto |
| 6,049,171 A | 4/2000 | Stam et al. |
| 6,060,989 A | 5/2000 | Gehlot |
| 6,061,002 A | 5/2000 | Weber et al. |
| 6,064,508 A | 5/2000 | Forgette et al. |
| 6,065,840 A | 5/2000 | Caskey et al. |
| 6,067,111 A | 5/2000 | Hahn et al. |
| 6,067,500 A | 5/2000 | Morimoto et al. |
| 6,072,391 A | 6/2000 | Suzuki et al. |
| 6,074,777 A | 6/2000 | Reimers et al. |
| 6,078,355 A | 6/2000 | Zengel |
| 6,078,865 A | 6/2000 | Koyanagi |
| 6,082,881 A | 7/2000 | Hicks |
| 6,084,700 A | 7/2000 | Knapp et al. |
| 6,086,131 A | 7/2000 | Bingle et al. |
| 6,086,229 A | 7/2000 | Pastrick |
| 6,087,012 A | 7/2000 | Varaprasad et al. |
| 6,087,953 A | 7/2000 | DeLine et al. |
| 6,094,618 A | 7/2000 | Harada |
| 6,097,023 A | 8/2000 | Schofield et al. |
| 6,097,316 A | 8/2000 | Liaw et al. |
| 6,099,131 A | 8/2000 | Fletcher et al. |
| 6,099,155 A | 8/2000 | Pastrick et al. |
| 6,102,559 A | 8/2000 | Nold et al. |
| 6,104,552 A | 8/2000 | Thau et al. |
| 6,106,121 A | 8/2000 | Buckley et al. |
| 6,111,498 A | 8/2000 | Jobes, I et al. |
| 6,111,683 A | 8/2000 | Cammenga et al. |
| 6,111,684 A | 8/2000 | Forgette et al. |
| 6,111,685 A | 8/2000 | Tench et al. |
| 6,111,696 A | 8/2000 | Allen et al. |
| 6,115,651 A | 9/2000 | Cruz |
| 6,116,743 A | 9/2000 | Hoek |
| 6,122,597 A | 9/2000 | Saneyoshi et al. |
| 6,124,647 A | 9/2000 | Marcus et al. |
| 6,124,886 A | 9/2000 | DeLine et al. |
| 6,127,945 A | 10/2000 | Mura-Smith |
| 6,128,576 A | 10/2000 | Nishimoto et al. |
| 6,130,421 A | 10/2000 | Bechtel et al. |
| 6,130,448 A | 10/2000 | Bauer et al. |
| 6,132,072 A | 10/2000 | Turnbull et al. |
| 6,139,171 A | 10/2000 | Waldmann |
| 6,139,172 A | 10/2000 | Bos et al. |
| 6,140,933 A | 10/2000 | Bugno et al. |
| 6,146,003 A | 11/2000 | Thau |
| 6,148,261 A | 11/2000 | Obradovich et al. |
| 6,149,287 A | 11/2000 | Pastrick et al. |
| 6,150,014 A | 11/2000 | Chu et al. |
| 6,151,065 A | 11/2000 | Steed et al. |
| 6,151,539 A | 11/2000 | Bergholz et al. |
| 6,152,590 A | 11/2000 | Furst et al. |
| 6,154,149 A | 11/2000 | Fyckowski et al. |
| 6,154,306 A | 11/2000 | Varaprasad et al. |
| 6,157,294 A | 12/2000 | Urai et al. |
| 6,158,655 A | 12/2000 | DeVries, Jr. et al. |
| 6,161,865 A | 12/2000 | Rose et al. |
| 6,166,625 A | 12/2000 | Teowee et al. |
| 6,166,629 A | 12/2000 | Hamma et al. |
| 6,166,847 A | 12/2000 | Tench et al. |
| 6,166,848 A | 12/2000 | Cammenga et al. |
| 6,167,755 B1 | 1/2001 | Damson et al. |
| 6,169,955 B1 | 1/2001 | Fultz |
| 6,170,956 B1 | 1/2001 | Rumsey et al. |
| 6,172,600 B1 | 1/2001 | Kakinami et al. |
| 6,172,601 B1 | 1/2001 | Wada et al. |
| 6,172,613 B1 | 1/2001 | DeLine et al. |
| 6,173,501 B1 | 1/2001 | Blank et al. |
| 6,175,164 B1 | 1/2001 | O'Farrell et al. |
| 6,175,300 B1 | 1/2001 | Kendrick |
| 6,176,602 B1 | 1/2001 | Pastrick et al. |
| 6,178,034 B1 | 1/2001 | Allemand et al. |
| 6,178,377 B1 | 1/2001 | Ishihara et al. |
| 6,182,006 B1 | 1/2001 | Meek |
| 6,183,119 B1 | 2/2001 | Desmond et al. |
| 6,184,679 B1 | 2/2001 | Popovic et al. |
| 6,184,781 B1 | 2/2001 | Ramakesavan |
| 6,185,492 B1 | 2/2001 | Kagawa et al. |
| 6,185,501 B1 | 2/2001 | Smith et al. |
| 6,188,505 B1 | 2/2001 | Lomprey et al. |
| 6,191,704 B1 | 2/2001 | Takenaga et al. |
| 6,196,688 B1 | 3/2001 | Caskey et al. |
| 6,198,409 B1 | 3/2001 | Schofield et al. |
| 6,199,014 B1 | 3/2001 | Walker et al. |
| 6,200,010 B1 | 3/2001 | Anders |
| 6,201,642 B1 | 3/2001 | Bos |
| 6,210,008 B1 | 4/2001 | Hoekstra et al. |
| 6,210,012 B1 | 4/2001 | Broer |
| 6,212,470 B1 | 4/2001 | Seymour et al. |
| 6,217,181 B1 | 4/2001 | Lynam et al. |
| 6,218,934 B1 | 4/2001 | Regan |
| 6,222,447 B1 | 4/2001 | Schofield et al. |
| 6,222,460 B1 | 4/2001 | DeLine et al. |
| 6,227,689 B1 | 5/2001 | Miller |
| 6,232,937 B1 | 5/2001 | Jacobsen et al. |
| 6,239,851 B1 | 5/2001 | Hatazawa et al. |
| 6,239,898 B1 | 5/2001 | Byker et al. |
| 6,243,003 B1 | 6/2001 | DeLine et al. |
| 6,245,262 B1 | 6/2001 | Varaprasad et al. |
| 6,249,214 B1 | 6/2001 | Kashiwazaki |
| 6,250,148 B1 | 6/2001 | Lynam |
| 6,250,766 B1 | 6/2001 | Strumolo et al. |
| 6,250,783 B1 | 6/2001 | Stidham et al. |
| 6,255,639 B1 | 7/2001 | Stam et al. |
| 6,257,746 B1 | 7/2001 | Todd et al. |
| 6,259,412 B1 | 7/2001 | Duroux |
| 6,259,475 B1 | 7/2001 | Ramachandran et al. |
| 6,265,968 B1 | 7/2001 | Betzitza et al. |
| 6,268,803 B1 | 7/2001 | Gunderson et al. |
| 6,269,308 B1 | 7/2001 | Kodaka et al. |
| 6,274,221 B2 | 8/2001 | Smith et al. |
| 6,276,821 B1 | 8/2001 | Pastrick et al. |
| 6,276,822 B1 | 8/2001 | Bedrosian et al. |
| 6,277,471 B1 | 8/2001 | Tang |
| 6,278,271 B1 | 8/2001 | Schott |
| 6,278,377 B1 | 8/2001 | DeLine et al. |
| 6,278,941 B1 | 8/2001 | Yokoyama |
| 6,280,068 B1 | 8/2001 | Mertens et al. |
| 6,280,069 B1 | 8/2001 | Pastrick et al. |
| 6,281,804 B1 | 8/2001 | Haller et al. |
| 6,286,965 B1 | 9/2001 | Caskey et al. |
| 6,286,984 B1 | 9/2001 | Berg |
| 6,289,332 B2 | 9/2001 | Menig et al. |
| 6,290,378 B1 | 9/2001 | Buchalla et al. |
| 6,291,906 B1 | 9/2001 | Marcus et al. |
| 6,294,989 B1 | 9/2001 | Schofield et al. |
| 6,296,379 B1 | 10/2001 | Pastrick |
| 6,297,781 B1 | 10/2001 | Turnbull et al. |
| 6,299,333 B1 | 10/2001 | Pastrick et al. |
| 6,300,879 B1 | 10/2001 | Regan et al. |
| 6,304,173 B2 | 10/2001 | Pala et al. |
| 6,305,807 B1 | 10/2001 | Schierbeek |
| 6,310,611 B1 | 10/2001 | Caldwell |
| 6,310,714 B1 | 10/2001 | Lomprey et al. |
| 6,310,738 B1 | 10/2001 | Chu |
| 6,313,454 B1 | 11/2001 | Bos et al. |
| 6,314,295 B1 | 11/2001 | Kawamoto |
| 6,317,057 B1 | 11/2001 | Lee |
| 6,317,248 B1 | 11/2001 | Agrawal et al. |
| 6,318,870 B1 | 11/2001 | Spooner et al. |
| 6,320,176 B1 | 11/2001 | Schofield et al. |
| 6,320,282 B1 | 11/2001 | Caldwell |
| 6,320,612 B1 | 11/2001 | Young |
| 6,324,295 B1 | 11/2001 | Valery et al. |
| 6,326,613 B1 | 12/2001 | Heslin et al. |
| 6,326,900 B2 | 12/2001 | DeLine et al. |
| 6,329,925 B1 | 12/2001 | Skiver et al. |
| 6,330,511 B2 | 12/2001 | Ogura et al. |
| 6,331,066 B1 | 12/2001 | Desmond et al. |
| 6,333,759 B1 | 12/2001 | Mazzilli |
| 6,335,680 B1 | 1/2002 | Matsuoka |
| 6,336,737 B1 | 1/2002 | Thau |
| 6,341,523 B2 | 1/2002 | Lynam |
| 6,344,805 B1 | 2/2002 | Yasui et al. |

(56) References Cited

U.S. PATENT DOCUMENTS

| | | |
|---|---|---|
| 6,346,698 B1 | 2/2002 | Turnbull |
| 6,347,880 B1 | 2/2002 | Furst et al. |
| 6,348,858 B2 | 2/2002 | Weis et al. |
| 6,351,708 B1 | 2/2002 | Takagi et al. |
| 6,353,392 B1 | 3/2002 | Schofield et al. |
| 6,356,206 B1 | 3/2002 | Takenaga et al. |
| 6,356,376 B1 | 3/2002 | Tonar et al. |
| 6,356,389 B1 | 3/2002 | Nilsen et al. |
| 6,357,883 B1 | 3/2002 | Strumolo et al. |
| 6,362,548 B1 | 3/2002 | Bingle et al. |
| 6,363,326 B1 | 3/2002 | Scully |
| 6,366,213 B2 | 4/2002 | DeLine et al. |
| 6,370,329 B1 | 4/2002 | Teuchert |
| 6,371,636 B1 | 4/2002 | Wesson |
| 6,386,742 B1 | 5/2002 | DeLine et al. |
| 6,390,529 B1 | 5/2002 | Bingle et al. |
| 6,390,635 B2 | 5/2002 | Whitehead et al. |
| 6,396,397 B1 | 5/2002 | Bos et al. |
| 6,396,637 B2 | 5/2002 | Roest et al. |
| 6,407,847 B1 | 6/2002 | Poll et al. |
| 6,408,247 B1 | 6/2002 | Ichikawa et al. |
| 6,411,204 B1 | 6/2002 | Bloomfield et al. |
| 6,412,959 B1 | 7/2002 | Tseng |
| 6,412,973 B1 | 7/2002 | Bos et al. |
| 6,415,230 B1 | 7/2002 | Maruko et al. |
| 6,416,208 B2 | 7/2002 | Pastrick et al. |
| 6,417,786 B2 | 7/2002 | Learman et al. |
| 6,418,376 B1 | 7/2002 | Olson |
| 6,419,300 B1 | 7/2002 | Pavao et al. |
| 6,420,036 B1 | 7/2002 | Varaprasad et al. |
| 6,420,975 B1 | 7/2002 | DeLine et al. |
| 6,421,081 B1 | 7/2002 | Markus |
| 6,424,272 B1 | 7/2002 | Gutta et al. |
| 6,424,273 B1 | 7/2002 | Gutta et al. |
| 6,424,892 B1 | 7/2002 | Matsuoka |
| 6,426,492 B1 | 7/2002 | Bos et al. |
| 6,427,349 B1 | 8/2002 | Blank et al. |
| 6,428,172 B1 | 8/2002 | Hutzel et al. |
| 6,433,676 B2 | 8/2002 | DeLine et al. |
| 6,433,680 B1 | 8/2002 | Ho |
| 6,433,914 B1 | 8/2002 | Lomprey et al. |
| 6,437,688 B1 | 8/2002 | Kobayashi |
| 6,438,491 B1 | 8/2002 | Farmer |
| 6,439,755 B1 | 8/2002 | Fant, Jr. et al. |
| 6,441,872 B1 | 8/2002 | Ho |
| 6,445,287 B1 | 9/2002 | Schofield et al. |
| 6,447,128 B1 | 9/2002 | Lang et al. |
| 6,452,533 B1 | 9/2002 | Yamabuchi et al. |
| 6,463,369 B2 | 10/2002 | Sadano et al. |
| 6,466,701 B1 | 10/2002 | Ejiri et al. |
| 6,472,977 B1 | 10/2002 | Pochmuller |
| 6,473,001 B1 | 10/2002 | Blum |
| 6,474,853 B2 | 11/2002 | Pastrick et al. |
| 6,476,731 B1 | 11/2002 | Miki et al. |
| 6,477,460 B2 | 11/2002 | Kepler |
| 6,477,464 B2 | 11/2002 | McCarthy et al. |
| 6,483,429 B1 | 11/2002 | Yasui et al. |
| 6,483,438 B2 | 11/2002 | DeLine et al. |
| 6,487,500 B2 | 11/2002 | Lemelson et al. |
| 6,494,602 B2 | 12/2002 | Pastrick et al. |
| 6,498,620 B2 | 12/2002 | Schofield et al. |
| 6,501,387 B2 | 12/2002 | Skiver et al. |
| 6,512,624 B2 | 1/2003 | Tonar et al. |
| 6,513,252 B1 | 2/2003 | Schierbeek |
| 6,515,581 B1 | 2/2003 | Ho |
| 6,515,582 B1 | 2/2003 | Teowee et al. |
| 6,515,597 B1 | 2/2003 | Wada et al. |
| 6,516,664 B2 | 2/2003 | Lynam |
| 6,520,667 B1 | 2/2003 | Mousseau |
| 6,522,451 B1 | 2/2003 | Lynam |
| 6,522,969 B2 | 2/2003 | Kannonji |
| 6,534,884 B2 | 3/2003 | Marcus et al. |
| 6,539,306 B2 | 3/2003 | Turnbull |
| 6,542,085 B1 | 4/2003 | Yang |
| 6,542,182 B1 | 4/2003 | Chutorash |
| 6,545,598 B1 | 4/2003 | de Villeroche |
| 6,549,335 B1 | 4/2003 | Trapani et al. |
| 6,550,949 B1 | 4/2003 | Bauer et al. |
| 6,553,308 B1 | 4/2003 | Uhlmann et al. |
| 6,568,839 B1 | 5/2003 | Pastrick et al. |
| 6,572,233 B1 | 6/2003 | Northman et al. |
| 6,575,643 B2 | 6/2003 | Takahashi |
| 6,580,373 B1 | 6/2003 | Ohashi |
| 6,581,007 B2 | 6/2003 | Hasegawa et al. |
| 6,583,730 B2 | 6/2003 | Lang et al. |
| 6,591,192 B2 | 7/2003 | Okamura et al. |
| 6,593,565 B2 | 7/2003 | Heslin et al. |
| 6,593,984 B2 | 7/2003 | Arakawa et al. |
| 6,594,065 B2 | 7/2003 | Byker et al. |
| 6,594,067 B2 | 7/2003 | Poll et al. |
| 6,594,090 B2 | 7/2003 | Kruschwitz et al. |
| 6,594,583 B2 | 7/2003 | Ogura et al. |
| 6,594,614 B2 | 7/2003 | Studt et al. |
| 6,597,489 B1 | 7/2003 | Guarr et al. |
| 6,611,202 B2 | 8/2003 | Schofield et al. |
| 6,611,227 B1 | 8/2003 | Nebiyeloul-Kifle et al. |
| 6,611,759 B2 | 8/2003 | Brosche |
| 6,614,387 B1 | 9/2003 | Deadman |
| 6,616,313 B2 | 9/2003 | Furst et al. |
| 6,616,764 B2 | 9/2003 | Kramer et al. |
| 6,618,672 B2 | 9/2003 | Sasaki et al. |
| 6,624,936 B2 | 9/2003 | Kotchick et al. |
| 6,627,918 B2 | 9/2003 | Getz et al. |
| 6,630,888 B2 | 10/2003 | Lang et al. |
| 6,636,258 B2 | 10/2003 | Strumolo |
| 6,638,582 B1 | 10/2003 | Uchiyama et al. |
| 6,642,840 B2 | 11/2003 | Lang et al. |
| 6,642,851 B2 | 11/2003 | Deline et al. |
| 6,648,477 B2 | 11/2003 | Hutzel et al. |
| 6,657,708 B1 | 12/2003 | Drevilion et al. |
| 6,661,830 B1 | 12/2003 | Reed et al. |
| 6,665,592 B2 | 12/2003 | Kodama |
| 6,670,207 B1 | 12/2003 | Roberts |
| 6,670,910 B2 | 12/2003 | Delcheccolo et al. |
| 6,671,080 B2 | 12/2003 | Poll et al. |
| 6,672,731 B2 | 1/2004 | Schnell et al. |
| 6,672,734 B2 | 1/2004 | Lammers |
| 6,672,744 B2 | 1/2004 | DeLine et al. |
| 6,672,745 B1 | 1/2004 | Bauer et al. |
| 6,674,370 B2 | 1/2004 | Rodewald et al. |
| 6,675,075 B1 | 1/2004 | Engelsberg et al. |
| 6,678,083 B1 | 1/2004 | Anstee |
| 6,678,614 B2 | 1/2004 | McCarthy et al. |
| 6,683,539 B2 | 1/2004 | Trajkovic et al. |
| 6,683,969 B1 | 1/2004 | Nishigaki et al. |
| 6,685,348 B2 | 2/2004 | Pastrick et al. |
| 6,690,268 B2 | 2/2004 | Schofield et al. |
| 6,690,413 B1 | 2/2004 | Moore |
| 6,693,517 B2 | 2/2004 | McCarthy et al. |
| 6,693,518 B2 | 2/2004 | Kumata et al. |
| 6,693,519 B2 | 2/2004 | Keirstead |
| 6,693,524 B1 | 2/2004 | Payne |
| 6,700,692 B2 | 3/2004 | Tonar et al. |
| 6,709,136 B2 | 3/2004 | Pastrick et al. |
| 6,717,610 B1 | 4/2004 | Bos et al. |
| 6,717,712 B2 | 4/2004 | Lynam et al. |
| 6,726,337 B2 | 4/2004 | Whitehead et al. |
| 6,727,808 B1 | 4/2004 | Uselmann et al. |
| 6,727,844 B1 | 4/2004 | Zimmermann et al. |
| 6,731,332 B1 | 5/2004 | Yasui et al. |
| 6,734,807 B2 | 5/2004 | King |
| 6,736,526 B2 | 5/2004 | Matsuba et al. |
| 6,737,964 B2 | 5/2004 | Samman et al. |
| 6,738,088 B1 | 5/2004 | Uskolovsky et al. |
| 6,744,353 B2 | 6/2004 | Sjonell |
| 6,748,211 B1 | 6/2004 | Isaac et al. |
| 6,756,912 B2 | 6/2004 | Skiver et al. |
| 6,757,109 B2 | 6/2004 | Bos |
| 6,759,113 B1 | 7/2004 | Tang |
| 6,760,157 B1 | 7/2004 | Allen et al. |
| 6,774,356 B2 | 8/2004 | Heslin et al. |
| 6,774,810 B2 | 8/2004 | DeLine et al. |
| 6,778,904 B2 | 8/2004 | Iwami et al. |
| 6,784,129 B2 | 8/2004 | Seto et al. |

(56) References Cited

U.S. PATENT DOCUMENTS

| | | |
|---|---|---|
| 6,797,396 B1 | 9/2004 | Liu et al. |
| 6,800,871 B2 | 10/2004 | Matsuda et al. |
| 6,801,283 B2 | 10/2004 | Koyama et al. |
| 6,806,452 B2 | 10/2004 | Bos et al. |
| 6,810,323 B1 | 10/2004 | Bullock et al. |
| 6,824,281 B2 | 11/2004 | Schofield et al. |
| 6,832,848 B2 | 12/2004 | Pastrick |
| 6,836,725 B2 | 12/2004 | Millington et al. |
| 6,842,276 B2 | 1/2005 | Poll et al. |
| 6,846,098 B2 | 1/2005 | Bourdelais et al. |
| 6,847,487 B2 | 1/2005 | Burgner |
| 6,848,817 B2 | 2/2005 | Bos et al. |
| 6,853,491 B1 | 2/2005 | Ruhle et al. |
| 6,870,655 B1 | 3/2005 | Northman et al. |
| 6,870,656 B2 | 3/2005 | Tonar et al. |
| 6,871,982 B2 | 3/2005 | Holman et al. |
| 6,877,888 B2 | 4/2005 | DeLine et al. |
| 6,882,287 B2 | 4/2005 | Schofield |
| 6,891,563 B2 | 5/2005 | Schofield et al. |
| 6,902,284 B2 | 6/2005 | Hutzel et al. |
| 6,906,632 B2 | 6/2005 | DeLine et al. |
| 6,912,396 B2 | 6/2005 | Sziraki et al. |
| 6,922,902 B2 | 8/2005 | Schierbeek et al. |
| 6,928,180 B2 | 8/2005 | Stam et al. |
| 6,928,366 B2 | 8/2005 | Ockerse et al. |
| 6,930,737 B2 | 8/2005 | Weindorf et al. |
| 6,934,067 B2 | 8/2005 | Ash et al. |
| 6,946,978 B2 | 9/2005 | Schofield |
| 6,947,576 B2 | 9/2005 | Stam et al. |
| 6,947,577 B2 | 9/2005 | Stam et al. |
| 6,951,410 B2 | 10/2005 | Parsons |
| 6,951,681 B2 | 10/2005 | Hartley et al. |
| 6,952,312 B2 | 10/2005 | Weber et al. |
| 6,968,273 B2 | 11/2005 | Ockerse et al. |
| 6,972,888 B2 | 12/2005 | Poll et al. |
| 6,974,236 B2 | 12/2005 | Tenmyo |
| 6,975,215 B2 | 12/2005 | Schofield et al. |
| 6,977,702 B2 | 12/2005 | Wu |
| 6,980,092 B2 | 12/2005 | Turnbull et al. |
| 6,985,291 B2 | 1/2006 | Watson et al. |
| 6,992,718 B1 | 1/2006 | Takahara |
| 7,001,058 B2 | 2/2006 | Inditsky |
| 7,004,592 B2 | 2/2006 | Varaprasad et al. |
| 7,004,593 B2 | 2/2006 | Weller et al. |
| 7,006,173 B1 | 2/2006 | Hiyama et al. |
| 7,009,751 B2 | 3/2006 | Tonar et al. |
| 7,012,543 B2 | 3/2006 | DeLine et al. |
| 7,041,965 B2 | 5/2006 | Heslin et al. |
| 7,042,616 B2 | 5/2006 | Tonar et al. |
| 7,046,418 B2 | 5/2006 | Lin et al. |
| 7,046,448 B2 | 5/2006 | Burgner |
| 7,057,681 B2 | 6/2006 | Hinata et al. |
| 7,092,052 B2 | 8/2006 | Okamoto et al. |
| 7,108,409 B2 | 9/2006 | DeLine et al. |
| 7,125,131 B2 | 10/2006 | Olczak |
| 7,132,064 B2 | 11/2006 | Li et al. |
| 7,149,613 B2 | 12/2006 | Stam et al. |
| 7,151,997 B2 | 12/2006 | Uhlmann et al. |
| 7,154,657 B2 | 12/2006 | Poll et al. |
| 7,158,881 B2 | 1/2007 | McCarthy et al. |
| 7,160,017 B2 | 1/2007 | Lee et al. |
| 7,167,796 B2 | 1/2007 | Taylor et al. |
| 7,175,291 B1 | 2/2007 | Li |
| 7,184,190 B2 | 2/2007 | McCabe et al. |
| 7,188,963 B2 | 3/2007 | Schofield et al. |
| 7,193,764 B2 | 3/2007 | Lin et al. |
| 7,195,381 B2 | 3/2007 | Lynam et al. |
| 7,199,767 B2 | 4/2007 | Spero |
| 7,209,277 B2 | 4/2007 | Tonar et al. |
| 7,215,473 B2 | 5/2007 | Fleming |
| 7,245,336 B2 | 7/2007 | Hiyama et al. |
| 7,251,079 B2 | 7/2007 | Capaldo et al. |
| 7,255,451 B2 | 8/2007 | McCabe et al. |
| 7,255,465 B2 | 8/2007 | DeLine et al. |
| 7,262,406 B2 | 8/2007 | Heslin et al. |
| 7,262,916 B2 | 8/2007 | Kao et al. |
| 7,265,342 B2 | 9/2007 | Heslin et al. |
| 7,268,841 B2 | 9/2007 | Kasajima et al. |
| 7,269,327 B2 | 9/2007 | Tang |
| 7,269,328 B2 | 9/2007 | Tang |
| 7,274,501 B2 | 9/2007 | McCabe et al. |
| 7,286,280 B2 | 10/2007 | Whitehead et al. |
| 7,290,919 B2 | 11/2007 | Pan et al. |
| 7,292,208 B1 | 11/2007 | Park et al. |
| 7,308,341 B2 | 12/2007 | Schofield et al. |
| 7,310,177 B2 | 12/2007 | McCabe et al. |
| 7,311,428 B2 | 12/2007 | DeLine et al. |
| 7,323,819 B2 | 1/2008 | Hong et al. |
| 7,324,261 B2 | 1/2008 | Tonar et al. |
| 7,328,103 B2 | 2/2008 | McCarthy et al. |
| 7,329,013 B2 | 2/2008 | Blank et al. |
| 7,338,177 B2 | 3/2008 | Lynam |
| 7,344,284 B2 | 3/2008 | Lynam et al. |
| 7,349,143 B2 | 3/2008 | Tonar et al. |
| 7,362,505 B2 | 4/2008 | Hikmet et al. |
| 7,370,983 B2 | 5/2008 | DeWind et al. |
| 7,372,611 B2 | 5/2008 | Tonar et al. |
| 7,379,224 B2 | 5/2008 | Tonar et al. |
| 7,379,225 B2 | 5/2008 | Tonar et al. |
| 7,379,243 B2 | 5/2008 | Horsten et al. |
| 7,411,732 B2 | 8/2008 | Kao et al. |
| 7,412,328 B2 | 8/2008 | Uhlmann et al. |
| 7,417,781 B2 | 8/2008 | Tonar et al. |
| 7,420,159 B2 | 9/2008 | Heslin et al. |
| 7,446,462 B2 | 11/2008 | Lim et al. |
| 7,446,650 B2 | 11/2008 | Scholfield et al. |
| 7,448,776 B2 | 11/2008 | Tang |
| 7,452,090 B2 | 11/2008 | Weller et al. |
| 7,467,883 B2 | 12/2008 | DeLine et al. |
| 7,468,651 B2 | 12/2008 | DeLine et al. |
| 7,471,438 B2 | 12/2008 | McCabe et al. |
| 7,477,439 B2 | 1/2009 | Tonar et al. |
| 7,480,149 B2 | 1/2009 | DeWard et al. |
| 7,488,080 B2 | 2/2009 | Skiver et al. |
| 7,490,007 B2 | 2/2009 | Taylor et al. |
| 7,490,943 B2 | 2/2009 | Kikuchi et al. |
| 7,490,944 B2 | 2/2009 | Blank et al. |
| 7,494,231 B2 | 2/2009 | Varaprasad et al. |
| 7,502,156 B2 | 3/2009 | Tonar et al. |
| 7,510,287 B2 | 3/2009 | Hook |
| 7,511,872 B2 | 3/2009 | Tonar et al. |
| 7,526,103 B2 | 4/2009 | Schofield et al. |
| 7,538,316 B2 | 5/2009 | Heslin et al. |
| 7,540,620 B2 | 6/2009 | Weller et al. |
| 7,547,467 B2 | 6/2009 | Olson et al. |
| 7,551,354 B2 | 6/2009 | Horsten et al. |
| 7,571,042 B2 | 8/2009 | Taylor et al. |
| 7,572,490 B2 | 8/2009 | Park et al. |
| 7,580,795 B2 | 8/2009 | McCarthy et al. |
| 7,581,867 B2 | 9/2009 | Lee et al. |
| 7,586,566 B2 | 9/2009 | Nelson et al. |
| 7,586,666 B2 | 9/2009 | McCabe et al. |
| 7,619,508 B2 | 11/2009 | Lynam et al. |
| 7,626,749 B2 | 12/2009 | Baur et al. |
| 7,633,567 B2 | 12/2009 | Yamada et al. |
| 7,658,521 B2 | 2/2010 | DeLine et al. |
| 7,667,579 B2 | 2/2010 | DeLine et al. |
| 7,695,174 B2 | 4/2010 | Takayanagi et al. |
| 7,711,479 B2 | 5/2010 | Taylor et al. |
| 9,487,144 B2 | 11/2016 | Blank et al. |
| 9,609,757 B2 | 3/2017 | Steigerwald |
| 10,128,595 B2 | 11/2018 | Conger et al. |
| 10,264,219 B2 | 4/2019 | Mleczko et al. |
| 10,298,823 B2 | 5/2019 | Sauer et al. |
| 10,313,572 B2 | 6/2019 | Wohlte |
| 10,567,705 B2 | 2/2020 | Ziegenspeck et al. |
| 10,583,782 B2 | 3/2020 | Blank et al. |
| 11,021,107 B2 | 6/2021 | Blank et al. |
| 2001/0019356 A1 | 9/2001 | Takeda et al. |
| 2001/0022616 A1 | 9/2001 | Rademacher et al. |
| 2001/0026215 A1 | 10/2001 | Nakaho et al. |
| 2001/0026316 A1 | 10/2001 | Senatore |
| 2001/0030857 A1 | 10/2001 | Futhey et al. |
| 2001/0045981 A1 | 11/2001 | Gloger et al. |

(56) References Cited

U.S. PATENT DOCUMENTS

| | | |
|---|---|---|
| 2002/0003571 A1 | 1/2002 | Schofield et al. |
| 2002/0044065 A1 | 4/2002 | Quist et al. |
| 2002/0049535 A1 | 4/2002 | Rigo et al. |
| 2002/0072026 A1 | 6/2002 | Lynam et al. |
| 2002/0085155 A1 | 7/2002 | Arikawa |
| 2002/0093826 A1 | 7/2002 | Bos et al. |
| 2002/0113203 A1 | 8/2002 | Heslin et al. |
| 2002/0126497 A1 | 9/2002 | Pastrick |
| 2002/0154007 A1 | 10/2002 | Yang |
| 2002/0159270 A1 * | 10/2002 | Lynam ............... B60Q 1/2665 362/492 |
| 2002/0172053 A1 | 11/2002 | Pastrick et al. |
| 2002/0191409 A1 | 12/2002 | Deline et al. |
| 2002/0196639 A1 | 12/2002 | Weidel |
| 2003/0002165 A1 | 1/2003 | Mathias et al. |
| 2003/0002179 A1 | 1/2003 | Roberts et al. |
| 2003/0007261 A1 | 1/2003 | Hutzel et al. |
| 2003/0016125 A1 | 1/2003 | Lang et al. |
| 2003/0016287 A1 | 1/2003 | Nakayama et al. |
| 2003/0016542 A1 | 1/2003 | Pastrick et al. |
| 2003/0020603 A1 | 1/2003 | DeLine et al. |
| 2003/0025596 A1 | 2/2003 | Lang et al. |
| 2003/0025597 A1 | 2/2003 | Schofield |
| 2003/0030546 A1 | 2/2003 | Tseng |
| 2003/0030551 A1 | 2/2003 | Ho |
| 2003/0030724 A1 | 2/2003 | Okamoto |
| 2003/0035050 A1 | 2/2003 | Mizusawa et al. |
| 2003/0043269 A1 | 3/2003 | Park |
| 2003/0048639 A1 | 3/2003 | Boyd et al. |
| 2003/0052969 A1 | 3/2003 | Satoh et al. |
| 2003/0058338 A1 | 3/2003 | Kawauchi et al. |
| 2003/0067383 A1 | 4/2003 | Yang |
| 2003/0069690 A1 | 4/2003 | Correia et al. |
| 2003/0076415 A1 | 4/2003 | Strumolo |
| 2003/0080877 A1 | 5/2003 | Takagi et al. |
| 2003/0085806 A1 | 5/2003 | Samman et al. |
| 2003/0088361 A1 | 5/2003 | Sekiguchi |
| 2003/0090568 A1 | 5/2003 | Pico |
| 2003/0090569 A1 | 5/2003 | Poechmueller |
| 2003/0090570 A1 | 5/2003 | Takagi et al. |
| 2003/0095331 A1 | 5/2003 | Bengoechea et al. |
| 2003/0098908 A1 | 5/2003 | Misaiji et al. |
| 2003/0103141 A1 | 6/2003 | Bechtel et al. |
| 2003/0103142 A1 | 6/2003 | Hitomi et al. |
| 2003/0117522 A1 | 6/2003 | Okada |
| 2003/0117728 A1 | 6/2003 | Hutzel et al. |
| 2003/0122929 A1 | 7/2003 | Minaudo et al. |
| 2003/0122930 A1 | 7/2003 | Schofield et al. |
| 2003/0133014 A1 | 7/2003 | Mendoza |
| 2003/0137586 A1 | 7/2003 | Lewellen |
| 2003/0141965 A1 | 7/2003 | Gunderson et al. |
| 2003/0146831 A1 | 8/2003 | Berberich et al. |
| 2003/0147244 A1 | 8/2003 | Tenmyo |
| 2003/0169158 A1 | 9/2003 | Paul |
| 2003/0169522 A1 | 9/2003 | Schofield et al. |
| 2003/0179293 A1 | 9/2003 | Oizumi |
| 2003/0189754 A1 | 10/2003 | Sugino et al. |
| 2003/0202096 A1 | 10/2003 | Kim |
| 2003/0210369 A1 | 11/2003 | Wu |
| 2003/0214576 A1 | 11/2003 | Koga |
| 2003/0214584 A1 | 11/2003 | Ross |
| 2003/0214733 A1 | 11/2003 | Fujikawa et al. |
| 2003/0222793 A1 | 12/2003 | Tanaka et al. |
| 2003/0222983 A1 | 12/2003 | Nobori et al. |
| 2003/0227546 A1 | 12/2003 | Hilborn et al. |
| 2004/0004541 A1 | 1/2004 | Hong |
| 2004/0027695 A1 | 2/2004 | Lin |
| 2004/0032321 A1 | 2/2004 | McMahon et al. |
| 2004/0032675 A1 | 2/2004 | Weller et al. |
| 2004/0032676 A1 * | 2/2004 | Drummond ............ G02B 27/01 359/877 |
| 2004/0036768 A1 | 2/2004 | Green |
| 2004/0046870 A1 | 3/2004 | Leigh |
| 2004/0051634 A1 | 3/2004 | Schofield et al. |
| 2004/0056955 A1 | 3/2004 | Berberich et al. |
| 2004/0057131 A1 | 3/2004 | Hutzel et al. |
| 2004/0064241 A1 | 4/2004 | Sekiguchi |
| 2004/0066285 A1 | 4/2004 | Sekiguchi |
| 2004/0075603 A1 | 4/2004 | Kodama |
| 2004/0077359 A1 | 4/2004 | Bernas et al. |
| 2004/0080404 A1 | 4/2004 | White |
| 2004/0080431 A1 | 4/2004 | White |
| 2004/0085196 A1 | 5/2004 | Miller et al. |
| 2004/0085499 A1 | 5/2004 | Baek |
| 2004/0090314 A1 | 5/2004 | Iwamoto |
| 2004/0090317 A1 | 5/2004 | Rothkop |
| 2004/0096082 A1 | 5/2004 | Nakai et al. |
| 2004/0098196 A1 | 5/2004 | Sekiguchi |
| 2004/0105614 A1 | 6/2004 | Kobayashi et al. |
| 2004/0107030 A1 | 6/2004 | Nishira et al. |
| 2004/0107617 A1 | 6/2004 | Shoen et al. |
| 2004/0109060 A1 | 6/2004 | Ishii |
| 2004/0114039 A1 | 6/2004 | Ishikura |
| 2004/0128065 A1 | 7/2004 | Taylor et al. |
| 2004/0145457 A1 | 7/2004 | Schofield et al. |
| 2004/0170008 A1 | 9/2004 | Tenmyo |
| 2004/0202001 A1 | 10/2004 | Roberts et al. |
| 2004/0243303 A1 | 12/2004 | Padmanabhan |
| 2004/0251804 A1 | 12/2004 | McCullough et al. |
| 2005/0024591 A1 | 2/2005 | Lian et al. |
| 2005/0024729 A1 | 2/2005 | Ockerse et al. |
| 2005/0078347 A1 | 4/2005 | Lin et al. |
| 2005/0078389 A1 | 4/2005 | Kulas et al. |
| 2005/0079326 A1 | 4/2005 | Varaprasad et al. |
| 2005/0083577 A1 | 4/2005 | Varaprasad et al. |
| 2005/0084658 A1 | 4/2005 | Adams et al. |
| 2005/0099559 A1 | 5/2005 | Lee et al. |
| 2005/0111070 A1 | 5/2005 | Lin et al. |
| 2005/0140855 A1 | 6/2005 | Utsumi et al. |
| 2005/0168995 A1 | 8/2005 | Kittelmann et al. |
| 2005/0169003 A1 | 8/2005 | Lindahl et al. |
| 2005/0172504 A1 | 8/2005 | Ohm et al. |
| 2005/0185278 A1 | 8/2005 | Horsten et al. |
| 2005/0237440 A1 | 10/2005 | Sugimura et al. |
| 2005/0270766 A1 | 12/2005 | Kung et al. |
| 2005/0270798 A1 | 12/2005 | Lee et al. |
| 2006/0007550 A1 | 1/2006 | Tonar et al. |
| 2006/0028730 A1 | 2/2006 | Varaprasad et al. |
| 2006/0038668 A1 | 2/2006 | DeWard et al. |
| 2006/0050018 A1 | 3/2006 | Hutzel et al. |
| 2006/0061008 A1 | 3/2006 | Karner et al. |
| 2006/0139953 A1 | 6/2006 | Chou et al. |
| 2006/0164230 A1 | 7/2006 | DeWind et al. |
| 2006/0164725 A1 | 7/2006 | Horsten et al. |
| 2006/0202111 A1 | 9/2006 | Heslin et al. |
| 2006/0255960 A1 | 11/2006 | Uken et al. |
| 2006/0274218 A1 | 12/2006 | Xue |
| 2007/0041096 A1 | 2/2007 | Nieuwkerk et al. |
| 2007/0058257 A1 | 3/2007 | Lynam |
| 2007/0080585 A1 | 4/2007 | Lyu |
| 2007/0118287 A1 | 5/2007 | Taylor et al. |
| 2007/0120043 A1 | 5/2007 | Heslin et al. |
| 2007/0132567 A1 | 6/2007 | Schofield et al. |
| 2007/0162229 A1 | 7/2007 | McCarthy et al. |
| 2007/0171037 A1 | 7/2007 | Schofield et al. |
| 2007/0183066 A1 | 8/2007 | Varaprasad et al. |
| 2007/0184284 A1 | 8/2007 | Varaprasad et al. |
| 2008/0002106 A1 | 1/2008 | Van De Witte et al. |
| 2008/0013153 A1 | 1/2008 | McCabe et al. |
| 2008/0068520 A1 | 3/2008 | Minikey et al. |
| 2008/0094684 A1 | 4/2008 | Varaprasad et al. |
| 2008/0094685 A1 | 4/2008 | Varaprasad et al. |
| 2008/0180529 A1 | 7/2008 | Taylor et al. |
| 2008/0180779 A1 * | 7/2008 | McCabe ............... F21S 43/14 359/267 |
| 2008/0180781 A1 | 7/2008 | Varaprasad et al. |
| 2008/0183355 A1 | 7/2008 | Taylor et al. |
| 2008/0201075 A1 | 8/2008 | Taylor et al. |
| 2008/0212189 A1 * | 9/2008 | Baur ............... B32B 17/10798 362/540 |
| 2008/0212215 A1 | 9/2008 | Schofield et al. |
| 2008/0225538 A1 | 9/2008 | Lynam et al. |
| 2008/0266389 A1 | 10/2008 | DeWind et al. |
| 2008/0291522 A1 | 11/2008 | Varaprasad et al. |

(56) References Cited

U.S. PATENT DOCUMENTS

| | | |
|---|---|---|
| 2008/0308219 A1 | 12/2008 | Lynam |
| 2009/0015736 A1* | 1/2009 | Weller ................. B60R 1/12 362/494 |
| 2009/0033837 A1 | 2/2009 | Molsen et al. |
| 2009/0040465 A1 | 2/2009 | Conner et al. |
| 2009/0040588 A1 | 2/2009 | Tonar et al. |
| 2009/0040778 A1 | 2/2009 | Takayanagi et al. |
| 2009/0052003 A1 | 2/2009 | Schofield et al. |
| 2009/0080055 A1 | 3/2009 | Baur et al. |
| 2009/0096937 A1 | 4/2009 | Bauer et al. |
| 2009/0141331 A1 | 6/2009 | Skiver et al. |
| 2009/0174776 A1 | 7/2009 | Taylor et al. |
| 2009/0201137 A1 | 8/2009 | Weller et al. |
| 2009/0219394 A1 | 9/2009 | Heslin et al. |
| 2009/0231741 A1 | 9/2009 | Weller et al. |
| 2009/0243824 A1* | 10/2009 | Peterson ............. G06F 3/04886 348/148 |
| 2009/0262422 A1 | 10/2009 | Cross et al. |
| 2010/0085645 A1 | 4/2010 | Skiver et al. |
| 2010/0091509 A1 | 4/2010 | DeLine et al. |
| 2010/0201816 A1 | 8/2010 | Lee et al. |
| 2014/0218529 A1 | 8/2014 | Mahmoud et al. |
| 2014/0218535 A1 | 8/2014 | Ihlenburg et al. |

\* cited by examiner

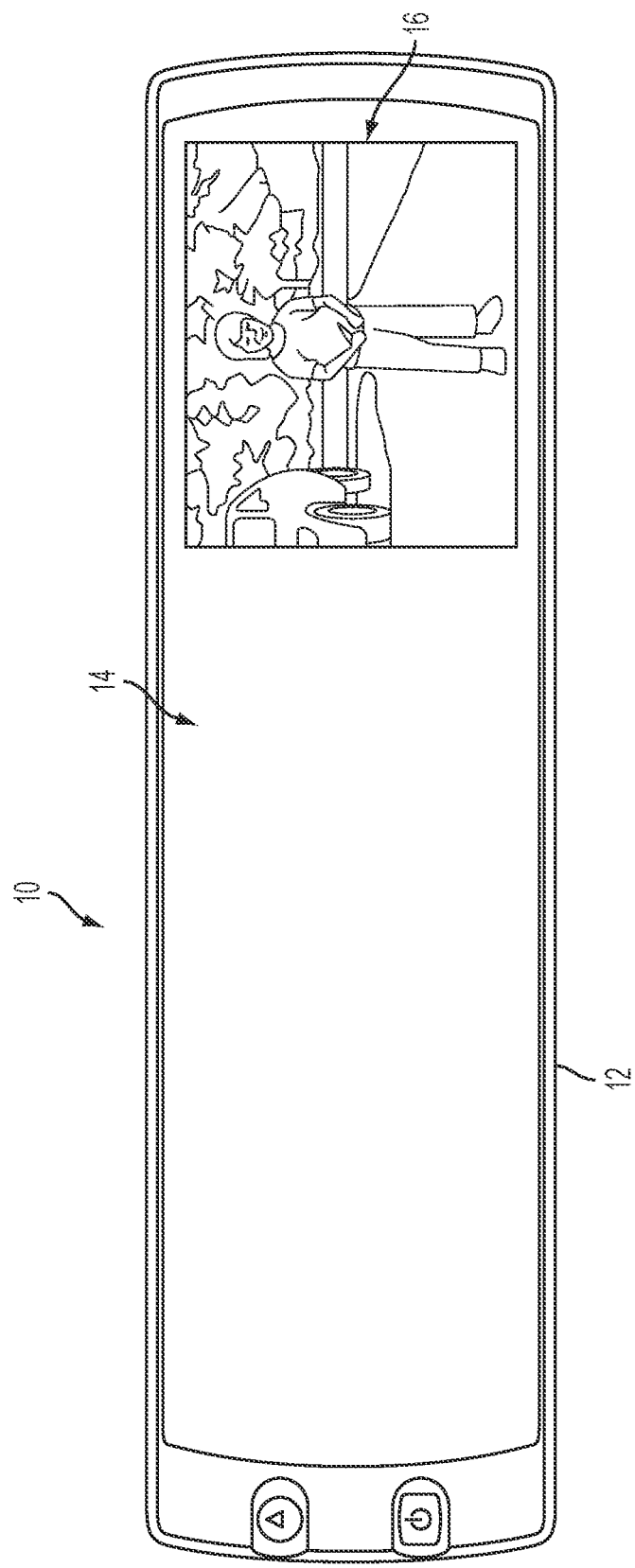

DISPLAY ON

DISPLAY OFF

VEHICULAR VIDEO CAMERA DISPLAY SYSTEM

CROSS REFERENCE TO RELATED APPLICATIONS

The present application is a continuation of U.S. patent application Ser. No. 16/812,864, filed Mar. 9, 2020, now U.S. Pat. No. 11,021,107, which is a continuation of U.S. patent application Ser. No. 15/344,865, filed Nov. 7, 2016, now U.S. Pat. No. 10,583,782, which is a continuation of U.S. patent application Ser. No. 12/578,732, filed Oct. 14, 2009, now U.S. Pat. No. 9,487,144, which claims benefit of U.S. provisional applications, Ser. No. 61/219,214, filed Jun. 22, 2009, Ser. No. 61/187,069, filed Jun. 15, 2009, Ser. No. 61/117,301, filed Nov. 24, 2008, and Ser. No. 61/105,903, filed Oct. 16, 2008, which are hereby incorporated herein by reference in their entireties.

FIELD OF THE INVENTION

The present invention relates generally to the field of interior rearview mirror systems for vehicles and, more particularly, to interior rearview mirror systems which incorporate a display.

BACKGROUND OF THE INVENTION

It is known to provide a video display screen at an interior rearview mirror assembly of a vehicle, such as, for example, a video display screen of the type disclosed in U.S. Pat. No. 6,428,172 for REARVIEW MIRROR ASSEMBLY WITH UTILITY FUNCTIONS, and U.S. Pat. No. 6,175,300 for BLIND SPOT VIEWING SYSTEM, which are hereby incorporated herein by reference in their entireties. It has also been suggested to provide a mirror or a display which may be indexed in and out of a mirror case, such as from the bottom of the mirror case, such as also disclosed in U.S. Pat. No. 6,428,172, which is hereby incorporated herein by reference in its entirety.

SUMMARY OF THE INVENTION

The present invention provides an interior rearview mirror assembly having a video display screen which may display video images captured by a camera or image sensor of the vehicle.

According to an aspect of the present invention, an interior rearview mirror assembly for a vehicle comprises a casing, a variable reflectivity reflective element, such as positioned at a bezel portion of the casing, and a video display screen disposed in the casing and behind the reflective element. The video display screen is operable to display images that are viewable through the reflective element by a person viewing the rearview mirror assembly when it is normally mounted in a vehicle. The video display screen may function to brighten or enhance the intensity of the displayed images in response to a dimming condition of the variable reflectivity reflective element.

According to another aspect of the present invention, an interior rearview mirror assembly for a vehicle comprises a casing, a reflective element, such as a prismatic reflective element, such as positioned at a bezel portion of the casing, and a video display screen disposed in the casing and behind the reflective element. The video display screen is operable to display images that are viewable through the reflective element by a person viewing the rearview mirror assembly when it is normally mounted in a vehicle. The mirror assembly includes a decoder that decodes the NTSC signal from a camera or image sensor of the vehicle. The decoder has a microprocessor that is operable to control the video display screen, such that the images are processed and displayed with a common microprocessor, thereby obviating the need for a separate microprocessor for the video display screen.

According to an aspect of the present invention, a mirror and compass system includes an interior rearview mirror assembly having a reflective element and a casing that are adjustable relative to a mounting structure. The mounting structure includes a mounting base. A compass chip having at least two magnetoresponsive sensing elements and compass circuitry established thereon is positioned at the mounting base. The compass chip has at least one connecting element for connecting to a vehicle wire harness that extends downward from the vehicle headliner (such as along the vehicle windshield and within a wire channel or wire guide element or the like) and that provides power to the compass chip.

These and other objects, advantages, purposes and features of the present invention will become apparent upon review of the following specification in conjunction with the drawings.

BRIEF DESCRIPTION OF THE DRAWINGS

FIG. 1 is a front elevation of an electro-optic interior rearview mirror assembly in accordance with the present invention, with the video display screen activated so that images are viewable through the reflective element;

DESCRIPTION OF THE PREFERRED EMBODIMENTS

Figure 9:
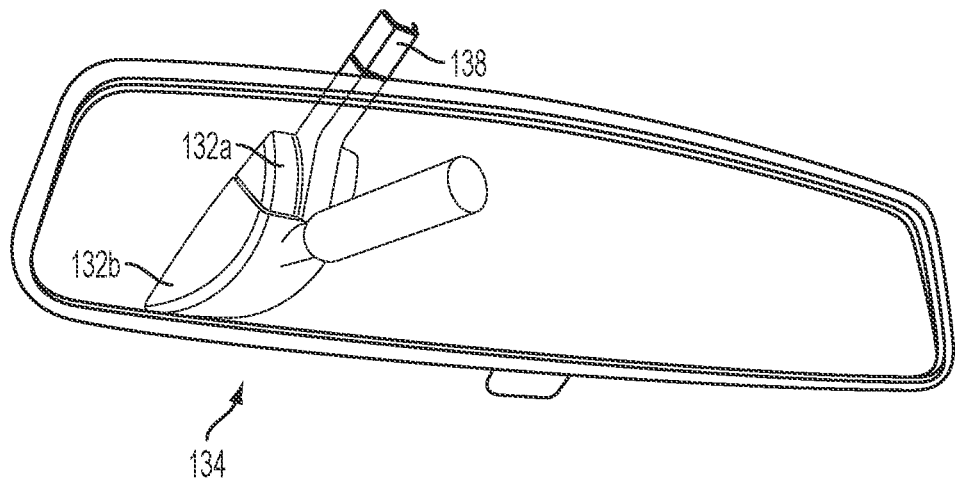
FIG. 9 is a perspective view of another interior rearview mirror assembly and compass chip in accordance with the present invention, with a compass chip disposed at a wire management element attachable to a mounting base of the mirror assembly.

Referring now to the drawings and the illustrative embodiments depicted therein, an interior rearview mirror assembly 10 for a vehicle includes a casing, a bezel portion 12 and a reflective element 14 positioned at and at least partially within the casing and/or bezel portion (FIG. 1). Mirror assembly 10 includes a video display screen device 16, which is disposed within the mirror casing and behind the reflective element 14. The video display screen device is operable to display information or images for viewing by the driver or other occupant or occupants of the vehicle when the video display screen device is activated, and is substantially not viewable or discernible when not activated, as discussed below.

Video display screen device or module 16 may comprise any type of video screen and is operable to display images in response to an input or signal from a control or imaging system. For example, the video display screen may comprise a multi-pixel liquid crystal module (LCM) or liquid crystal display (LCD), preferably a thin film transistor (TFT) multi-pixel liquid crystal display (such as discussed below), or the screen may comprise a multi-pixel organic electroluminescent display or a multi-pixel light emitting diode (LED), such as an organic light emitting diode (OLED) or inorganic light emitting diode display or the like, or a passive reflective and/or backlit pixelated display, or an electroluminescent (EL) display, or a vacuum fluorescent (VF) display or the like. For example, the video display screen may comprise a video screen of the types disclosed in U.S. Pat. Nos. 7,370,983; 7,338,177; 7,274,501; 7,255,451; 7,195,381; 7,184,190; 6,902,284; 6,690,268; 6,428,172; 6,420,975; 5,668,663 and/or 5,724,187, and/or U.S. patent application Ser. No. 10/538,724, filed Jun. 13, 2005 and published Mar. 9, 2006 as U.S. Publication No. 2006/0050018; Ser. No. 11/226,628, filed Sep. 14, 2005 and published Mar. 23, 2006 as U.S. Publication No. 2006/0061008; Ser. No. 12/091,525, filed Apr. 25, 2008, now U.S. Pat. No. 7,855,755; Ser. No. 09/585,379, filed Jun. 1, 2000; Ser. No. 10/207,291, filed Jul. 29, 2002, and/or U.S. provisional applications, Ser. No. 61/238,862, filed Sep. 1, 2009; Ser. No. 61/180,257, filed May 21, 2009; Ser. No. 61/174,596, filed May 1, 2009; and/or Ser. No. 61/156,184, filed Feb. 27, 2009, which are hereby incorporated herein by reference in their entireties.

Video display screen device 16 may be in communication with or may receive an input or video signal (such as a NTSC video signal or the like) from a corresponding imaging sensor or camera or imaging system and may display the image or images provided by the input or signal on the video display screen. Alternately, a video signal may be conveyed to the mirror assembly or system as a digital signal. The video display screen device or an imaging or vision system of the vehicle may include a control, which may be in communication with the video display screen via a wireless communication link or via an electrical connector or wiring or cable or the like.

The control is operable to control the video display screen in response to an input or signal, such as a signal received from one or more cameras or image sensors of the vehicle, such as a video camera or sensor, such as a CMOS imaging array sensor, a CCD sensor or the like, such as the types disclosed in U.S. Pat. Nos. 5,550,677; 5,760,962; 6,396,397; 6,097,023; 5,877,897 and 5,796,094, and/or U.S. patent application Ser. No. 10/534,632, filed May 11, 2005, and/or U.S. provisional application Ser. No. 61/785,565, filed May 15, 2009, which are hereby incorporated herein by reference in their entireties, or from one or more imaging systems of the vehicle, such as a reverse or backup aid system, such as a rearwardly directed vehicle vision system utilizing principles disclosed in U.S. Pat. Nos. 5,550,677; 5,760,962; 5,670,935; 6,201,642; 6,396,397; 6,498,620; 6,717,610 and/or 6,757,109, which are hereby incorporated herein by reference in their entireties, a trailer hitching aid or tow check system, such as the type disclosed in U.S. Pat. No. 7,005,974, which is hereby incorporated herein by reference in its entirety, a cabin viewing or monitoring device or system, such as a baby viewing or rear seat viewing camera or device or system or the like, such as disclosed in U.S. Pat. Nos. 5,877,897 and/or 6,690,268, which are hereby incorporated herein by reference in their entireties, a video communication device or system, such as disclosed in U.S. Pat. No. 6,690,268, which is hereby incorporated herein by reference in its entirety, and/or the like. The imaging sensor or camera may be activated and the display screen may be activated in response to the vehicle shifting into reverse, such that the display screen is viewable by the driver and is displaying an image of the rearward scene while the driver is reversing the vehicle.

Optionally, the video display screen may be operable responsive to other cameras and/or navigation systems and/or the like, and may be operable at any time during operation of the vehicle. Thus, the video display screen may be operable during daytime and nighttime driving conditions and may be operable when the variable reflectivity reflective element is dimmed or darkened. Thus, the intensity of the display may be adjusted to account for a reduced transmissivity of the reflective element.

Optionally, and desirably, the intensity or brightness or contrast of the video display screen may be automatically adjusted in response to an ambient light sensor or glare detector, such as a sensor of the display screen device, or of the interior rearview mirror assembly or vehicle or of a console or module or the like, such as the types disclosed in U.S. Pat. Nos. 4,793,690 and/or 5,193,029, which are hereby incorporated herein by reference in their entireties. In applications where the display screen device is implemented with an electro-optic or electrochromic mirror reflective element assembly (such as shown in FIG. 1), the display screen device may be automatically adjusted in response to the ambient light sensor or glare detector associated with the electro-optic or electrochromic circuitry or system. The display intensity of the display screen may be adjusted in response to the photo sensor or light sensor, and may be increased during daytime lighting conditions and reduced at dusk or during nighttime lighting conditions. The intensity and/or contrast and/or brightness of the display may be substantially continuously adjusted or may be adjusted intermittently or in steps in response to the light sensor or sensors, such as by utilizing aspects of the displays described in U.S. Pat. Nos. 7,370,983; 5,416,313 and 5,285,060, and/or U.S. patent application Ser. No. 12/091,525, filed Apr. 25, 2008, now U.S. Pat. No. 7,855,755, which are hereby incorporated herein by reference in their entireties.

Optionally, the video display screen may be operable to adjust the intensity of the displayed images in response to a degree of dimming of the electro-optic (such as electrochromic) reflective element of the mirror assembly. The video display screen thus may be adjusted responsive to an output signal of the glare light sensor or an output of the mirror reflective element dimming circuitry or the like. For example, as the reflective element is dimmed or darkened (such as in response to a detection of glare light at the mirror assembly) to reduce glare to the driver of the vehicle, the video display screen may be automatically brightened. Desirably, the video display screen is brightened relative to the degree of dimming so that the displayed images remain at a substantially constant intensity as viewed by the driver of the vehicle, so that the increasing/decreasing intensity of the video display is not readily discernible to the driver of the vehicle. Such an automatic intensity adjustment function is particularly suitable for a video display screen that may be operable in response to various camera inputs and/or navigation system inputs and/or the like, and not only responsive to a rear vision camera (where the dimming controls are typically deactivated when the vehicle is shifted into a reverse gear).

In such an application, the mirror dimming control may still be inhibited when the vehicle is shifted into a reverse gear, but will be active during other driving conditions, and the video display screen will also be active during reverse and forward driving conditions. Thus, when the video decoder (that may be part of the video display device or module) determines that there is a valid video signal, the video decoder may communicate to the mirror microprocessor to activate the back light of the display module, and the mirror circuitry and/or display circuitry may adjust the intensity of the video display screen in response to a detected ambient lighting condition and a detected glare lighting condition (and/or in response to a degree of dimming of the reflective element as set by the mirror circuitry). As the mirror reflective element is dimmed or darkened, the video display screen may re-brighten the video display intensity based on the EC coloring or dimming percentage in front of the video display screen. Likewise, as the mirror reflective element is bleached or undimmed, the video display screen may reduce its intensity accordingly.

Desirably, the display screen emits light that is bright enough to be readily viewable and discernible during high ambient lighting conditions, such as are typically encountered on a sunny day. Preferably, the display luminance (and especially for a TFT LCD display element showing video or full color video or still images) is greater than about 300 candelas per square meter ($cd/m^2$), more preferably greater than about 500 $cd/m^2$ and more preferably greater than about 700 $cd/m^2$. This is to help ensure that the driver can discern any video image being displayed against the sunlight streaming in through the rear window and incident at the display screen at the interior mirror assembly that will tend to wash-out the video image unless the video image is sufficiently bright. Optionally, the display screen may utilize aspects of the display element described in U.S. patent application Ser. No. 12/091,525, filed Apr. 25, 2008, now U.S. Pat. No. 7,855,755, which is hereby incorporated herein by reference in its entirety.

Conventionally, a video system may include a decoder for receiving and decoding video signals from the cameras or image sensors, and the video system further includes a connection or communication of the signals to a microprocessor of the video display device. The likes of conventional prismatic video mirrors typically utilize a two board approach with two separate processors: one processor on the video display screen device or module (typically, the video display device is provided as a liquid crystal video screen device or module or LCM with integrated backlighting and various brightness enhancing means) and another processor on the printed circuit board or circuit element or mirror board or mirror PCB. The processor on the mirror PCB may be operable to control various functions, such as the video display dimming, the power supply to the video display device module, the human-machine interface (HMI) switch for turning the video display on/off, and to provide protection and regulated power supply to the video display module and back light.

Optionally, the present invention may provide a decoder that includes a microprocessor built into the package and with "OSD" (On Screen Display) capability. Thus, the control circuitry on the mirror circuit element or PCB may be moved into the decoder and thus combine the display module circuit element or PCB decoder electronics with the mirror circuit element or PCB electronics. Such combined circuitry can eliminate the need for an additional processor on the mirror PCB and will combine all feature control into the decoder. This saves system cost, improves EMC, reduces the PCB size and gives enhanced or full control of the video mirror system to one processor.

Optionally, such a combined circuitry decoder may include additional enhancement to the existing decoder chip so that the decoder may also control the dimming of a variable reflectivity reflective element or electro-optic or electrochromic reflective element. This would eliminate the mirror EC PCB assembly and would combine all the mirror electronics on a single or common circuit element or PCB that would have the decoder control all the video and reflective element dimming features.

For example, a decoder, such as a Techwell 8817 decoder available from Techwell Inc. of San Jose, Calif., or other suitable decoder, may be disposed at a video display screen and may receive standard video signals, such as NTSC signals or PAL signals or the like, from one or more cameras of the vehicle. The decoder may decode the NTSC signals and may digitize the signals and send the digital signal to the display screen or LCD TFT screen. The decoder provides on screen display (OSD) capabilities and may provide other signals or messages with the video feed to the video screen.

Optionally, such a decoder (such as a Techwell 8817 Decoder or the like) may be implemented with a video screen for a prismatic video mirror application. For example, the decoder may have a microprocessor and/or other data processing resources, such as memory, converters (such as A/D converters and/or the like), and/or CAN/LIN controllers and/or the like, incorporated into the same integrated circuit chip or package and may include OSD capability too. Thus, as well as functioning as a decoder, the same chip or package can provide intelligence/data processing/control for another function/functions or accessory/accessories in the mirror assembly, such as automatic dimming control of an antiglare electrochromic rearview mirror and/or intensity control of display backlighting, such as responsive to a photosensor of the interior rearview mirror assembly. Current prismatic video mirrors may utilize a two board approach with two separate processors (one processor may be on the mirror PCB in order to control the video display dimming, power supply to the LCM or display screen, the HMI Switch for turning the video display ON/OFF and/or supply protection and regulated power supply to the LCM or video display screen and back light.

For example, such a decoder, such as the Techwell 8817 Decoder, may include a board or substrate with circuitry established thereon, including a video decoder (that receives the standard video signal or NTSC signal), a microcontroller, OSD circuitry, image enhancement circuitry (which may include a built-in 2D de-interlacing engine and a high quality scalar, and may provide programmable hue, brightness, saturation, contrast, sharpness control with vertical peaking, programmable color transient improvement control, panorama/water-glass scaling, programmable Gamma correction tables, black/white stretch, programmable favorite color enhancement, and an LED controller (for controlling the backlighting LEDs of the TFT backlit video display. The decoder may also include other circuitry as desired or appropriate depending on the particular application of the decoder and video display module. The decoder may support a two-wire serial bus interface for interfacing with a bus system or network of the vehicle.

The present invention thus moves control circuitry, such as, for example, a microprocessor and allied circuitry associated with EC dimming of the mirror element, that is currently on the mirror printed circuit board or PCB into the decoder and combines the video display module or LCM PCB decoder electronics with at least a portion of the mirror PCB electronics into a single unitary integrated circuit or chip or package. Such combination and incorporation of the electronics onto a single decoder board limits or substantially precludes the need for an additional processor on the mirror PCB and combines all feature control into the decoder. The present invention thus reduces system cost, improves EMC, reduces PCB size and may provide full control of the video mirror system to one processor.

Optionally, the decoder of the present invention may be used in an electrochromic (EC) video mirror assembly. For example, the above described decoder may be carried over and with additional enhancement to the existing decoder chip could be a viable solution to also control the EC feature utilizing the decoder too. Such a configuration may limit or substantially preclude or eliminate the mirror EC PCB assembly and may combine all electronics on a single circuit element or board or PCB, whereby the decoder may control all the video and EC features.

Thus, the decoder of the present invention may be readily attached to or connected to a video display module or screen, such as at the rear of the display module. The decoder may be electrically connected to the wire or wires from the camera/cameras and to any other wires of the mirror assembly, whereby the decoder is ready for operation. The decoder thus provides video decoding functions and on screen display functions in a single decoder board. The NTSC (or other standard video input or signal) thus is received by the decoder and is decoded by the decoder, whereby the OSD of the decoder may generate the display signal to the video screen and may send the video display images by themselves or may mix the video signal/images with other display information, such as graphic overlays or textual information or iconistic display information or the like.

Figure 14:
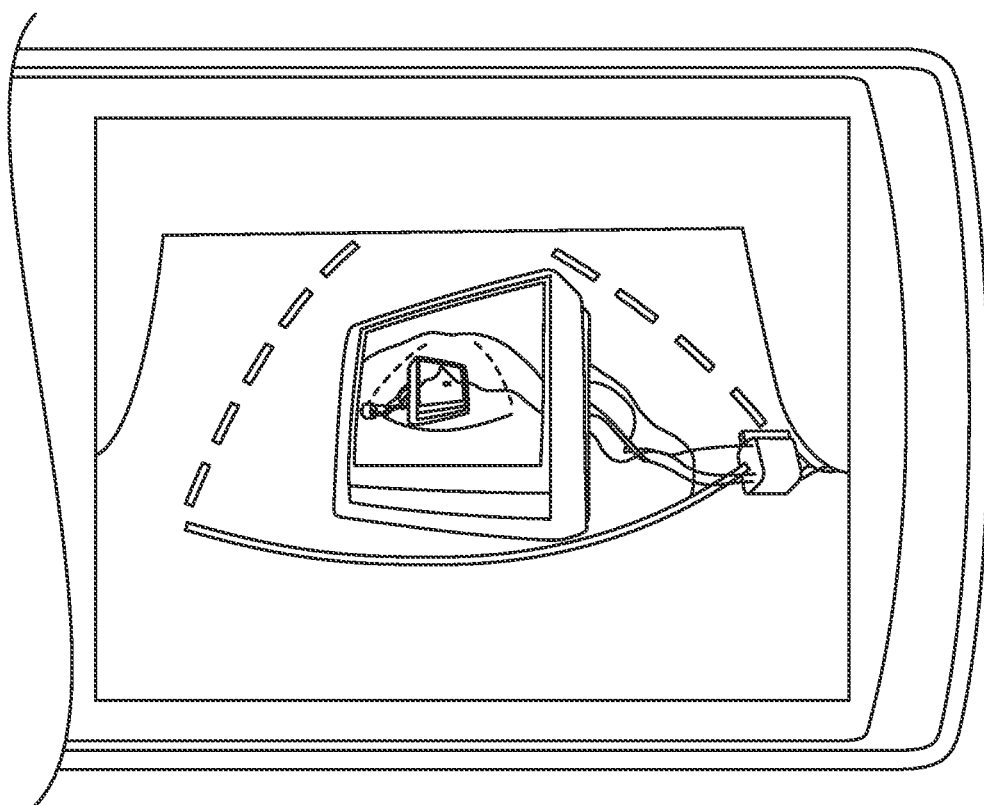
FIGS. 14-31 are views of a display module displaying various images and/or icons and/or text information responsive to a control in accordance with the present invention.
Figure 15:
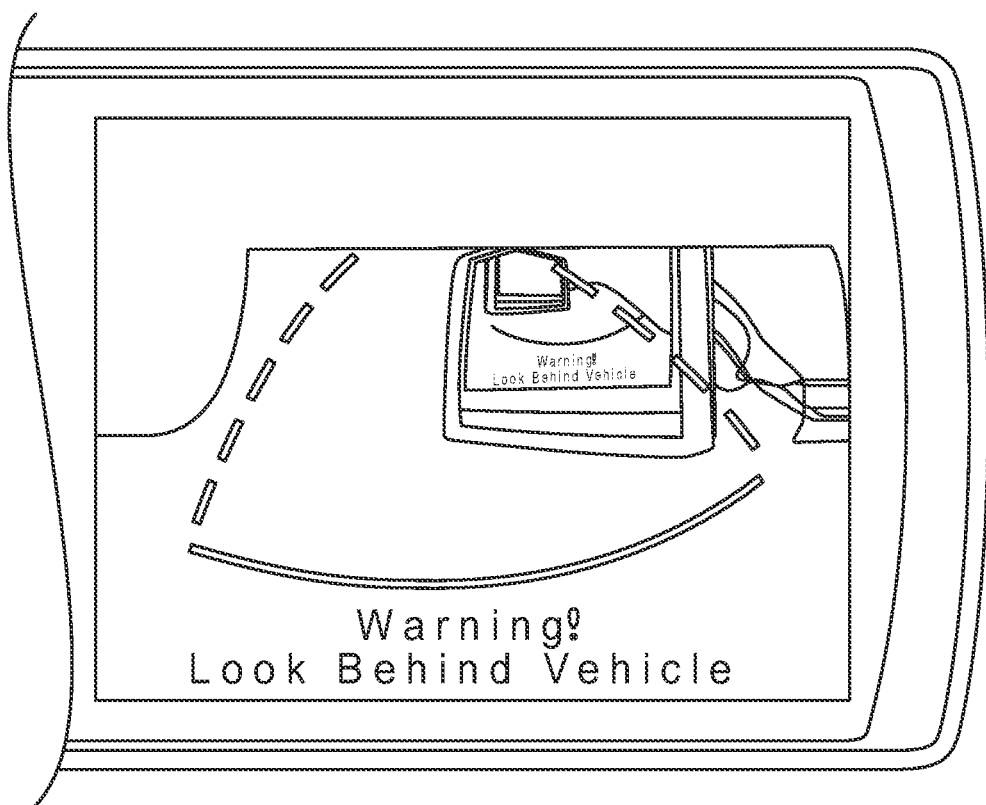
Figure 16:
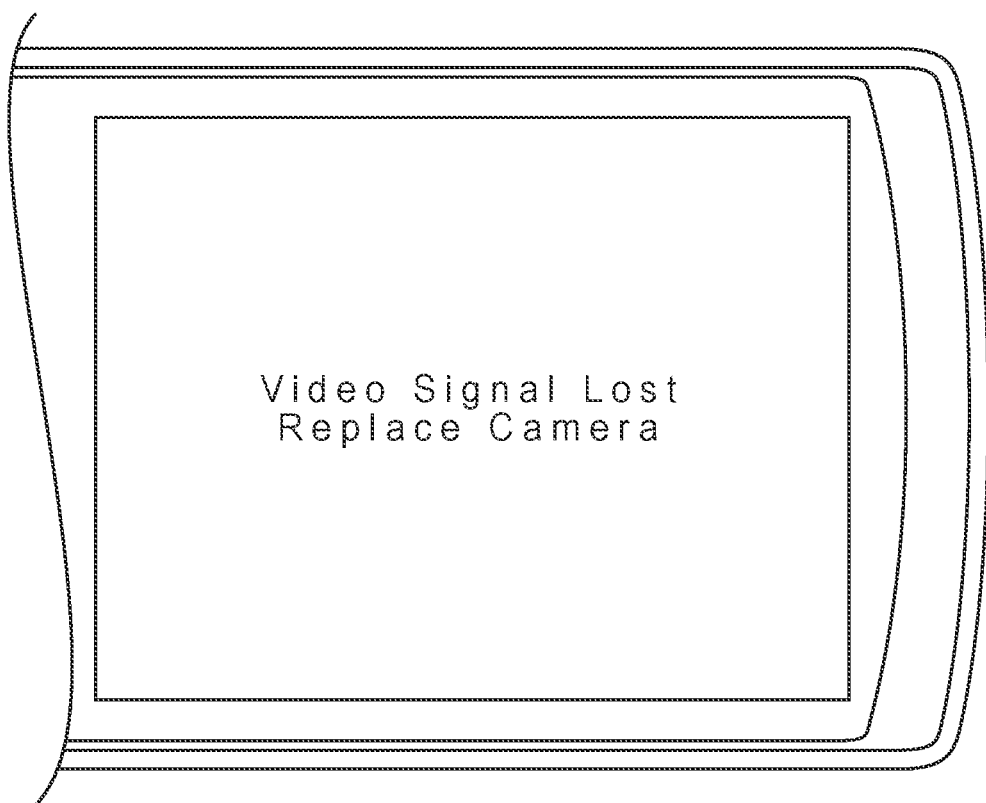
Figure 17:
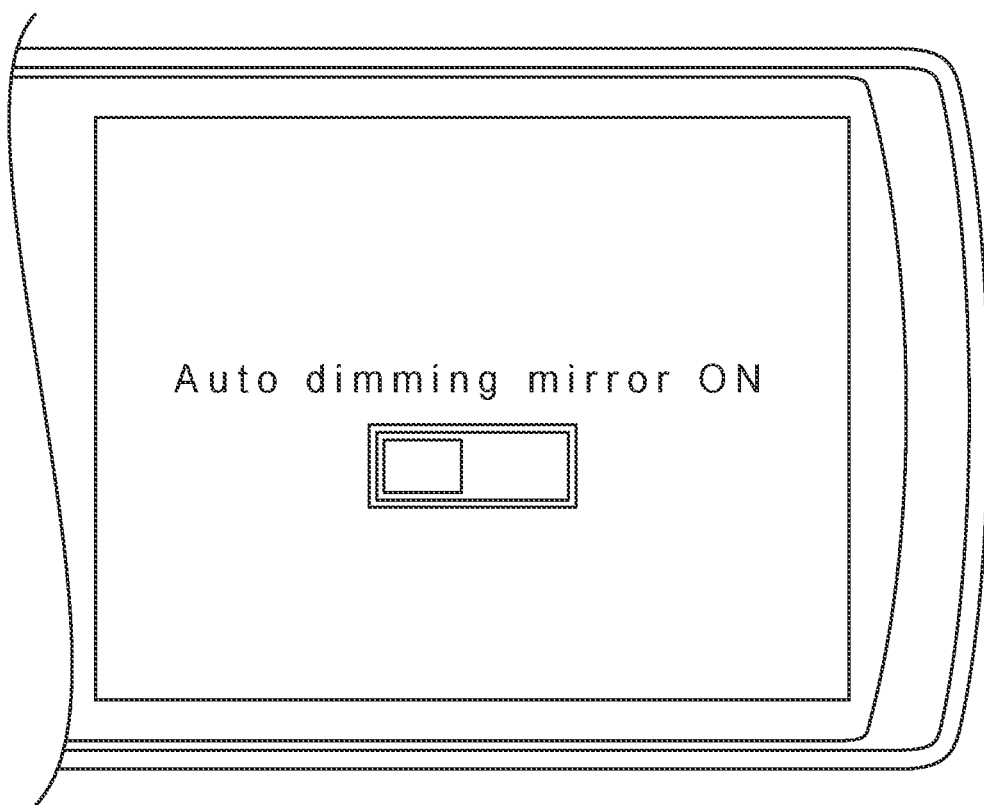
Figure 18:
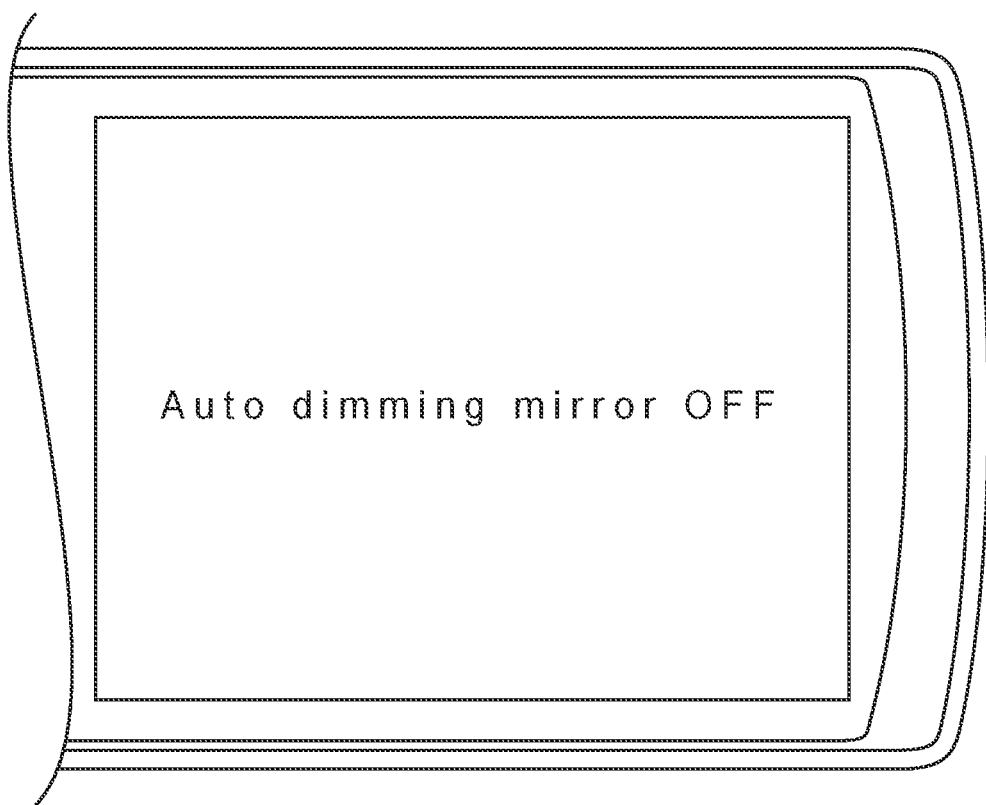
Figure 19:
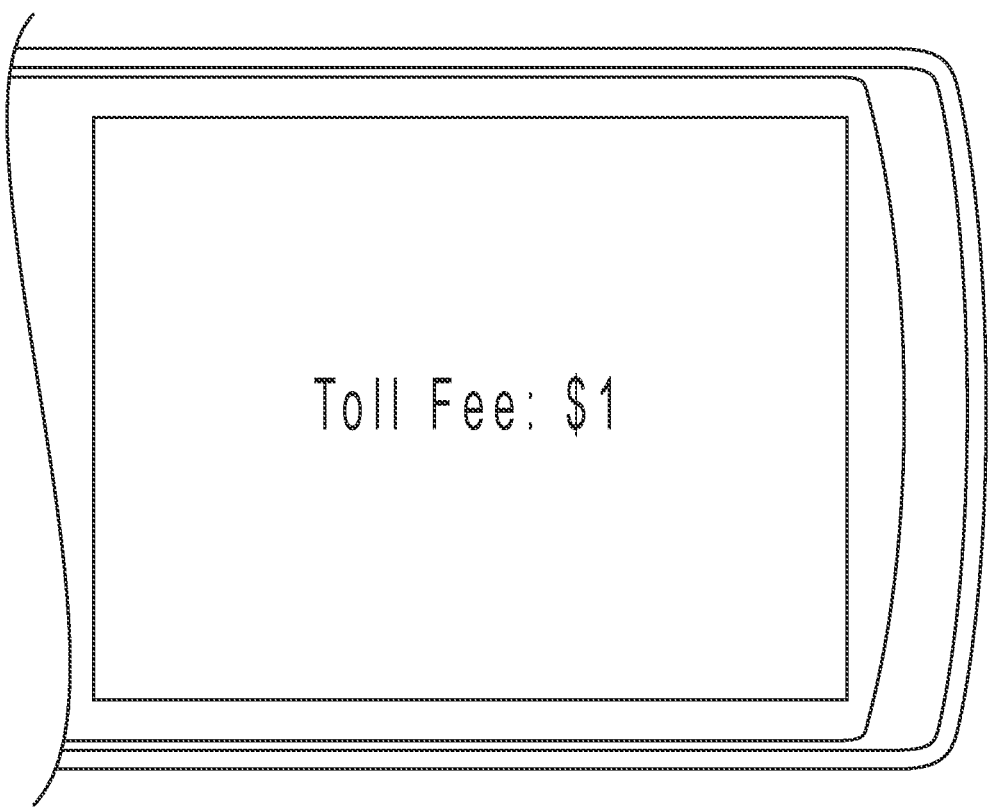
Figure 20:
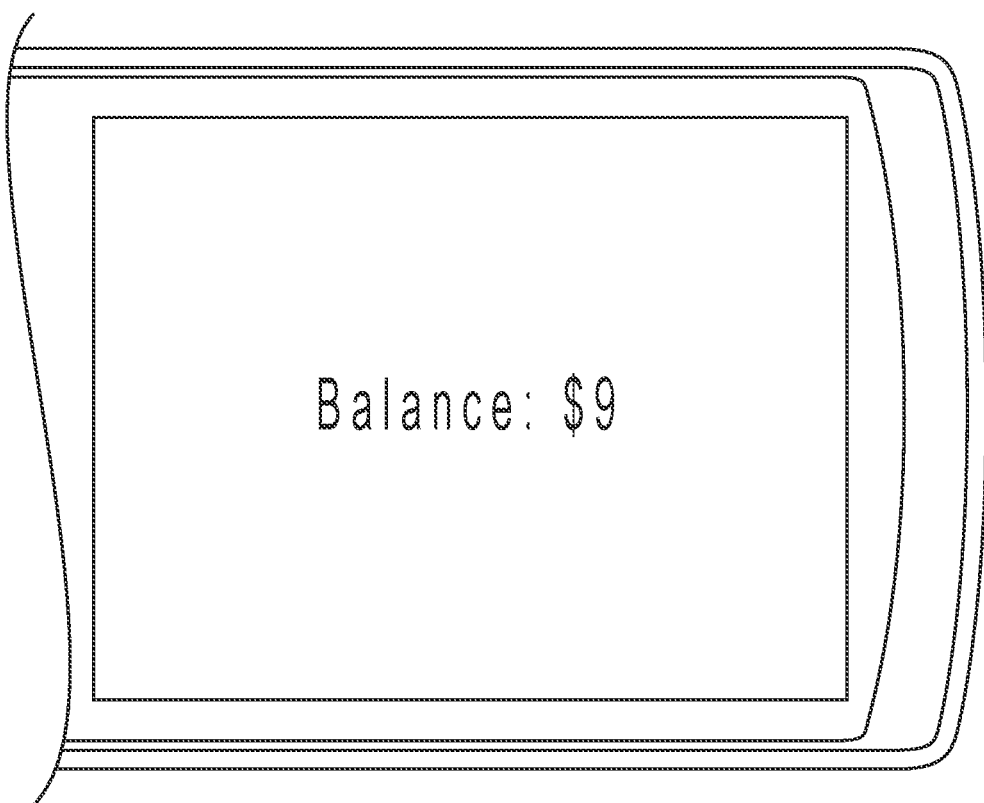
Figure 21:
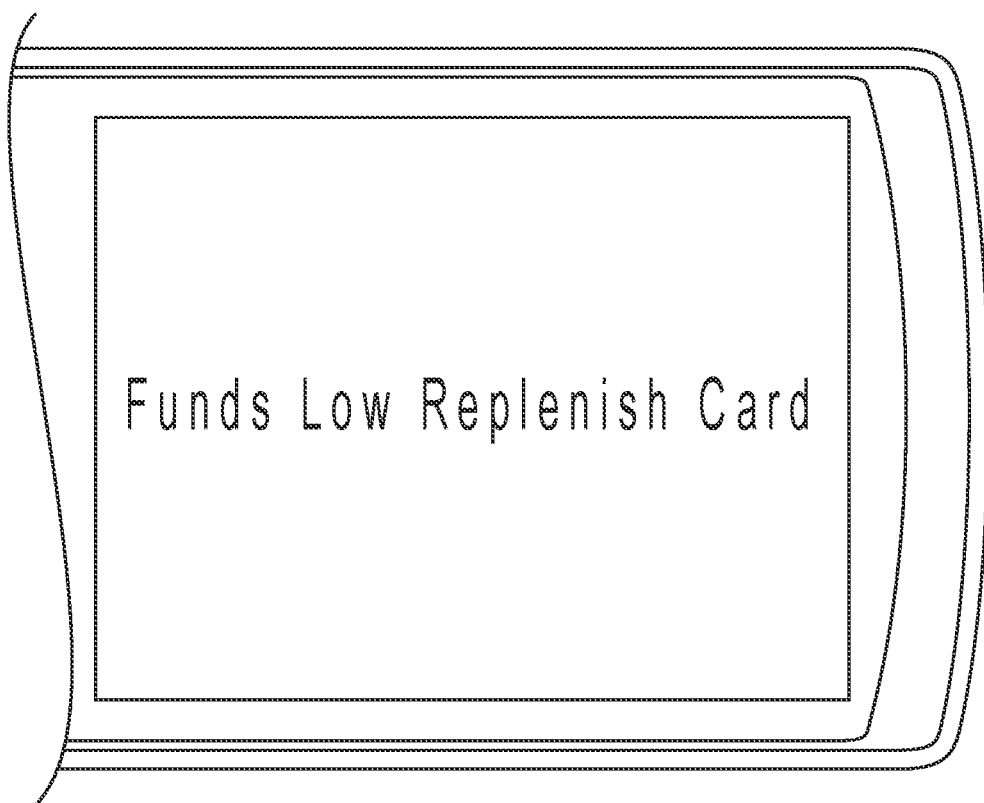
Figure 22:
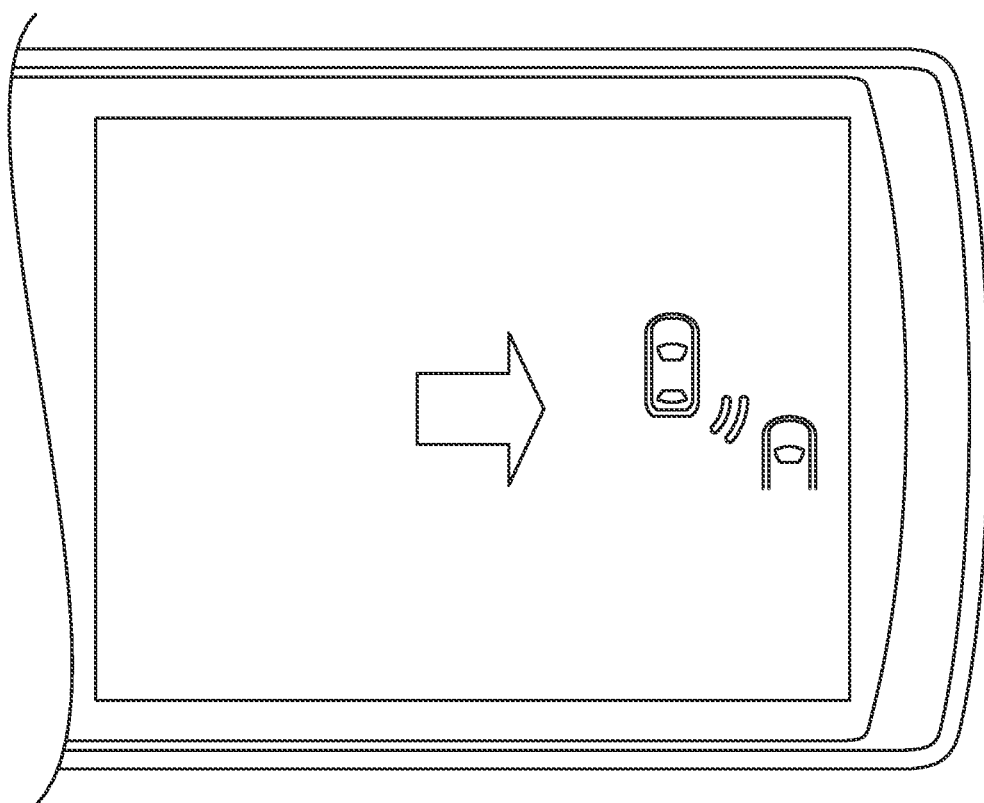
Figure 23:
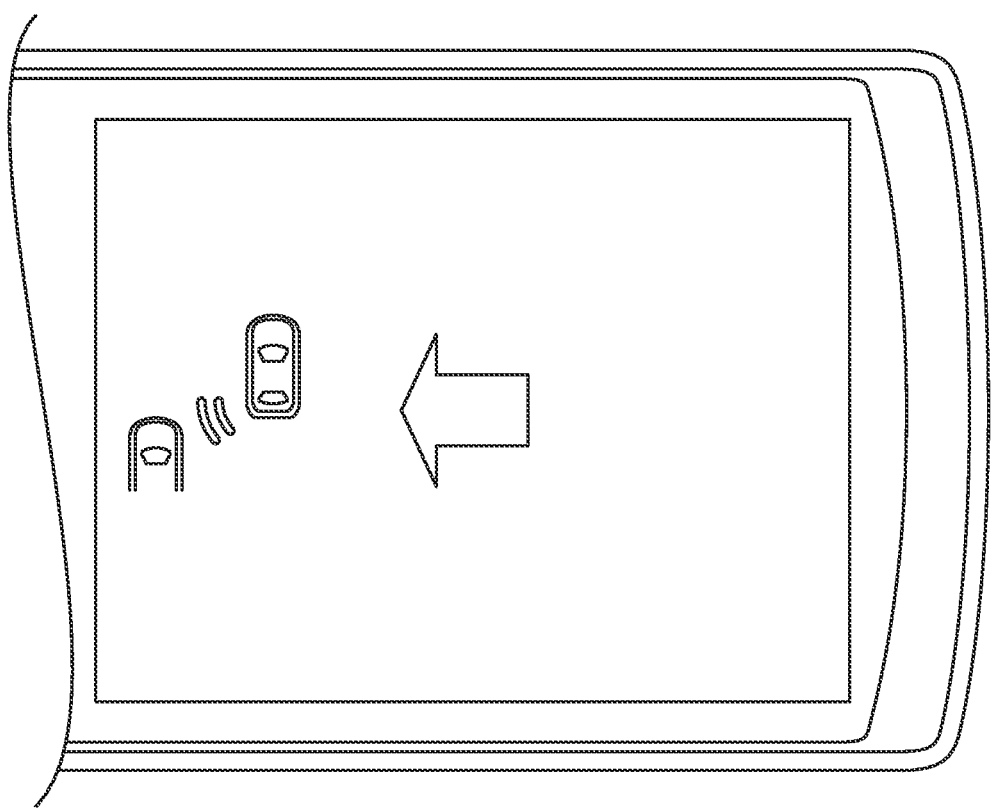
Figure 24:
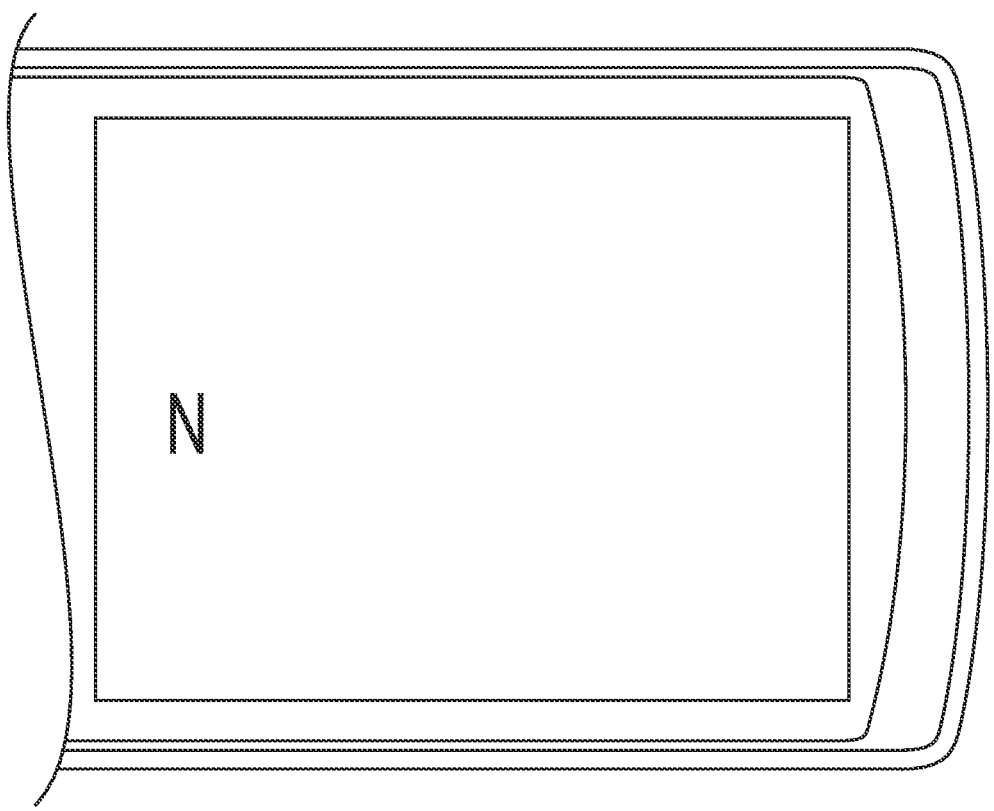
Figure 25:
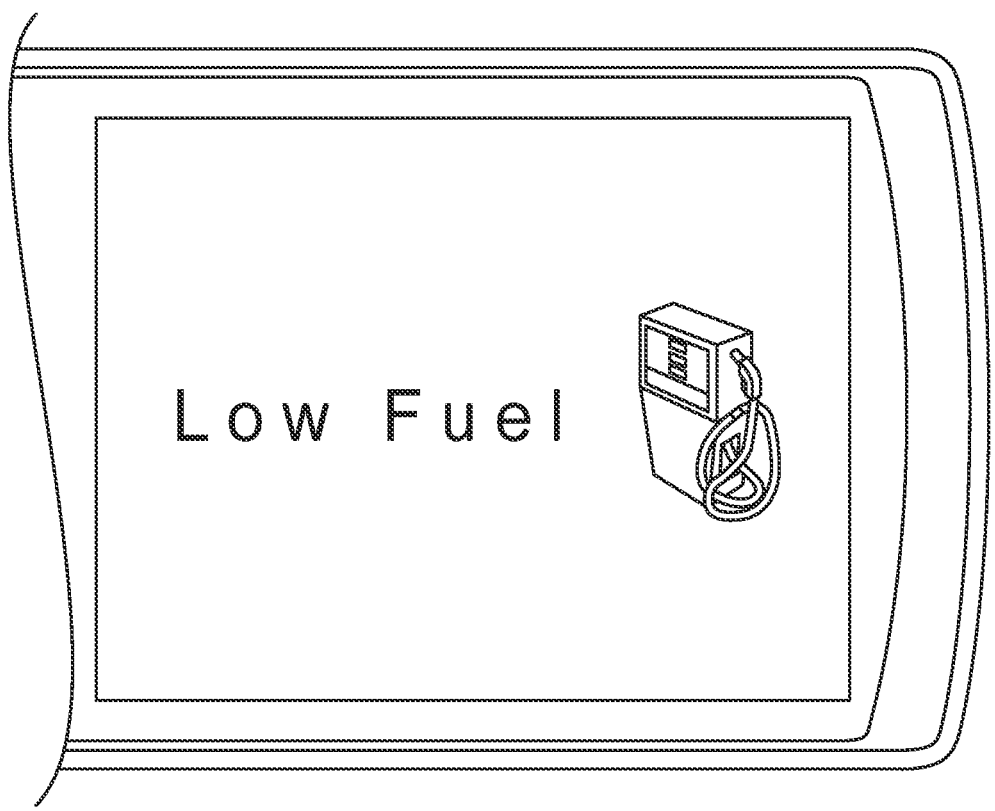
Figure 26:
Figure 27:
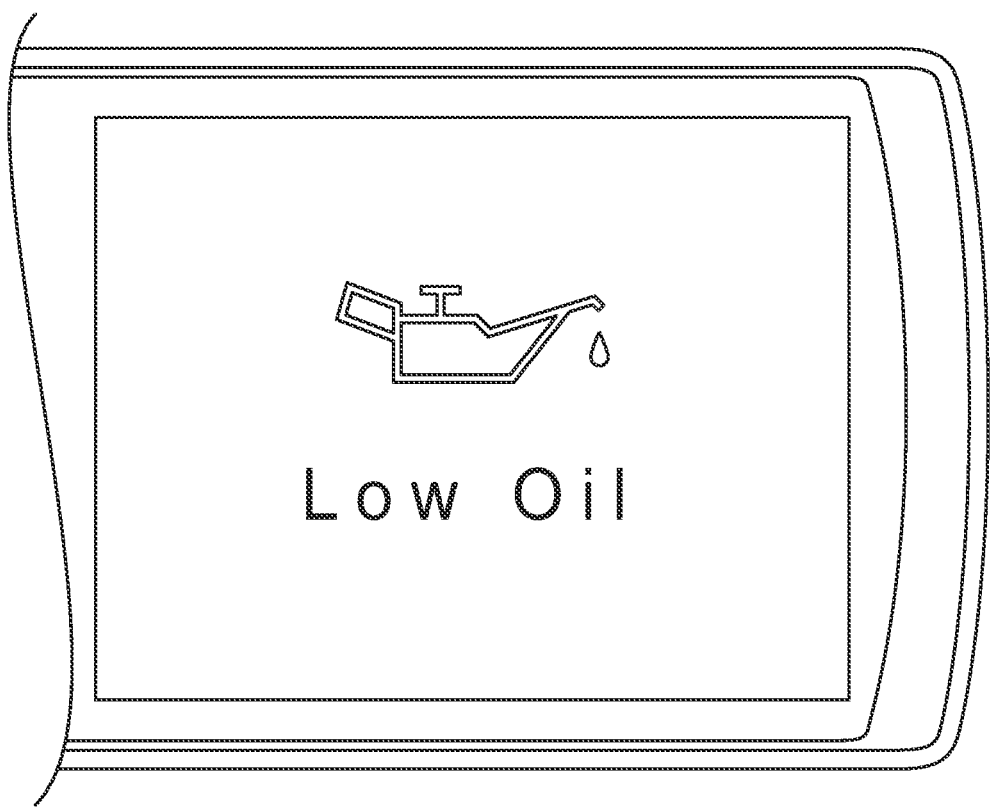
Figure 28:
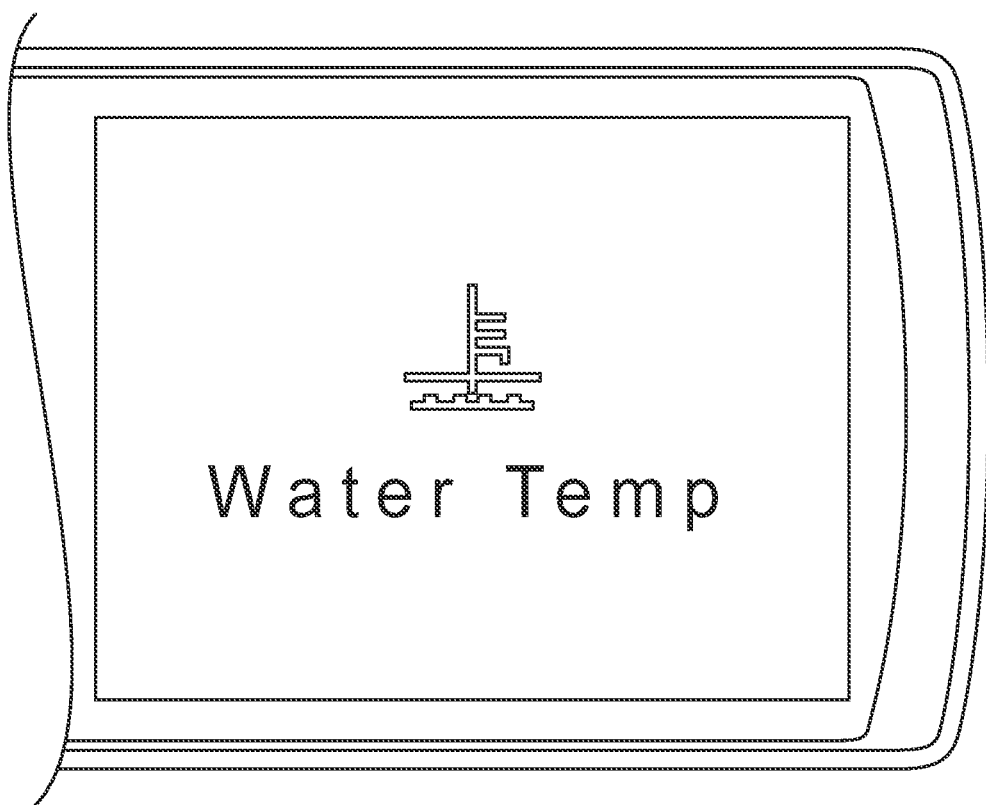
Figure 29:
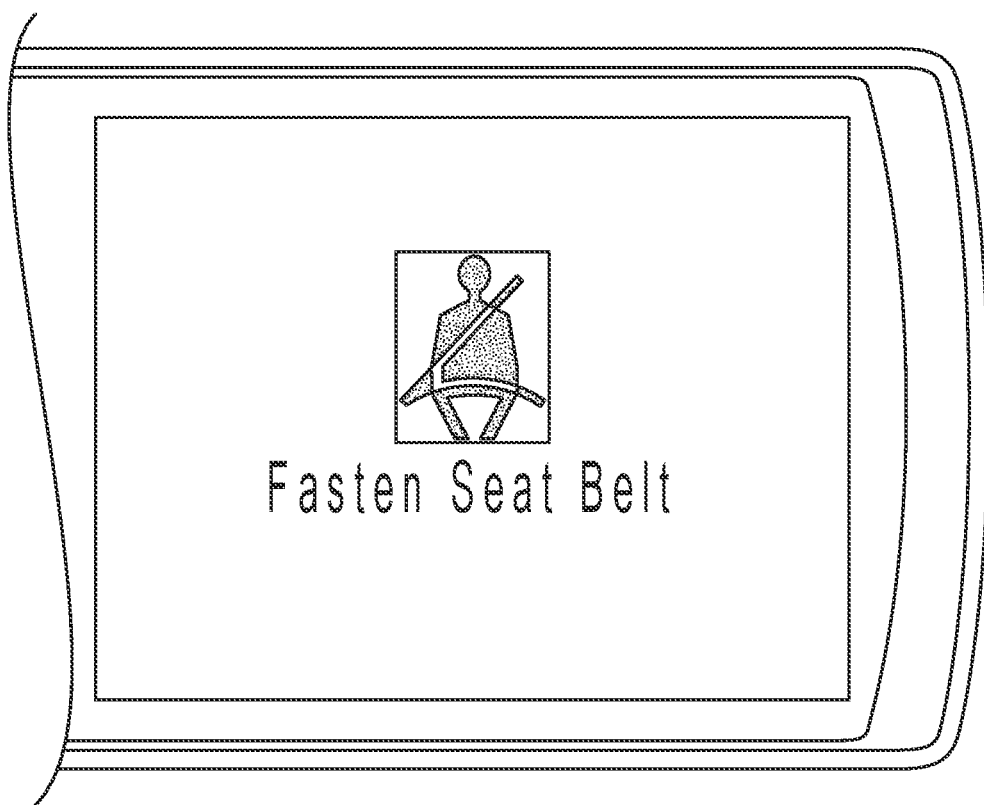
Figure 30:
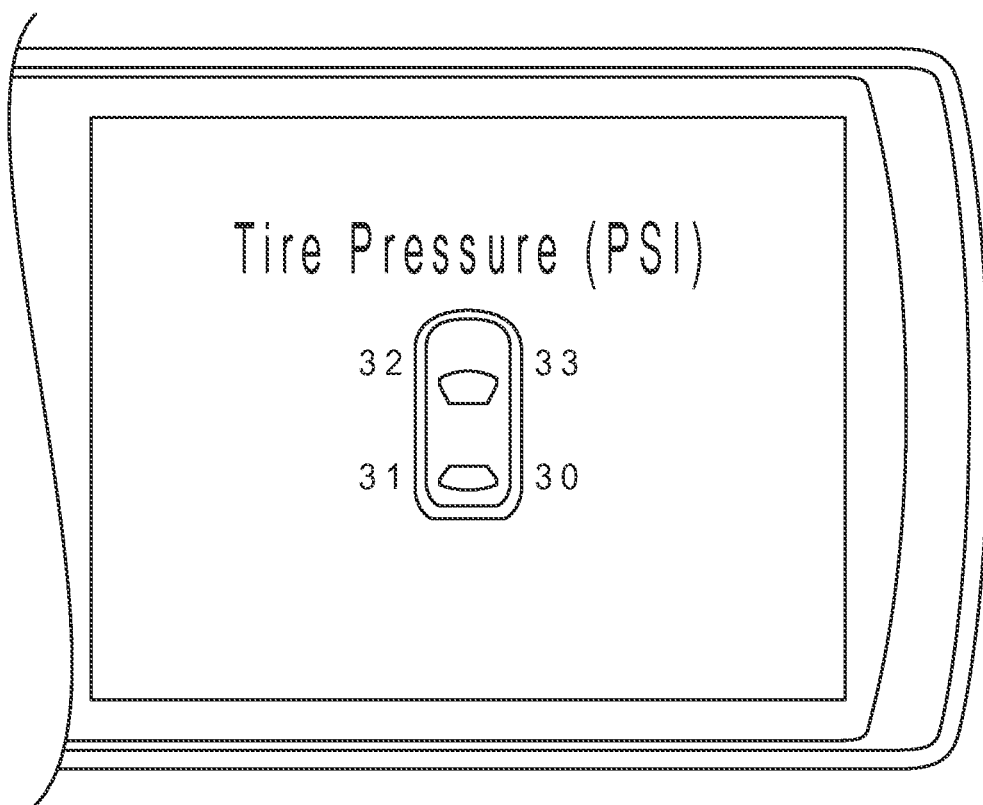
Figure 31:
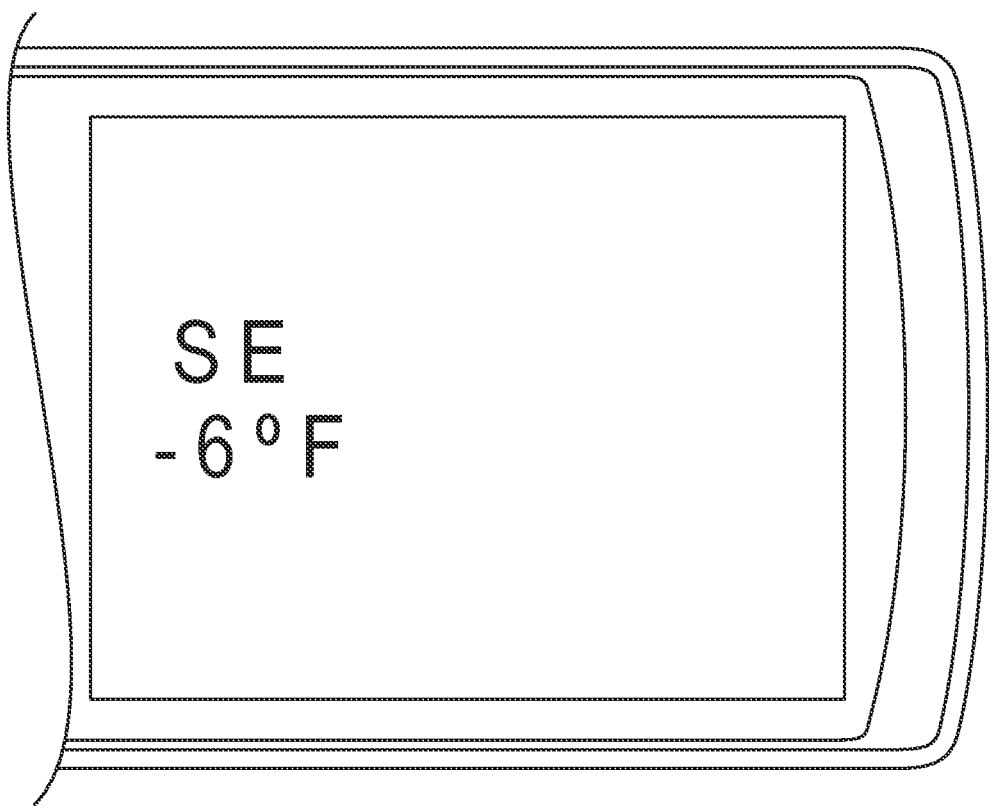

For example, and with reference to FIGS. 14 and 15, the decoder may control the video display screen to display video images of a scene captured by one or more cameras of the vehicle, and may generate a graphic overlay that is electronically generated and superimposed on the video image by the decoder. Optionally, the decoder may function to display on the video display other messages or signals for viewing by the driver of the vehicle. For example, and with reference to FIGS. 16-31, the decoder may function to display camera status information, EC dimming status information, toll information and toll payment card status information, blind spot detection or object detection information, directional heading information, fuel gauge status information, telephone call status information or other telematics system information, vehicle fluid level status information, seat belt status information, tire pressure information, directional heading and/or temperature information, and/or the like.

Typically, a backlit video screen utilized in an interior rearview mirror is provided as a package or module that typically has a 2.4 inch to 4.3 inch diagonal dimension (typically around 3.5 inches) and an aspect ratio of width to height of about 4:3 or about 15:9 or 16:9, and typically has an active area of around 72 mm wide and 53 mm high for a typical 3.5 inch diagonal screen with a 4:3 aspect ratio, with around 70,000-80,000 or thereabouts TFT RGB pixel resolution, or a typical 16:9 aspect ratio screen may have an active area of around 71 mm wide and 43 mm high, with around 96,000 or thereabouts TFT RGB pixel resolution. The video screen module or package has a circuit board and its control circuitry disposed at a rear of the package or module, such as by utilizing aspects of U.S. Pat. Nos. 7,004,593 and 7,370,983, which are hereby incorporated herein by reference in their entireties. Preferably, the circuitry required for operation of the display itself (including the video decoding and control of the backlighting and/or the like) and of the associated rearview mirror (such as electrochromic dimming and/or the like) is established on a printed circuit board or equivalent that attaches at the rear of the video display screen module or package and is roughly dimensioned to be the same as or close to the size and shape of the video display screen module or package.

Thus, the decoder of the present invention may decode the video signal and may provide OSD capability and EC control capability, and may receive inputs from sensors (such as imaging sensors or photosensors or the like), and may receive switch inputs and may control various accessories in response to the user inputs or switch inputs. The decoder may share or access photo sensors to control the dimming of the display. The decoder thus provides a highly integrated TFT flat panel display controller at a reduced cost, and integrates a microprocessor in the single circuit element or board or chip. The decoder may provide UART capability, I²C capability, SPI capability and/or the like. Optionally, the decoder may include a transceiver or the like and the decoder may connect to or link to a LIN node of a network system of the vehicle.

Optionally, the mirror assembly may include or may be associated with a compass sensor and circuitry for a compass system that detects and displays the vehicle directional heading to a driver of the vehicle. Optionally, an integrated automotive "compass-on-a-chip" may be disposed in a cavity of the mounting base of the mirror (or within the mirror housing or in an attachment to the mirror mount or elsewhere within the mirror assembly such as to the rear of the video screen or to the rear of the mirror reflective element) and may comprise at least two magneto-responsive sensor elements (such as a Hall sensor or multiple Hall sensors), associated A/D and D/A converters, associated microprocessor(s) and memory, associated signal processing and filtering, associated display driver and associated LIN/CAN BUS interface and the like, all (or a sub-set thereof) created or disposed or commonly established onto a semiconductor chip surface/substrate or silicon substrate, such as utilizing CMOS technology and/or fabrication techniques as known in the semiconductor manufacturing arts, and constituting an ASIC chip, such as utilizing principles described in U.S. Pat. Nos. 7,329,013 and/or 7,370,983, and/or U.S. patent application Ser. No. 11/226,628, filed Sep. 14, 2005 and published Mar. 23, 2006 as U.S. Publication No. 2006/0061008, which are hereby incorporated herein by reference in their entireties, which are hereby incorporated herein by reference in their entireties, and/or such as by utilizing aspects of an EC driver-on-a-chip such as described in U.S. patent application Ser. No. 11/201,661, filed Aug. 11, 2005, now U.S. Pat. No. 7,480,149, which is hereby incorporated herein by reference in its entirety. The ASIC chip may be small (preferably less than approximately a two square centimeter area, more preferably less than approximately a 1.5 square centimeter area, and most preferably less than approximately a one square centimeter area or thereabouts) and readily packagable into the mirror assembly (or a feed from such a compass-on-a-chip may be provided to the mirror assembly from a compass-on-a-chip packaged elsewhere in the vehicle cabin remote from the mirror assembly such as in an instrument panel portion or in roof console portion). Such large scale integration onto the likes of the silicon substrate/chip can allow a compass functionality to be provided by a relatively small chip, and with appropriate pin out or electrical leads provided as is common in the electrical art.

Figure 2:
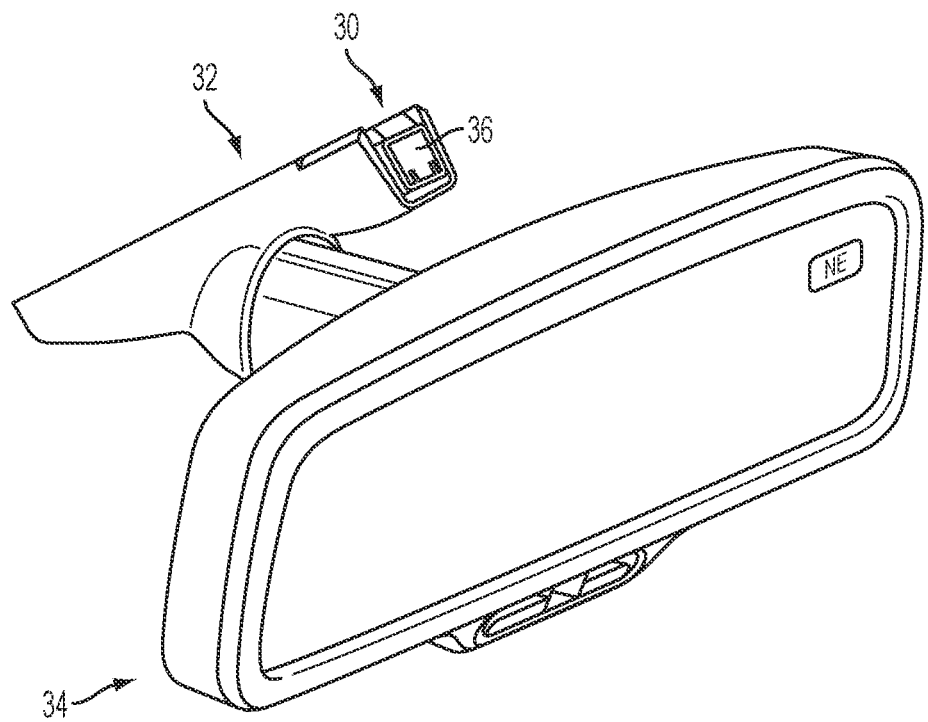
FIGS. 2-4 are perspective views of an interior rearview mirror assembly in accordance with the present invention, with the compass chip disposed at an upper end of a wire management portion of the mirror assembly.
Figure 3:
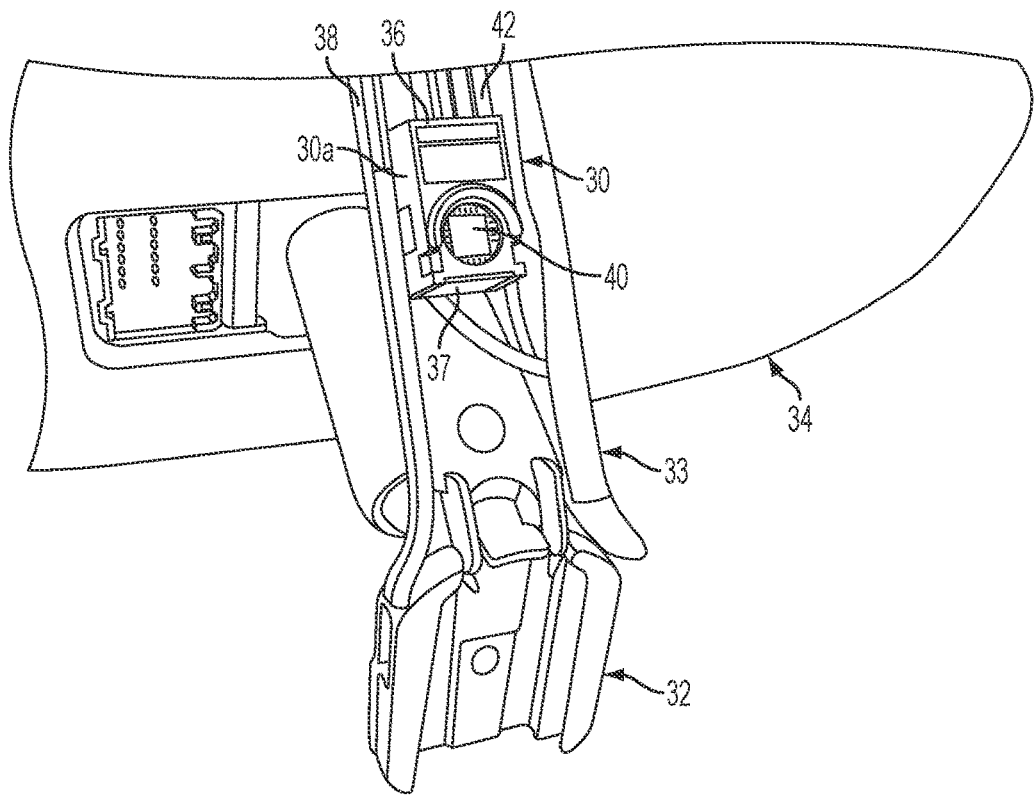
Figure 4:
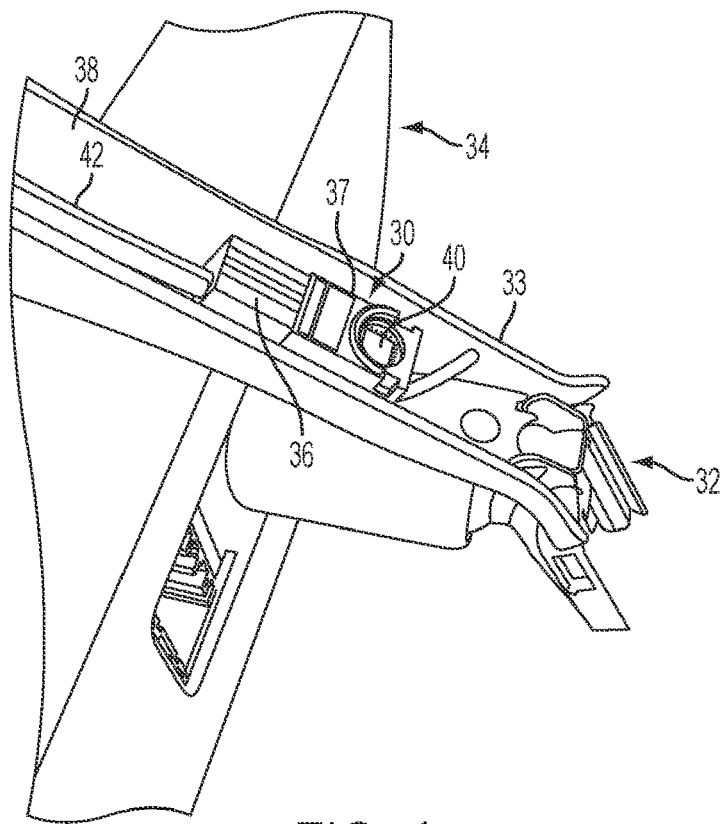
Figure 5:
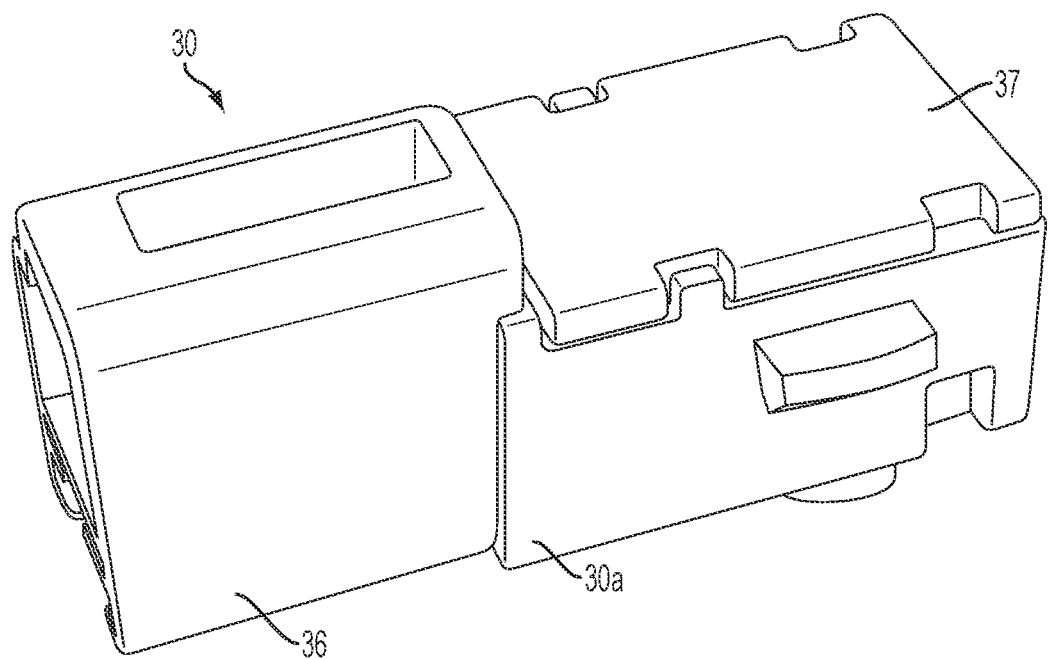
FIGS. 5-8 are perspective views of the compass chip incorporated into the interior rearview mirror assembly of FIGS. 2-4.
Figure 6:
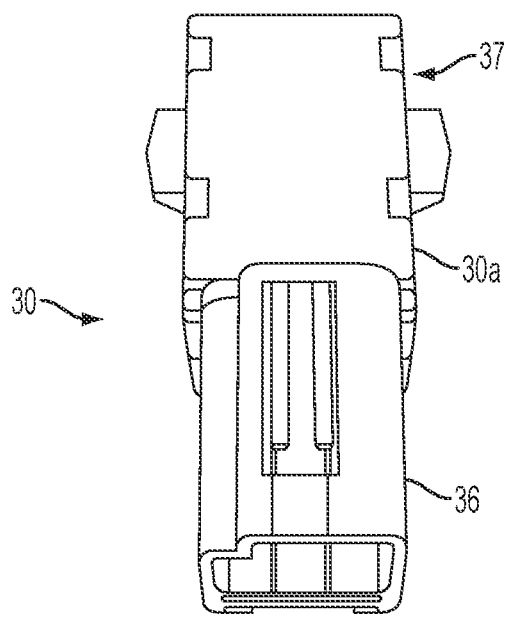
Figure 7:
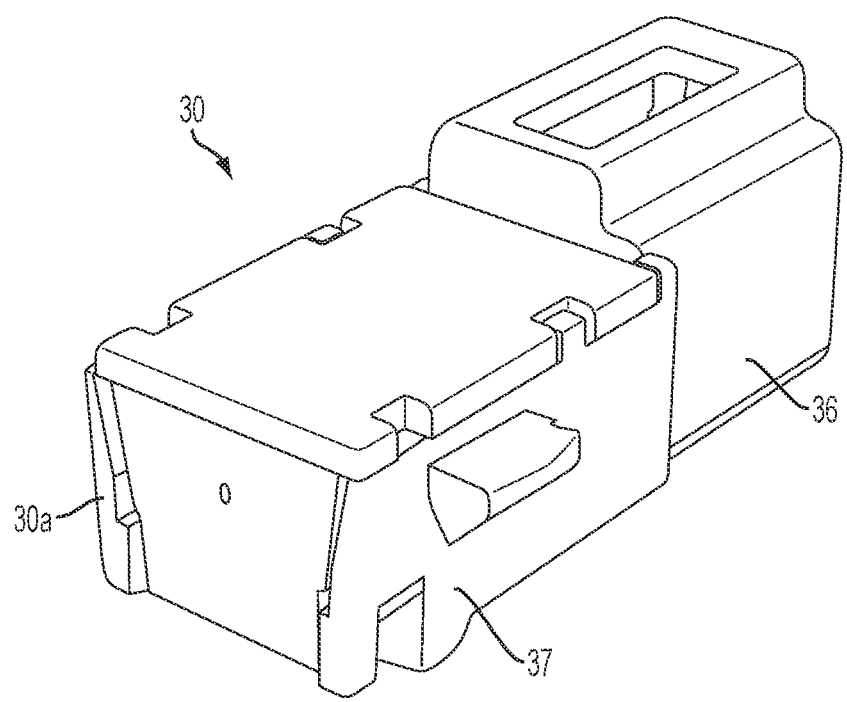
Figure 8:
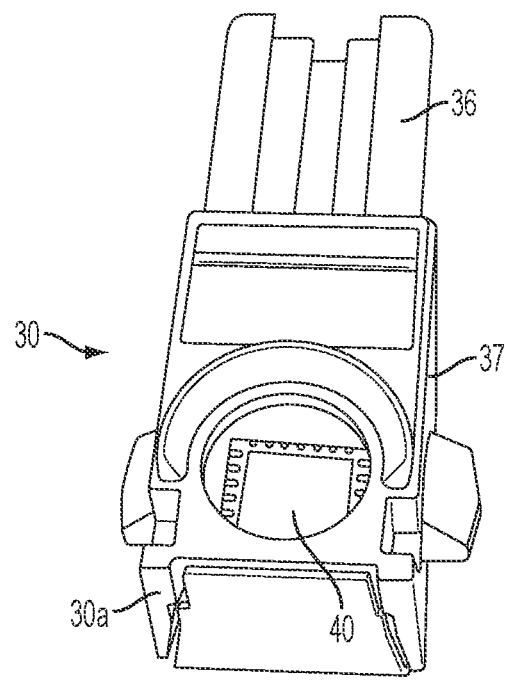
Figure 12:
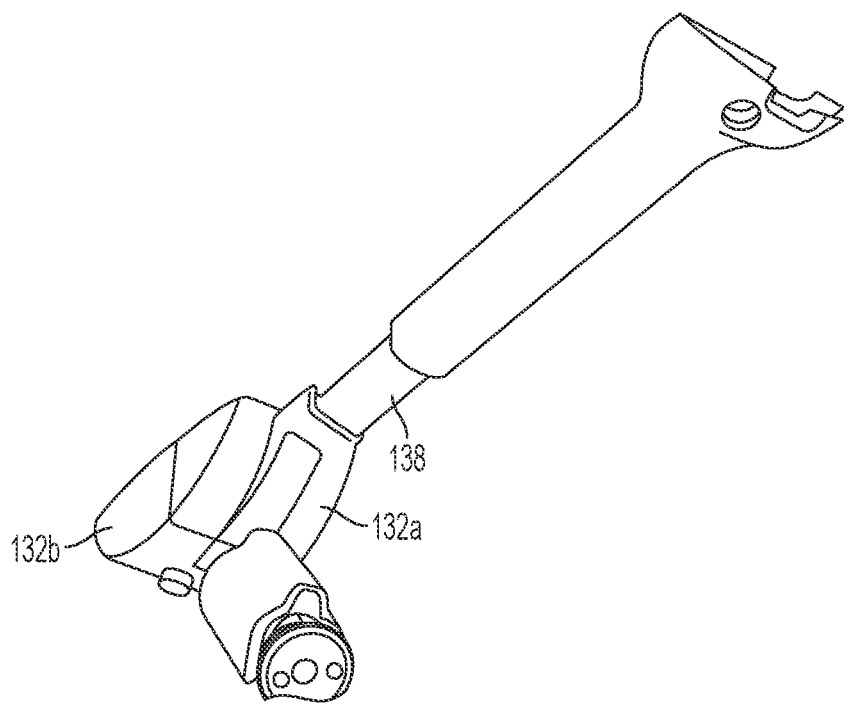
FIGS. 12 and 13 are perspective views of the mirror mounting base and the wire management element that incorporates a compass chip in accordance with the present invention.

As shown in FIGS. 2-4, a compass chip or compass module 30 may be disposed at an upper end of the mounting base 32 of a mirror assembly 34, such as at an upper or connecting end of a wire management element 33 connected to or extending from the mounting base 32 of the mirror assembly. The compass chip 30 may have a connector or connecting elements 36 established on the chip substrate. As shown in FIGS. 3-8, compass chip or module 30 includes a housing 30a having the connector 36 at one end and a housing portion 37 at the other end, with the compass chip circuitry 40 housed within the housing portion 37 and electrically connected to the connector terminals. In the illustrated embodiment, the connector 36 is at the upper end or region of the wire management element at the mounting base and at a portion of the wire management element or mounting base extension that mounts to or has attached to it a wire management element or channel or cover element 38 (FIGS. 3 and 4), such as a wire management system or element of the types described in U.S. patent application Ser. No. 11/226,628, filed Sep. 14, 2005 and published Mar. 23, 2006 as U.S. Publication No. 2006/0061008; and/or Ser. No. 11/584,697, filed Oct. 20, 2006, now U.S. Pat. No. 7,510,287, which are hereby incorporated herein by reference in their entireties.

A wire harness 42 of the vehicle may be routed along channel or cover element 38 and may plug into or readily connect to connector 36 of compass chip 30 to provide the electrical power and/or control to the compass system and to any other circuitry or device or system associated with or established on or connected to the compass chip. Thus, the compass chip is provided at the mounting base of the mirror assembly or at a wire management element at the mounting base of the mirror assembly, and may be readily connected to the vehicle wire harness to enhance the assembly processes at the vehicle assembly plant. The compass chip thus may provide all of the compass electronics and circuitry at the compass chip, whereby no electronics need be provided within the mirror assembly.

The integrated compass chip may be connected to a power in or supply lead or wiring harness (such as a wiring harness that extends down from the headliner of the vehicle) and may connect to a wiring or harness of the mirror assembly. Preferably, the compass chip may connect between and in-line with the vehicle wiring harness and the mirror wiring harness (which may connect between the mounting base of the mirror assembly and the mirror casing, such as in the manner described in U.S. Pat. Nos. 7,329,013 and/or 7,370,983, and/or U.S. patent application Ser. No. 11/226,628, filed Sep. 14, 2005 and published Mar. 23, 2006 as U.S. Publication No. 2006/0061008; and/or Ser. No. 11/584,697, filed Oct. 20, 2006, now U.S. Pat. No. 7,510,287, which are hereby incorporated herein by reference in their entireties), or in-line with another plug/socket connector of the vehicle. The integrated compass chip thus may be readily connected, such as via plug-in-socket type connections, to both wires or harnesses to electrically connect the compass chip to the power source and to a display or user interface or input at the mirror. The connectors of the compass chip may be selected such that when the compass chip is not selected as an option of the vehicle, the vehicle wiring harness connects to or plugs into the mirror harness or wiring in the same manner, such that common wiring harnesses and/or connectors may be used at the vehicle and mirror, regardless of whether or not the compass system is included. Thus, an electronic chip (such as an integrated compass-on-a-chip) may be connected in-line with an existing plug/socket arrangement in the vehicle such that the presence of the chip-in-line is largely unnoticed by the vehicle occupants.

Optionally, such a connection can be made to the compass chip via a plug-and-socket type connection between the vehicle wire harness and a connector established at the compass chip. Optionally, the compass chip (such as at the connector end of the compass chip) may include terminals extending therefrom or receiving portions established therein and configured to electrically connect to the vehicle wire harness at the upper region of the mounting base.

Optionally, the compass chip may be disposed at the mirror mounting base, whereby when the wire harness connects to the compass chip, the compass chip may be sealed or encased within the mirror mounting base. Optionally, the compass chip may be disposed inside a connector element and may be substantially sealed or encased therein to protect the circuitry on the compass chip.

For example, and with reference to FIGS. 9-13, a compass chip or compass module 130 may be disposed at an upper end or portion of a mounting base of a mirror assembly 134, such as at an upper mounting base portion 132a that is connected to or mounted at or extends from a lower mounting base portion 132b of the mirror assembly 134. The compass chip 130 may be disposed within the upper mounting base portion 132a, which may have a wire 136 and/or a connector or connecting elements established at its upper end for connecting to a vehicle wire harness or the like. The compass chip or circuitry may be disposed within upper mounting portion 132a, such as at or near the lower region of the upper mounting portion so as to be disposed at or near the fixedly mounted or attached lower mounting base 132b (which may be fixedly secured to a mounting button or element 140 affixed or adhered to the vehicle windshield). The compass chip of the upper mounting base portion may be similar in construction to the compass chip 30, described above, such that a detailed discussion of the compass chips need not be repeated herein.

In the illustrated embodiment, the connector or wire 136 extends from the upper end or region of the upper mounting base portion 132a and may be routed along or within a wire management element or channel or cover element 138 that routes and conceals the wire between the upper mounting base portion 132a and the vehicle headliner at the upper region of the vehicle windshield. A wire harness of the vehicle may be routed along channel or cover element 138 and may plug into or readily connect to connector or wire 136 of compass chip 130 to provide the electrical power and/or control to the compass system and to any other circuitry or device or system associated with or established on or connected to the compass chip. Optionally, the upper end or portion of the upper mounting base portion may have a connector established thereat, whereby a vehicle wire harness may extend down from the headliner (and along and within a wire management element) for connection to the connector and compass chip at the upper mounting base portion.

Figure 10:
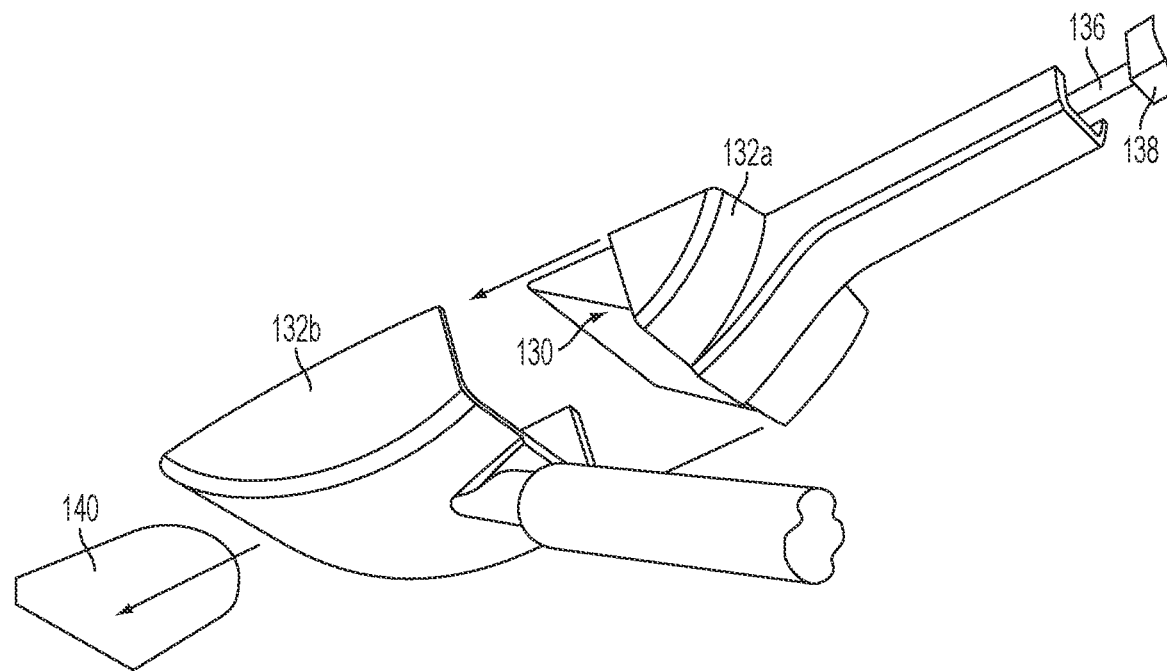
FIGS. 10 and 11 are exploded perspective views of the interior rearview mirror assembly and compass chip of FIG. 9.
Figure 13:
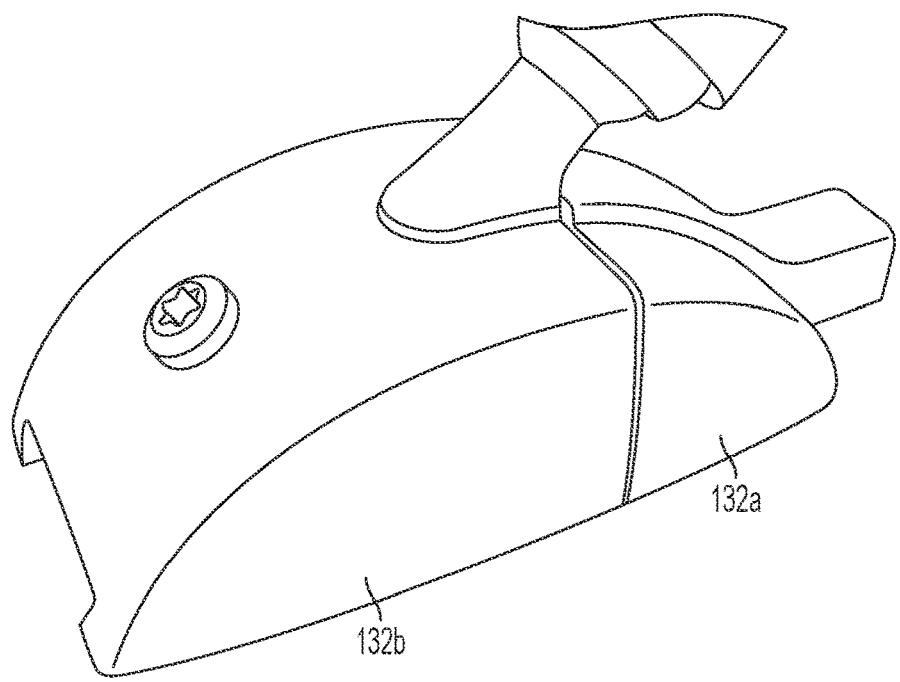
Figure 11:
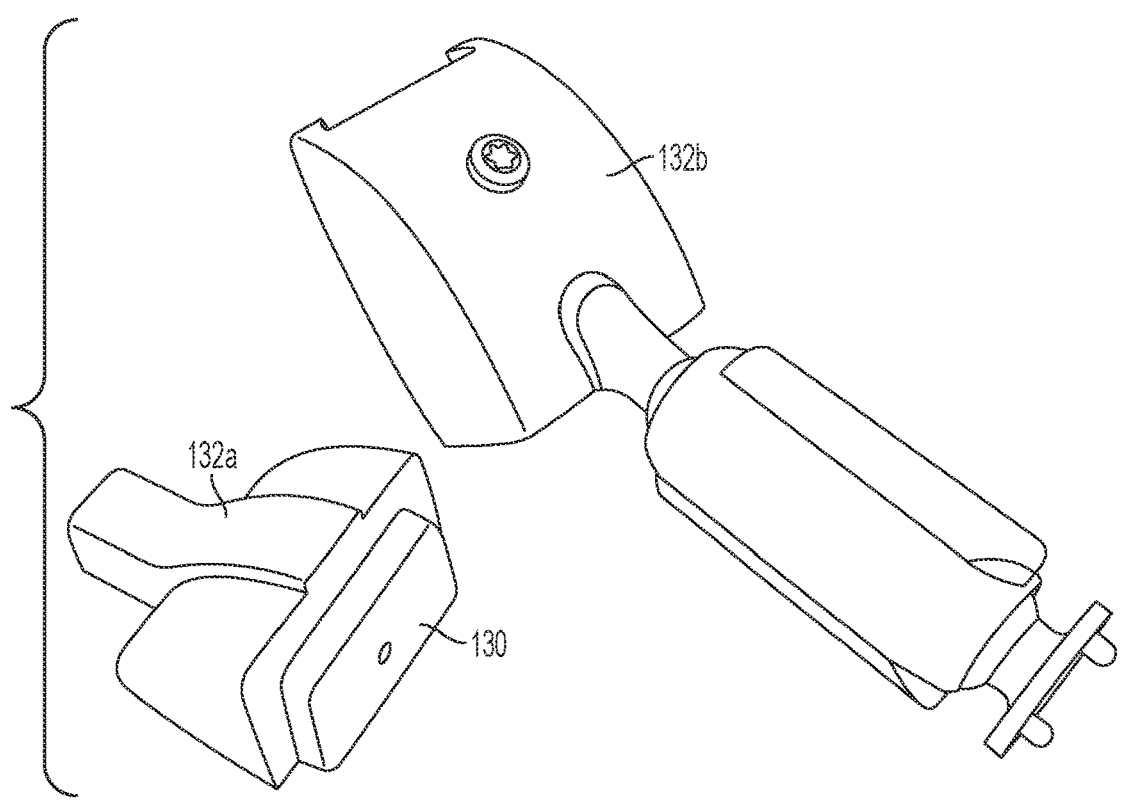

As can be seen in FIGS. 10 and 11, the upper mounting base portion 132a and the lower mounting base portion 132b may be configured so that the upper mounting base portion 132a is readily connectable to the lower mounting base portion 132b, such as via a plug and socket connecting configuration or the like. Thus, the upper mounting base portion 132a may be readily mounted to or attached to or plugged into the lower mounting base portion 132b to position the compass chip at or near the mounting base of the mirror assembly. Optionally, the mounting base portions 132a, 132b may include electrical connectors so as facilitate electrical connection of the compass chip and/or vehicle wire harness to electrical circuitry at the lower mounting base portion or at the mirror assembly (such as via a wire or cable or other electrical connection between the lower mounting base portion and the mirror casing or circuitry therein) when the upper mounting base portion is connected to or mounted at the lower mounting base portion.

Thus, the compass chip or compass module is provided at the mounting base of the mirror assembly and may be readily connected to the vehicle wire harness to enhance the assembly processes at the vehicle assembly plant. The compass chip thus may provide all of the compass electronics and circuitry at the compass chip, whereby no electronics need be provided within the mirror assembly (such that the compass chip may be suitable for application to base mirrors, such as base prismatic mirrors and the like).

Thus, the compass chip may be small enough to fit at or in the wire management structure or mounting base structure at the mirror mounting base and may readily connect to the vehicle wire harness to receive power and/or control from the vehicle wire harness. Optionally, the compass chip may include all circuitry and microprocessor needed to operate the compass system and any other associated accessories or systems, and the mirror assembly may not include any circuitry in its mirror casing. Optionally, and desirably, the compass chip or module or housing and/or the wire management element or the upper mounting portion is/are configured to support the compass sensors at an appropriate angle such that the sensors are generally horizontal when the compass chip is mounted along the windshield of the vehicle.

Optionally, such a compass-on-a-chip ASIC may also include the hardware and software required to receive an output from a temperature sensor (such as a thermocouple or thermostat that is located external the vehicle cabin in order to sense and monitor the temperature external to the vehicle) and to convert this signal to a reading in degrees Fahrenheit or Celsius, and to provide this reading via an on-chip temperature display driver and/or via a BUS protocol or via an on-chip wireless transmitter or the like to a digital or other type of temperature display so that the driver and/or occupants of the vehicle can view the temperature being measured (such as the temperature external the vehicle and/or the temperature within the vehicle cabin). Thus, for example, a monolithic compass/temp-on-a-chip ASIC may be disposed in the likes of a mirror mount or within the mirror head/housing of an interior rearview mirror assembly, and it may provide both the external temperature readout and a compass direction heading readout to an information display at the mirror head/housing (or elsewhere in the vehicle, such as the instrument panel/cluster or at an overhead console or accessory module or the like). Optionally, such a chip or circuit board or circuitry may also or otherwise comprise EC driver circuitry for controlling/driving an electro-optic or electrochromic reflective element or cell, such as by utilizing aspects of the EC driver-on-a-chip such as described in U.S. patent application Ser. No. 11/201,661, filed Aug. 11, 2005, now U.S. Pat. No. 7,480,149, which is hereby incorporated herein by reference in its entirety.

The printed circuit board or equivalent may comprise a generally flat, rectangular element or substrate with conductive traces and circuitry disposed thereon. Because it is desired to provide sensing in the x-y directions (or in a horizontal plane), the compass sensor is preferably disposed so that the compass sensor elements are generally horizontal when the mirror assembly is installed in the vehicle.

The compass chip may be in communication with a compass display, which may provide a display region at the reflective element, and which includes ports or portions, which may comprise icons, characters or letters or the like representative of only the cardinal directional points, such as, for example, the characters N, S, E, W, formed or etched in the reflective film coating of the reflective element (and forming a transparent window therein), such as via techniques such as disclosed in commonly assigned U.S. Pat. Nos. 4,882,565 and/or 7,004,593, which are hereby incorporated by reference herein in their entireties. Optionally, however, reflective element may comprise a transflective or display on demand (DOD) reflective element, and the compass display may be a display on demand (DOD) type of display, such as disclosed in commonly assigned U.S. Pat. Nos. 7,195,381; 6,690,268; 5,668,663 and 5,724,187, which are hereby incorporated by reference herein in their entireties, without affecting the scope of the present invention.

Optionally, the sensor may comprise a two-axis sensor (comprising two magneto-responsive sensor elements disposed at a fixed angle relative to each other, such as, preferably, orthogonally to each other, and disposed in the cavity generally parallel to the floor plane of the vehicle so as to be sensitive to the horizontal component of the Earth's magnetic field), or the sensor may comprise a three-axis sensor (comprising two magneto-responsive sensor elements disposed orthogonally to each other and disposed in the cavity, and a third magneto-responsive sensor element at a right angle (approximately ninety degrees) to the two sensor elements and disposed in the cavity, so that the three-axis sensor is sensitive to the horizontal component and to the vertical component of the Earth's magnetic field), without affecting the scope of the present invention. The sensor may be arranged at a desired angle to provide enhanced sensing in the horizontal directions when the mirror assembly is installed in the vehicle. For example, aspects of constructions such as are disclosed in U.S. Pat. Nos. 6,140,933 and 6,928,366, which are hereby incorporated herein by reference in their entireties, may be utilized.

Optionally, the compass system and compass circuitry may utilize aspects of the compass systems described in U.S. Pat. Nos. 7,370,983; 7,249,860; 7,004,593; 6,642,851; 4,546,551; 5,699,044; 4,953,305; 5,576,687; 5,632,092; 5,677,851; 5,708,410; 5,737,226; 5,802,727; 5,878,370; 6,087,953; 6,173,508; 6,222,460 and/or 6,513,252, and/or PCT Application No. PCT/US2004/015424, filed May 18, 2004 and published on Dec. 2, 2004 as International Publication No. WO 2004/103772, and/or European patent application published Oct. 11, 2000 under Publication No. EP 0 1043566, and/or U.S. provisional applications, Ser. No. 60/624,091, filed Nov. 1, 2004; Ser. No. 60/636,931, filed Dec. 17, 2004; Ser. No. 60/638,250, filed Dec. 21, 2004; Ser. No. 60/642,227, filed Jan. 7, 2005; and Ser. No. 60/653,787, filed Feb. 17, 2005, which are all hereby incorporated herein by reference in their entireties. The compass circuitry may include compass sensors, such as a magneto-responsive sensor, such as a magneto-resistive sensor, a magneto-capacitive sensor, a Hall sensor, a magneto-inductive sensor, a flux-gate sensor or the like. The sensor or sensors may be positioned at and within a base portion of the mirror assembly so that the sensor/sensors is/are substantially fixedly positioned within the vehicle, or may be attached or positioned within the mirror casing. Note that the magneto-responsive sensor used with the mirror assembly may comprise a magneto-responsive sensor, such as a magneto-resistive sensor, such as the types disclosed in U.S. Pat. Nos. 5,255,442; 5,632,092; 5,802,727; 6,173,501; 6,427,349 and 6,513,252 (which are hereby incorporated herein by reference in their entireties), or a magneto-inductive sensor, such as described in U.S. Pat. No. 5,878,370 (which is hereby incorporated herein by reference in its entirety), or a magneto-impedance sensor, such as the types described in PCT Publication No. WO 2004/076971, published Sep. 10, 2004 (which is hereby incorporated herein by reference in its entirety), or a Hall-effect sensor, such as the types described in U.S. Pat. Nos. 6,278,271; 5,942,895 and 6,184,679 (which are hereby incorporated herein by reference in their entireties). The sensor circuitry and/or the circuitry in the mirror housing and associated with the sensor may include processing circuitry. For example, a printed circuit board may include processing circuitry which may include compensation methods, such as those described in U.S. Pat. Nos. 4,546,551; 5,699,044; 4,953,305; 5,576,687; 5,632,092; 5,677,851; 5,708,410; 5,737,226; 5,802,727; 5,878,370; 6,087,953; 6,173,508; 6,222,460 and 6,642,851, which are all hereby incorporated herein by reference in their entireties. The compass sensor may be incorporated in or associated with a compass system and/or display system for displaying a directional heading of the vehicle to the driver, such as a compass system of the types described in U.S. Pat. Nos. 5,924,212; 4,862,594; 4,937,945; 5,131,154; 5,255,442; 5,632,092 and/or 7,004,593, and/or PCT Application No. PCT/US2004/015424, filed May 18, 2004 and published on Dec. 2, 2004, as International Publication No. WO 2004/103772, which are all hereby incorporated herein by reference in their entireties.

Optionally, and as shown in FIG. 1, the mirror assembly may comprise an electro-optic or electrochromic mirror assembly and may include an electro-optic or electrochromic reflective element. The electrochromic mirror element of the electrochromic mirror assembly may utilize the principles disclosed in commonly assigned U.S. Pat. Nos. 6,690,268; 5,140,455; 5,151,816; 6,178,034; 6,154,306; 6,002,544; 5,567,360; 5,525,264; 5,610,756; 5,406,414; 5,253,109; 5,076,673; 5,073,012; 5,117,346; 5,724,187; 5,668,663; 5,910,854; 5,142,407 and/or 4,712,879, and/or U.S. provisional applications, Ser. No. 61/232,246, filed Aug. 7, 2009; Ser. No. 61/186,204, filed Jun. 11, 2009; and Ser. No. 61/164,593, filed Mar. 30, 2009, which are hereby incorporated herein by reference in their entireties, and/or as disclosed in the following publications: N. R. Lynam, "Electrochromic Automotive Day/Night Mirrors", SAE Technical Paper Series 870636 (1987); N. R. Lynam, "Smart Windows for Automobiles", SAE Technical Paper Series 900419 (1990); N. R. Lynam and A. Agrawal, "Automotive Applications of Chromogenic Materials", Large Area Chromogenics: Materials and Devices for Transmittance Control, C. M. Lampert and C. G. Granquist, EDS., Optical Engineering Press, Wash. (1990), which are hereby incorporated by reference herein in their entireties; and/or as described in U.S. Pat. No. 7,195,381, which is hereby incorporated herein by reference in its entirety. Optionally, the electrochromic circuitry and/or a glare sensor (such as a rearward facing glare sensor that receives light from rearward of the mirror assembly and vehicle through a port or opening along the casing and/or bezel portion and/or reflective element of the mirror assembly) and circuitry and/or an ambient light sensor and circuitry may be provided on one or more circuit boards of the mirror assembly. The mirror assembly may include one or more other displays, such as the types disclosed in U.S. Pat. Nos. 5,530,240 and/or 6,329,925, which are hereby incorporated herein by reference in their entireties, and/or display-on-demand transflective type displays, such as the types disclosed in U.S. Pat. Nos. 7,274,501; 7,255,451; 7,195,381; 7,184,190; 5,668,663; 5,724,187 and/or 6,690,268, and/or in U.S. patent application Ser. No. 11/226,628, filed Sep. 14, 2005; and/or Ser. No. 10/538,724, filed Jun. 13, 2005, and/or PCT Application No. PCT/US03/29776, filed Sep. 9, 2003 and published Apr. 1, 2004 as International Publication No. WO 2004/026633, which are all hereby incorporated herein by reference in their entireties. The thicknesses and materials of the coatings on the substrates, such as on the third surface of the reflective element assembly, may be selected to provide a desired color or tint to the mirror reflective element, such as a blue colored reflector, such as is known in the art and such as described in U.S. Pat. Nos. 5,910,854; 6,420,036 and/or 7,274,501, and in PCT Application No. PCT/US03/29776, filed Sep. 9, 2003 and published Apr. 1, 2004 as International Publication No. WO 2004/026633, which are all hereby incorporated herein by reference in their entireties.

Figure 32:
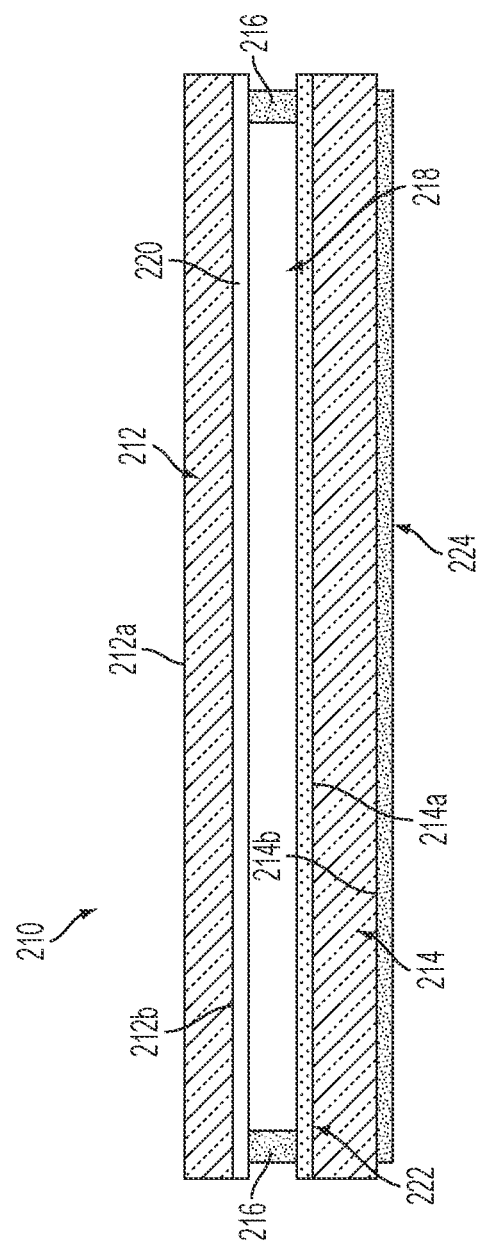
FIG. 32 is a sectional view of an electrochromic mirror assembly.

For example, and with reference to FIG. 32, a mirror reflective element assembly 210 may comprise an electro-optic (such as electrochromic) mirror reflective element assembly with a first or front substrate 212 having a first or front surface 212a (the surface generally facing the driver of a vehicle when the mirror reflective element assembly is normally mounted in the vehicle) and a second or rear surface 212b and a second or rear substrate 214 having a third or front surface 214a and a fourth or rear surface 214b. A perimeter seal 216 is disposed between the front and rear substrates and spaces the substrates apart and defines an interpane cavity between the substrates with an electro-optic (such as electrochromic) medium 218 disposed within the interpane cavity and contacting a transparent conductive layer or coating 220 at the second surface 212b of front substrate 212 and a metallic reflector layer or coating 222 at the third surface 214a of rear substrate 214. A light absorbing layer or coating or film 224 may be disposed at the rear or fourth surface 214b of rear substrate 214. Optionally, the third surface or rear surface of the rear substrate may have a transparent conductive coating established thereat and a metallic reflector may be disposed at the fourth surface or rear surface of the rear substrate. In such an embodiment, the mirror reflective element assembly need not include the light absorbing layer at the rear surface of the rear substrate.

Figure 33:
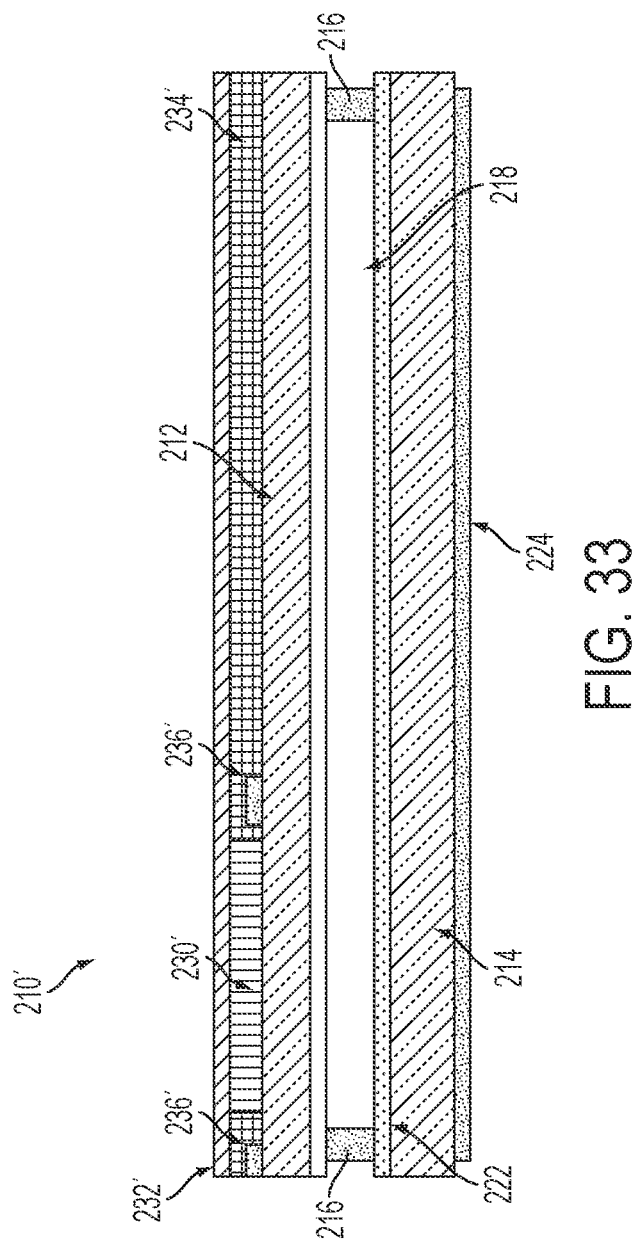
FIG. 33 is a sectional view of another electrochromic mirror assembly, shown with a transparent display element in accordance with the present invention.

Optionally, and with reference to FIG. 33, a mirror reflective element assembly 210' may include a transparent organic light emitting diode (OLED) display element or device 230' disposed at a display region or portion of front substrate 212 and in front of the front substrate 212. In the illustrated embodiment, transparent OLED display 230' is disposed at first or front surface 212a of front substrate 212, with a thin or ultra-thin glass cover sheet 232' (such as a thin glass cover sheet having a thickness of less than about 1 mm and preferably less than about 0.5 mm or thereabouts and greater than 0.1 mm) disposed over the front substrate 212 and the OLED display 230'. The cover sheet 232' may be attached to the front substrate 212, such as via a laminating material 234' between the front surface 212a of front substrate 212 and a rear surface 232b' of cover sheet 232'. The reflective element assembly 210' includes transparent electrically conductive tracks or layers 236' disposed at the front or first surface 212a of front substrate 212 to facilitate electrical connection to the OLED display 230'. Optionally, the conductive tracks or layers 236' (such as transparent tracks or raceways of indium tin oxide (ITO) or the like) may extend over and encompass the perimeter edge of the front substrate so as to provide a wraparound electrically conductive track to ease electrical connection to the transparent OLED display. In this or in a similar manner, electrical power and/or signals may be delivered to the transparent OLED display via transparent conductors/transparent conductor paths established such as at the front surface of the front substrate and at or near the perimeter region of the reflective element assembly so as to be at least partially and preferably substantially non-discernible/non-visible to a driver viewing the reflective element assembly when the mirror assembly and reflective element assembly are normally mounted in the vehicle.

Figure 34:
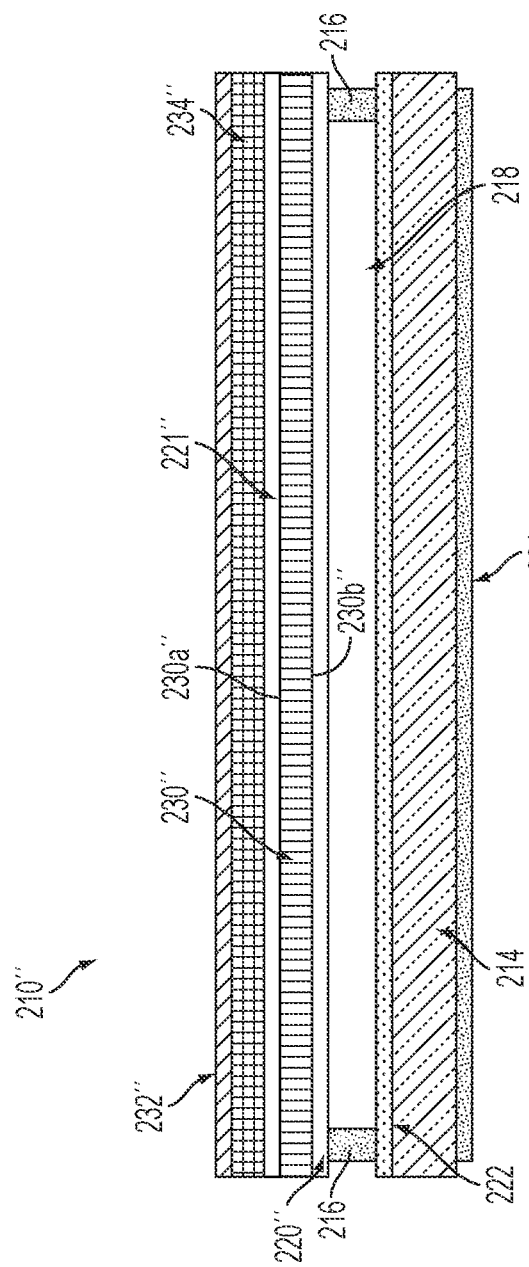
FIG. 34 is a sectional view of another electrochromic mirror assembly, shown with a transparent display element in accordance with the present invention.

Optionally, and with reference to FIG. 34, a mirror reflective element assembly 210" may include a transparent organic light emitting diode (OLED) display element or device 230" that may comprise the front of the front substrate of the reflective element assembly. In the illustrated embodiment, OLED display 230" has a transparent electrically conductive layer or coating 220" disposed at its rear or second surface 230b" and a transparent electrically conductive layer 221" disposed at its front or first surface 230a". The transparent OLED display 230" thus encompasses substantially the entire reflective element assembly, and may have a thin or ultra-thin glass cover sheet 232" disposed over and laminated to OLED display 230" (such as at the transparent electrically conductive layer 221" at the front or first surface 230a" of transparent OLED display 230") via a laminating material 234". Optionally, the transparent OLED display may comprise an outer or front substrate or panel of the reflective element assembly, and the reflective element assembly may not include the thin or ultrathin cover sheet over the display.

Figure 35:
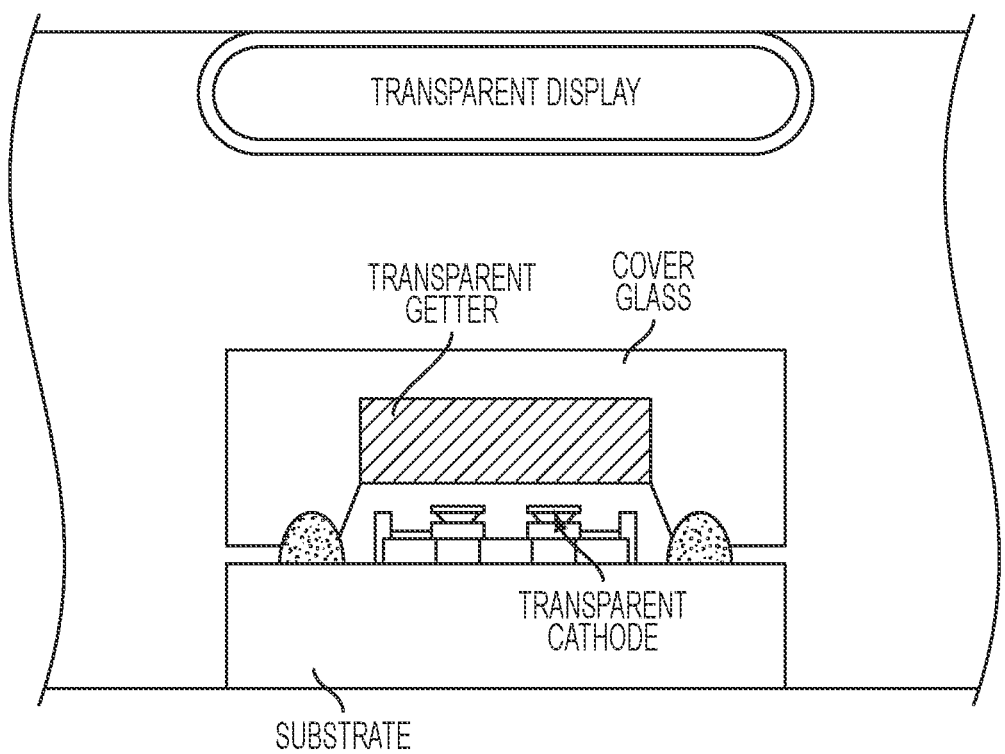
FIG. 35 is schematic of a transparent OLED display suitable for use with the reflective element assembly of the present invention.
Figure 36:
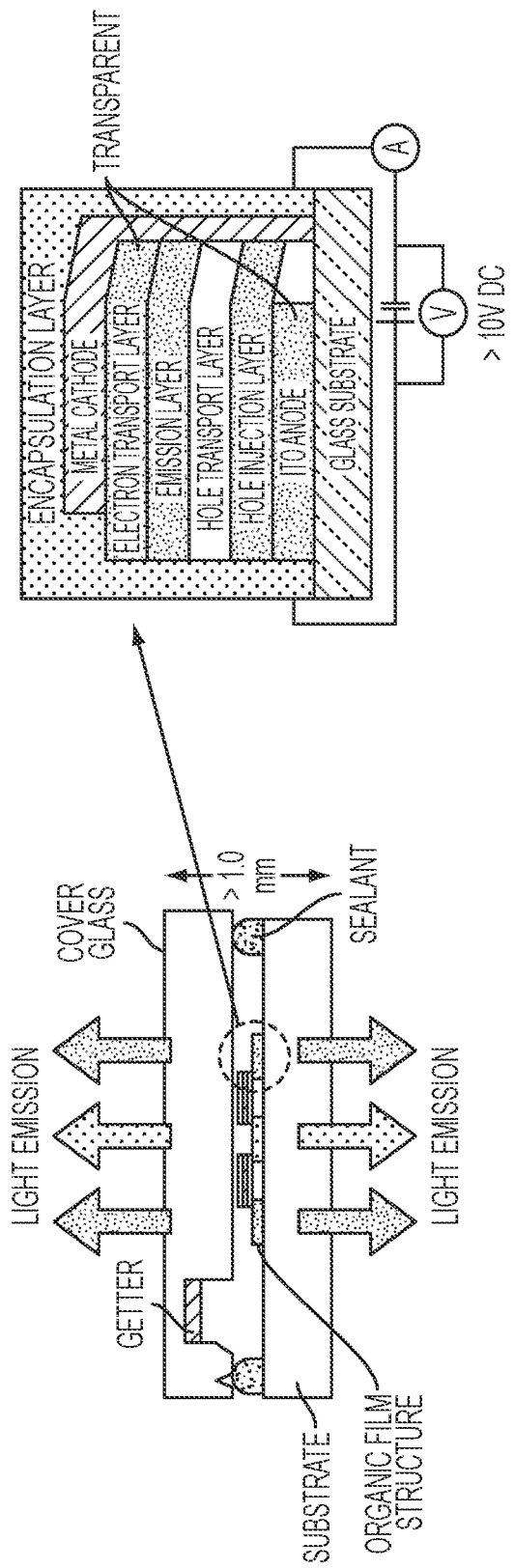
FIG. 36 is another schematic of a transparent OLED display suitable for use with the reflective element assembly of the present invention.

The OLED display preferably comprises a substantially transparent display that is substantially transparent when not activated or energized. Optionally, for example, the OLED display may comprise a transparent OLED display element of the types commercially available from NeoView Kolon Co., Ltd. [see www.neoviewkolon.com]. For example, and as shown in FIGS. 35 and 36, the transparent OLED display may include an organic film structure and electrodes established at the front surface or first surface of a substrate, such as a glass substrate of the reflective element assembly. An encapsulation layer may encapsulate the transparent metal cathodes and ITO anodes (or other transparent electrically conductive anodes), with an emission layer disposed between the metal cathode and ITO anode. As can be seen in FIG. 36, an electron transport layer, an emission layer, a hole transport layer and a hole injection layer are sandwiched between a transparent electrically conductive ITO anode (that is disposed on a glass substrate) and a transflective metal cathode that has a very low to negligible reflection and a high transmission (such as at least at least about 50 percent transmissive of visible light therethrough, more preferably at least about 65 percent transmissive of visible light therethrough, and more preferably at least about 75 percent transmissive of visible light therethrough). Alternately, the low reflection/high transmittance metal cathode (which typically is a very thin metal thin film layer) may be replaced with a transparent conductive layer. Optionally, such as shown in FIG. 34, the glass substrate of the transparent OLED display may be coated at its rear surface with a transparent conductive coating (such as ITO or the like) and the electro-optic medium may abut the rear surface of the substrate of the transparent OLED display.

When an electric current is passed between the electrodes, light is emitted with a color that is dependent on the particular materials used in the construction of the OLED display. Such a transparent OLED display may be formed as a thin layer (such as a layer about 0.01 µm or thereabouts) with a metal layer or layers that has/have lower reflection and higher transmission properties as compared to higher reflective metallic materials typically used as electrodes. For example, a transparent OLED display of the mirror reflective element assembly of the present invention is preferably at least about 50 percent transmissive of visible light therethrough, more preferably at least about 65 percent transmissive of visible light therethrough, and more preferably at least about 75 percent transmissive of visible light therethrough, and is preferably substantially spectrally non-selective or untinted and presenting a water clear view therethrough, such that the presence of the transparent OLED display is not readily discernible in front of the mirror reflector when the display is not activated or energized and when a person is viewing the mirror reflective assembly when the reflective element assembly and mirror assembly are normally mounted in the vehicle (such as shown in FIG. 37B).

Figure 37A:
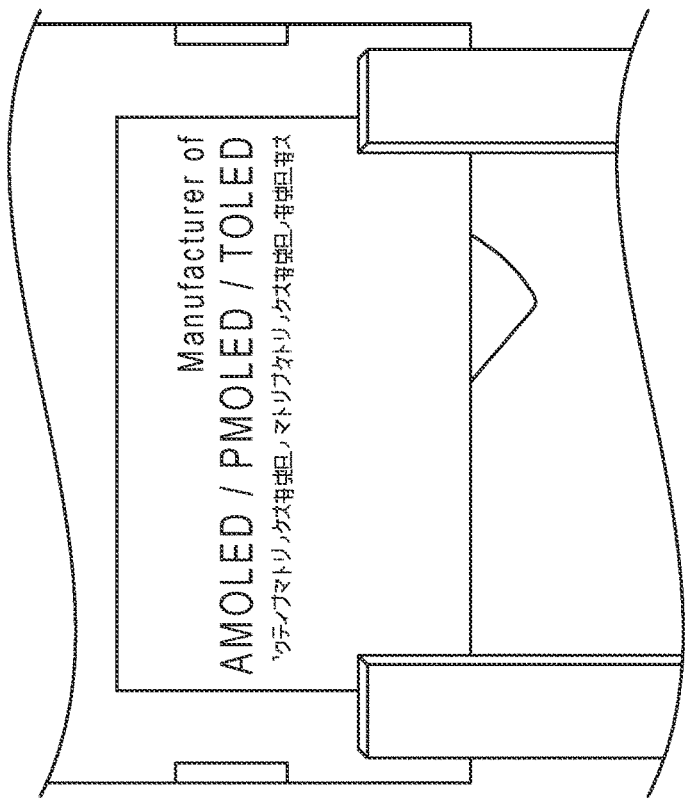
FIGS. 37A and 37B are examples of a transparent OLED display suitable for use with the reflective element assembly of the present invention, shown in an activated and deactivated state.
Figure 37B:
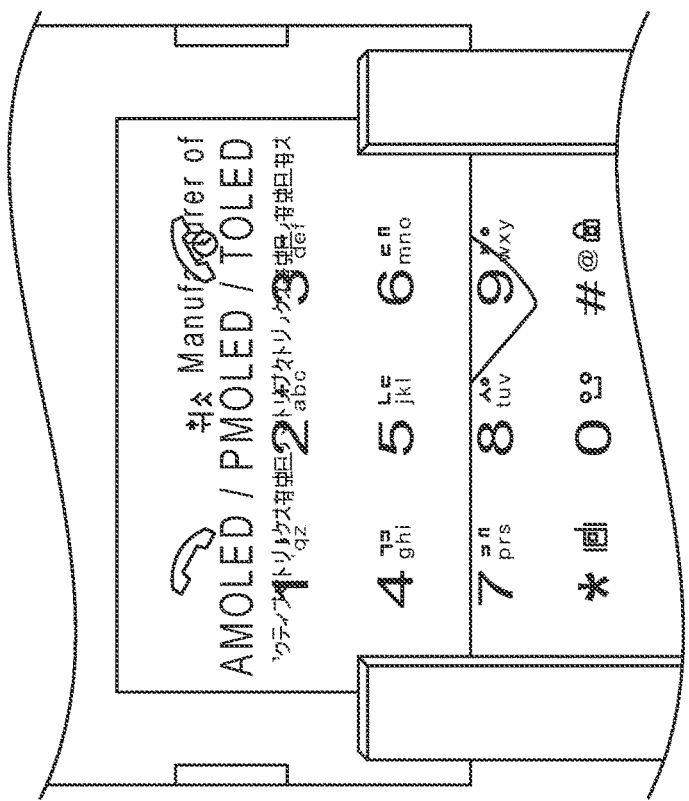

When the transparent OLED display is energized (such as shown in FIG. 37A), the transparent OLED display may display information at a display intensity of at least about 200 candelas per square meter ($cd/m^2$) and preferably at least about 400 $cd/m^2$, and more preferably at least about 1,000 $cd/m^2$, so as to exhibit good contrast against the reflections off the mirror reflector therebehind when viewed by the driver of the vehicle equipped with the reflective element assembly and transparent OLED display, particularly on a sunny day. Because the transparent OLED display is disposed at the front surface of the front substrate of the reflective element assembly, the display information displayed by the transparent OLED display need not pass through a transflective mirror reflector coating at the third surface of the rear substrate, and thus the intensity of the display information is not reduced or attenuated by the mirror reflector of the mirror reflective element assembly. Optionally, and desirably, the intensity of the display may be controlled or adjusted responsive to a detected ambient light level at the mirror assembly and/or vehicle (such as responsive to an ambient light sensor of the mirror assembly of the like).

Because the transparent OLED display is disposed in front of the front surface of the reflective element assembly, the third surface reflector coating 222 at the front or third surface 214a of rear substrate 214 need not comprise a transflective coating or layer (i.e., a metallic layer or layers that is partially transmitting of light therethrough and partially reflective of light incident thereon). However, optionally, the third surface reflector coating 222 may comprise a transflective layer and the mirror reflective element assembly may have another display element disposed behind the rear or fourth surface 214*b* of rear substrate 214 and operable to transmit display information through the third surface reflector coating 222 for viewing by a person viewing the mirror assembly when the mirror assembly and reflective element assembly are normally mounted in a vehicle.

Thus, by placing a transparent OLED information display, such as a transparent OLED multipixel video display, at the front of the mirror reflective element assembly and in front of the mirror reflector, a video mirror can be formed (and may be suitable for use with the likes of a vision or imaging system of the vehicle, such as, for example, a reverse or backup aid system, such as a rearwardly directed vehicle vision system utilizing principles disclosed in U.S. Pat. Nos. 5,550,677; 5,760,962; 5,670,935; 6,201,642; 6,396,397; 6,498,620; 6,717,610 and/or 6,757,109, which are hereby incorporated herein by reference in their entireties, a trailer hitching aid or tow check system, such as the type disclosed in U.S. Pat. No. 7,005,974, which is hereby incorporated herein by reference in its entirety, a cabin viewing or monitoring device or system, such as a baby viewing or rear seat viewing camera or device or system or the like, such as disclosed in U.S. Pat. Nos. 5,877,897 and/or 6,690,268, which are hereby incorporated by reference in their entireties, a video communication device or system, such as disclosed in U.S. Pat. No. 6,690,268, which is hereby incorporated herein by reference in its entirety) without a need to utilize a transflective mirror reflector, and being transparent, the images and/or icons and/or characters and/or the like displayed by the transparent OLED display can be displayed on demand and appear contrasted with the reflected scene in the mirror reflective element. The presence of the transparent OLED information display device (such as a transparent OLED video display screen) in front of the mirror reflector is substantially non-discernible to a viewer viewing the mirror reflective element assembly by reason of the transparent OLED device comprising a substantially transparent substrate. Optionally, although shown and described as being disposed at the front of an electro-optic mirror reflective element assembly, a non-electro-optic mirror reflective element (such as a prismatic reflective element or a flat or curved or bent single substrate reflective element or the like) may incorporate a transparent OLED display thereat, while remaining within the spirit and scope of the present invention.

Optionally, the interior rearview mirror assembly may comprise a prismatic mirror assembly or a non-electro-optic mirror assembly or an electro-optic or electrochromic mirror assembly. For example, the interior rearview mirror assembly may comprise a prismatic mirror assembly, such as the types described in U.S. Pat. Nos. 7,249,860; 6,318,870; 6,598,980; 5,327,288; 4,948,242; 4,826,289; 4,436,371 and 4,435,042; and PCT Application No. PCT/US2004/015424, filed May 18, 2004 and published on Dec. 2, 2004, as International Publication No. WO 2004/103772, which are hereby incorporated herein by reference in their entireties. Optionally, the prismatic reflective element may comprise a conventional prismatic reflective element or prism or may comprise a prismatic reflective element of the types described in U.S. Pat. Nos. 7,420,756; 7,274,501; 7,249,860; 7,338,177 and/or 7,255,451, and/or PCT Application No. PCT/US03/29776, filed Sep. 19, 2003 and published Apr. 1, 2004 as International Publication No. WO 2004/026633; and/or PCT Application No. PCT/US2004/015424, filed May 18, 2004 and published on Dec. 2, 2004, as International Publication No. WO 2004/103772; and U.S. provisional application Ser. No. 60/525,952, filed Nov. 26, 2003, which are all hereby incorporated herein by reference in their entireties, without affecting the scope of the present invention. A variety of mirror accessories and constructions are known in the art, such as those disclosed in U.S. Pat. Nos. 5,555,136; 5,582,383; 5,680,263; 5,984,482; 6,227,675; 6,229,319 and 6,315,421 (the entire disclosures of which are hereby incorporated by reference herein), that can benefit from the present invention.

Optionally, the display screen and/or mirror may include user interface inputs, such as buttons or switches or touch or proximity sensors or the like, with which a user may adjust one or more characteristics of the imaging sensor and/or imaging system, such as via the principles described in U.S. patent application Ser. No. 12/091,525, filed Apr. 25, 2008, now U.S. Pat. No. 7,855,755; and/or Ser. No. 11/239,980, filed Sep. 30, 2005, now U.S. Pat. No. 7,881,496, and/or U.S. provisional applications, Ser. No. 60/614,644, filed Sep. 30, 2004; Ser. No. 60/618,686, filed Oct. 14, 2004; and Ser. No. 60/628,709, filed Nov. 17, 2004, which are hereby incorporated herein by reference in their entireties. Optionally, the images captured by the imaging sensor or camera may be processed by the control to extract information or data for different applications or systems, such as described in U.S. patent application Ser. No. 11/239,980, filed Sep. 30, 2005, now U.S. Pat. No. 7,881,496, and/or U.S. provisional application Ser. No. 60/618,686, filed Oct. 14, 2004, which are hereby incorporated herein by reference in their entireties.

The control of the mirror assembly and/or the display screen may receive image data or the like from an imaging sensor or camera positioned elsewhere at or on or in the vehicle, such as at a rearward portion of the vehicle with a rearward exterior field of view, or such as at an interior portion (such as at or near or associated with the interior rearview mirror assembly or an accessory module or windshield electronics module or the like) of the vehicle with an interior field of view (such as into the vehicle cabin) or an exterior field of view (such as forwardly of and through the windshield of the vehicle). The signal from the camera or image data may be communicated to the control via various communication links or video transmission medium, such as wires or cables (such as a CAT-3 shielded twisted pair wire or a CAT-5 coaxial cable or the like) or a fiber optic cable or via wireless communication, such as IR signals or VHF or UHF signals or the like, or via a multiplex bus system of the vehicle or the like. For example, the connection or link between the imaging sensor or controls and the mirror assembly and/or display screen module may be provided via vehicle electronic or communication systems and the like, and may be connected via various protocols or nodes, such as BLUETOOTH®, SCP, UBP, J1850, CAN J2284, Fire Wire 1394, MOST, LIN, FLEXRAY™, Byte Flight and/or the like, or other vehicle-based or in-vehicle communication links or systems (such as WIFI and/or IRDA), or via wireless communications such as VHF or UHF signals, and/or the like, depending on the particular application of the mirror/display system and the vehicle.

The imaging sensor or camera may provide various image data signals, such as an NTSC signal or LVDS, PAL, analog RGB, component video, SECAM, S-video or the like. Optionally, the imaging system may be operable to selectively switch between, for example, PAL and NTSC, to adjust the imaging system and mirror/display system to accommodate European and U.S. applications.

The interior rearview mirror assembly may include a bezel portion and casing, such as described above, or the mirror assembly may comprise other types of casings or bezel portions or the like, such as described in U.S. Pat. Nos. 7,249,860; 6,439,755; 4,826,289 and 6,501,387; and/or PCT Application No. PCT/US2004/015424, filed May 18, 2004 and published on Dec. 2, 2004, as International Publication No. WO 2004/103772; and/or U.S. patent applications, and/or Ser. No. 10/993,302, filed Nov. 19, 2004, now U.S. Pat. No. 7,338,177; and/or U.S. provisional application Ser. No. 60/525,952, filed Nov. 26, 2003, which are all hereby incorporated herein by reference in their entireties, without affecting the scope of the present invention. For example, the mirror assembly may comprise a flush or frameless or bezelless reflective element, such as the types described in U.S. Pat. Nos. 7,255,451; 7,274,501 and/or 7,184,190, and/or in PCT Application No. PCT/US2004/015424, filed May 18, 2004 and published on Dec. 2, 2004, as International Publication No. WO 2004/103772; PCT Application No. PCT/US03/35381, filed Nov. 5, 2003 and published May 21, 2004 as International Publication No. WO 2004/042457; and/or in U.S. patent application Ser. No. 11/140,396, filed May 27, 2005, now U.S. Pat. No. 7,360,932; Ser. No. 11/226,628, filed Sep. 14, 2005 and published Mar. 23, 2006 as U.S. Publication No. 2006/0061008; Ser. No. 11/912,576, filed Oct. 25, 2005, now U.S. Pat. No. 7,626,749; and/or Ser. No. 10/538,724, filed Jun. 13, 2005 and published Mar. 9, 2006 as U.S. Publication No. 2006/0050018; and/or in U.S. provisional applications, Ser. No. 60/563,342, filed Apr. 19, 2004; Ser. No. 60/629,926, filed Nov. 22, 2004; Ser. No. 60/624,320, filed Nov. 2, 2004; Ser. No. 60/681,250, filed May 16, 2005; Ser. No. 60/690,400, filed Jun. 14, 2005; Ser. No. 60/695,149, filed Jun. 29, 2005; and/or Ser. No. 60/730,334, filed Oct. 26, 2005, which are all hereby incorporated herein by reference in their entireties.

Optionally, the mirror assembly may comprise a modular mirror construction, and may include back housing portions or the like, such as cap portions of the types described in PCT Application No. PCT/US2004/015424, filed May 18, 2004 and published on Dec. 2, 2004, as International Publication No. WO 2004/103772, which is hereby incorporated herein by reference in its entirety. The display screen may be provided as a modular display screen and may be mountable or installable in the appropriate or suitable mirror casing to provide a modular mirror assembly and display screen. For example, a rear casing or cap portion may include the display screen module including the associated components, such as the rails and motor and the like, and may be attachable to a reflective element and/or bezel portion to assemble the modular mirror assembly. The display screen module thus may be provided as an optional component or accessory for a vehicle, and may be readily assembled to a common reflective element and/or bezel portion of the mirror assembly.

Optionally, the mirror casing and/or reflective element, and/or the display screen casing and/or display screen may include customized or personalized viewable characteristics, such as color or symbols or indicia selected by the vehicle manufacturer or owner of the vehicle, such as the customization characteristics described in PCT Application No. PCT/US2004/015424, filed May 18, 2004 and published on Dec. 2, 2004, as International Publication No. WO 2004/103772; and/or U.S. patent application Ser. No. 11/912,576, filed Oct. 25, 2005, now U.S. Pat. No. 7,626,749; Ser. No. 11/243,783, filed Oct. 5, 2005 and published Apr. 20, 2006 as U.S. Publication No. 2006-0082192; and/or Ser. No. 11/021,065, filed Dec. 23, 2004, now U.S. Pat. No. 7,255,451; and/or U.S. provisional applications, Ser. No. 60/553,842, filed Mar. 17, 2004; Ser. No. 60/563,342, filed Apr. 19, 2004; Ser. No. 60/629,926, filed Nov. 22, 2004; Ser. No. 60/681,250, filed May 16, 2005; Ser. No. 60/690,400, filed Jun. 14, 2005; Ser. No. 60/695,149, filed Jun. 29, 2005; Ser. No. 60/730,334, filed Oct. 26, 2005; and/or Ser. No. 60/616,182, filed Oct. 5, 2004, which are hereby incorporated herein by reference in their entireties. For example, the frame or casing of the display module and/or the mirror assembly may be selected to have a desired color or combination of colors (or text or print or indicia thereon) to personalize the appearance of the mirror assembly. Optionally, the reflective element may include text or symbols or icons or other characters or indicia to provide a desired appearance or message at the mirror assembly or display screen, such as by utilizing aspects of the mirror assembly described in PCT Application No. PCT/US2004/015424, filed May 18, 2004 and published on Dec. 2, 2004, as International Publication No. WO 2004/103772; and/or U.S. patent application Ser. No. 11/912,576, filed Oct. 25, 2005, now U.S. Pat. No. 7,626,749; Ser. No. 11/243,783, filed Oct. 5, 2005 and published Apr. 20, 2006 as U.S. Publication No. 2006-0082192, which are hereby incorporated herein by reference in their entireties. The icons or characters or indicia may be formed at or near or on the display screen, or may be provided via graphic overlays when the display screen is extended and operating, or may otherwise be formed or provided at or on or in the display screen casing or frame, without affecting the scope of the present invention. Optionally, the bezel or frame color or colors may be selected to be designer colors or may match or contrast the color of the mirror casing, and/or may have logos or icons or other indicia thereon. Optionally, the display screen module may include warnings or other statements or alerts or messages printed or otherwise formed on the bezel or frame portion of the display screen so that the messages or the like are readily viewable when the display screen is extended.

Optionally, the mirror assembly and/or prismatic or electrochromic reflective element may include one or more displays, such as for the accessories or circuitry described herein. The displays may be similar to those described above, or may be of types disclosed in U.S. Pat. Nos. 5,530,240 and/or 6,329,925, which are hereby incorporated herein by reference in their entireties, and/or may be display-on-demand or transflective type displays, such as the types disclosed in U.S. Pat. Nos. 7,195,381; 6,690,298; 5,668,663 and/or 5,724,187, and/or in U.S. patent application Ser. No. 11/226,628, filed Sep. 14, 2005 and published Mar. 23, 2006 as U.S. Publication No. 2006/0061008; and/or Ser. No. 10/993,302, filed Nov. 19, 2004, now U.S. Pat. No. 7,338,177; and/or in U.S. provisional applications, Ser. No. 60/525,952, filed Nov. 26, 2003; Ser. No. 60/717,093, filed Sep. 14, 2005; and/or Ser. No. 60/732,245, filed Nov. 1, 2005, and/or in PCT Application No. PCT/US03/29776, filed Sep. 19, 2003 and published Apr. 1, 2004 as International Publication No. WO 2004/026633, which are all hereby incorporated herein by reference in their entireties. Optionally, a prismatic reflective element may comprise a display on demand or transflective prismatic element (such as described in PCT Application No. PCT/US03/29776, filed Sep. 19, 2003 and published Apr. 1, 2004 as International Publication No. WO 2004/026633; and/or U.S. patent application Ser. No. 10/993,302, filed Nov. 19, 2004, now U.S. Pat. No. 7,338,177; and/or U.S. provisional application Ser. No. 60/525,952, filed Nov. 26, 2003, which are all hereby incorporated herein by reference in their entireties) so that the displays are viewable through the reflective element, while the display area still functions to substantially reflect light, in order to provide a generally uniform prismatic reflective element even in the areas that have display elements positioned behind the reflective element.

Optionally, the display and any associated user inputs may be associated with various accessories or systems, such as, for example, a tire pressure monitoring system or a passenger air bag status or a garage door opening system or a telematics system or any other accessory or system of the mirror assembly or of the vehicle or of an accessory module or console of the vehicle, such as an accessory module or console of the types described in U.S. Pat. Nos. 6,877,888; 6,824,281; 6,690,268; 6,672,744; 6,386,742 and 6,124,886, and/or, and/or PCT Application No. PCT/US03/03012, filed Jan. 31, 2003 and published Aug. 7, 2003 as International Publication No. WO 03/065084, and/or PCT Application No. PCT/US03/40611, filed Dec. 19, 2003 and published Jul. 15, 2004 as International Publication No. WO 2004/058540, and/or PCT Application No. PCT/US04/15424, filed May 18, 2004 and published on Dec. 2, 2004, as International Publication No. WO 2004/103772, which are hereby incorporated herein by reference in their entireties.

Optionally, the user inputs of the mirror assembly or display or module may comprise other types of buttons or switches for controlling or activating/deactivating one or more electrical accessories or devices of or associated with the mirror assembly. The mirror assembly may comprise any type of switches or buttons, such as touch or proximity sensing switches, such as touch or proximity switches of the types described above, or the inputs may comprise other types of buttons or switches, such as those described in U.S. patent application Ser. No. 11/029,695, filed Jan. 5, 2005, now U.S. Pat. No. 7,253,723; and/or U.S. provisional applications, Ser. No. 60/553,517, filed Mar. 16, 2004; Ser. No. 60/535,559, filed Jan. 9, 2004; Ser. No. 60/690,401, filed Jun. 14, 2005; and Ser. No. 60/719,482, filed Sep. 22, 2005, which are hereby incorporated herein by reference in their entireties, or such as fabric-made position detectors, such as those described in U.S. Pat. Nos. 6,504,531; 6,501,465; 6,492,980; 6,452,479; 6,437,258 and 6,369,804, which are hereby incorporated herein by reference in their entireties. For example, the inputs may comprise a touch or proximity sensor of the types commercially available from TouchSensor Technologies, LLC of Wheaton, Ill. The touch or proximity sensor may be operable to generate an electric field and to detect the presence of a conductive mass entering the field. When a voltage is applied to the sensor, the sensor generates the electric field, which emanates through any dielectric material, such as plastic or the like, at the sensor. When a conductive mass (such as a person's finger or the like, or metal or the like) enters the electric field, the sensor may detect a change in the field and may indicate such a detection. Other types of switches or buttons or inputs or sensors may be incorporated to provide the desired function, without affecting the scope of the present invention.

Optionally, the user inputs or buttons may comprise user inputs for a garage door opening system, such as a vehicle based garage door opening system of the types described in U.S. Pat. Nos. 6,396,408; 6,362,771; 7,023,322 and 5,798,688, and/or U.S. provisional applications, Ser. No. 60/502,806, filed Sep. 12, 2003; and Ser. No. 60/444,726, filed Feb. 4, 2003, which are hereby incorporated herein by reference in their entireties. The user inputs may also or otherwise function to activate and deactivate a display or function or accessory, and/or may activate/deactivate and/or commence a calibration of a compass system of the mirror assembly and/or vehicle. The compass system may include compass sensors and circuitry within the mirror assembly or within a compass pod or module at or near or associated with the mirror assembly. Optionally, the user inputs may also or otherwise comprise user inputs for a telematics system of the vehicle, such as, for example, an ONSTAR® system as found in General Motors vehicles and/or such as described in U.S. Pat. Nos. 4,862,594; 4,937,945; 5,131,154; 5,255,442; 5,632,092; 5,798,688; 5,971,552; 5,924,212; 6,243,003; 6,278,377 and 6,420,975; 6,477,464; 6,946,978; 7,308,341; 7,167,796; 7,004,593 and/or 6,678,614, and/or PCT Application No. PCT/US03/40611, filed Dec. 19, 2003 and published Jul. 15, 2004 as International Publication No. WO 2004/058540, and/or PCT Application No. PCT/US03/308877, filed Oct. 1, 2003 and published Apr. 15, 2004 as International Publication No. WO 2004/032568, which are all hereby incorporated herein by reference in their entireties.

Optionally, the mirror assembly may include one or more other accessories at or within the mirror casing, such as one or more electrical or electronic devices or accessories, such as antennas, including global positioning system (GPS) or cellular phone antennas, such as disclosed in U.S. Pat. No. 5,971,552, a communication module, such as disclosed in U.S. Pat. No. 5,798,688, a blind spot detection system, such as disclosed in U.S. Pat. Nos. 5,929,786 and/or 5,786,772, transmitters and/or receivers, such as a garage door opener or the like, a digital network, such as described in U.S. Pat. No. 5,798,575, a high/low headlamp controller, such as disclosed in U.S. Pat. Nos. 5,796,094 and/or 5,715,093, a memory mirror system, such as disclosed in U.S. Pat. No. 5,796,176, a hands-free phone attachment, a video device for internal cabin surveillance and/or video telephone function, such as disclosed in U.S. Pat. Nos. 5,760,962 and/or 5,877,897, a remote keyless entry receiver, lights, such as map reading lights or one or more other lights or illumination sources, such as disclosed in U.S. Pat. Nos. 6,690,268; 5,938,321; 5,813,745; 5,820,245; 5,673,994; 5,649,756; 5,178,448; 5,671,996; 4,646,210; 4,733,336; 4,807,096; 6,042,253; 5,669,698; 7,195,381; 6,971,775 and/or 7,249,860, microphones, such as disclosed in U.S. Pat. Nos. 6,243,003; 6,278,377 and/or 6,420,975; and/or U.S. patent application Ser. No. 10/529,715, filed Mar. 30, 2005, now U.S. Pat. No. 7,657,052; and/or PCT Application No. PCT/US03/30877, filed Oct. 1, 2003, and published Apr. 15, 2004 as International Publication No. WO 2004/032568, speakers, antennas, including global positioning system (GPS) or cellular phone antennas, such as disclosed in U.S. Pat. No. 5,971,552, a communication module, such as disclosed in U.S. Pat. No. 5,798,688, a voice recorder, a blind spot detection system, such as disclosed in U.S. Pat. Nos. 5,929,786 and/or 5,786,772, and/or U.S. patent application Ser. No. 10/427,051, filed Apr. 30, 2003, now U.S. Pat. No. 7,038,577; and Ser. No. 10/209,173, filed Jul. 31, 2002, now U.S. Pat. No. 6,882,287; and/or U.S. provisional application Ser. No. 60/638,687, filed Dec. 23, 2004, transmitters and/or receivers, such as for a garage door opener or a vehicle door unlocking system or the like (such as a remote keyless entry system), a digital network, such as described in U.S. Pat. No. 5,798,575, a high/low headlamp controller, such as a camera-based headlamp control, such as disclosed in U.S. Pat. Nos. 5,796,094 and/or 5,715,093, a memory mirror system, such as disclosed in U.S. Pat. No. 5,796,176, a hands-free phone attachment, an imaging system or components or circuitry or display thereof, such as an imaging and/or display system of the types described in U.S. Pat. Nos. 6,690,268 and 6,847,487; and/or U.S. provisional applications, Ser. No. 60/614,644, filed Sep. 30, 2004; Ser. No. 60/618,686, filed Oct. 14, 2004; Ser. No. 60/628,709, filed Nov. 17, 2004; Ser. No. 60/644,903, filed Jan. 11, 2005; Ser.

No. 60/667,049, filed Mar. 31, 2005; and/or U.S. patent application Ser. No. 11/105,757, filed Apr. 14, 2005, now U.S. Pat. No. 7,526,103, a video device for internal cabin surveillance (such as for sleep detection or driver drowsiness detection or the like) and/or video telephone function, such as disclosed in U.S. Pat. Nos. 5,760,962 and/or 5,877,897, a remote keyless entry receiver, a seat occupancy detector, a remote starter control, a yaw sensor, a clock, a carbon monoxide detector, status displays, such as displays that display a status of a door of the vehicle, a transmission selection (4wd/2wd or traction control (TCS) or the like), an antilock braking system, a road condition (that may warn the driver of icy road conditions) and/or the like, a trip computer, a tire pressure monitoring system (TPMS) receiver (such as described in U.S. Pat. Nos. 6,124,647; 6,294,989; 6,445,287; 6,472,979; 6,731,205 and/or 7,423,522, and/or U.S. provisional application Ser. No. 60/611,796, filed Sep. 21, 2004), and/or an ONSTAR® system, a compass, such as disclosed in U.S. Pat. Nos. 5,924,212; 4,862,594; 4,937,945; 5,131,154; 5,255,442 and/or 5,632,092, an alert system and/or components or elements thereof (such as described in U.S. provisional applications, Ser. No. 61/180,257, filed May 21, 2009; Ser. No. 61/156,184, filed Feb. 27, 2009; and Ser. No. 61/174,596, filed May 1, 2009, which are hereby incorporated herein by reference in their entireties), and/or any other accessory or circuitry or the like (with all of the above-referenced patents and PCT and U.S. patent applications being commonly assigned, and with the disclosures of the referenced patents and patent applications being hereby incorporated herein by reference in their entireties).

Optionally, the accessory or accessories, such as those described above and/or below, may be positioned at or within the mirror casing and may be included on or integrated in a printed circuit board positioned within the mirror casing, such as along a rear surface of the reflective element or elsewhere within a cavity defined by the casing, without affecting the scope of the present invention. The user actuatable inputs and/or touch sensors and/or proximity sensors and displays described above may be actuatable to control and/or adjust the accessories of the mirror assembly/system and/or overhead console and/or accessory module and/or vehicle. The connection or link between the controls and the display screen device and/or the navigation system and/or other systems and accessories of the mirror system may be provided via vehicle electronic or communication systems and the like, and may be connected via various protocols or nodes, such as BLUETOOTH®, SCP, UBP, J1850, CAN J2284, Fire Wire 1394, MOST, LIN, FLEXRAY™, Byte Flight and/or the like, or other vehicle-based or in-vehicle communication links or systems (such as WIFI and/or IRDA) and/or the like, or via VHF or UHF or other wireless transmission formats, depending on the particular application of the mirror/accessory system and the vehicle. Optionally, the connections or links may be provided via various wireless connectivity or links, without affecting the scope of the present invention.

Changes and modifications in the specifically described embodiments may be carried out without departing from the principles of the present invention, which is intended to be limited only by the scope of the appended claims as interpreted according to the principles of patent law.

The invention claimed is:

1. A vehicular video camera display system, the vehicular video camera display system comprising:
an interior rearview mirror assembly comprising a casing and an electro-optic reflective element;
the interior rearview mirror assembly configured for mounting at an interior cabin portion of a vehicle equipped with the vehicular video camera display system;
wherein the electro-optic reflective element comprises a front substrate and a rear substrate with an electro-optic medium disposed therebetween;
wherein the front substrate has a first side and a second side and the rear substrate has a third side and a fourth side, and wherein the second side of the front substrate and the third side of the rear substrate is in contact with the electro-optic medium;
wherein a video display device is disposed in the casing behind the electro-optic reflective element;
wherein, with the interior rearview mirror assembly mounted at the interior cabin portion of the equipped vehicle, a video display screen of the video display device is operable to display video images that are viewable through the electro-optic reflective element by a driver of the equipped vehicle who is viewing the interior rearview mirror assembly mounted in the equipped vehicle;
a rearward-viewing video camera disposed at a rear portion of the equipped vehicle;
the rearward-viewing video camera viewing at least rearward of the equipped vehicle;
the rearward-viewing video camera comprising a CMOS imaging array sensor operable to capture image data representative of a scene viewed by the rearward-viewing video camera;
wherein control circuitry is disposed at the interior rearview mirror assembly;
wherein image data captured by the rearward-viewing video camera is communicated as a digital signal from the rearward-viewing video camera via a shielded twisted pair wire to the control circuitry disposed at the interior rearview mirror assembly; and
wherein the communication via the shielded twisted pair wire of captured image data from the rearward-viewing video camera to the control circuitry uses low-voltage differential signaling (LVDS).

2. The vehicular video camera display system of claim 1, wherein the shielded twisted pair wire comprises a CAT-3 shielded twisted pair wire.

3. The vehicular video camera display system of claim 1, wherein the control circuitry disposed at the interior rearview mirror assembly is operable to generate at least one graphic overlay that is electronically generated and is superimposed on video images displayed at the video display device that are derived, at least in part, from the image data communicated via the shielded twisted pair wire from the rearward-viewing video camera to the control circuitry disposed at the interior rearview mirror assembly.

4. The vehicular video camera display system of claim 1, wherein the control circuitry disposed at the interior rearview mirror assembly has Universal Asynchronous Receiver/Transmitter (UART) capability.

5. The vehicular video camera display system of claim 1, wherein the control circuitry disposed at the interior rearview mirror assembly has Inter-Integrated Circuit ($I^2C$) capability.

6. The vehicular video camera display system of claim 1, wherein the control circuitry disposed at the interior rearview mirror assembly has Serial Peripheral Interface (SPI) capability.

7. The vehicular video camera display system of claim 1, wherein the control circuitry disposed at the interior rearview mirror assembly comprises a transceiver.

8. The vehicular video camera display system of claim 1, wherein the control circuitry disposed at the interior rearview mirror assembly links to a vehicular bus network system of the equipped vehicle.

9. The vehicular video camera display system of claim 8, wherein the vehicular bus network system of the equipped vehicle comprises a Local Interconnect Network (LIN).

10. The vehicular video camera display system of claim 8, wherein the vehicular bus network system of the equipped vehicle comprises a Controller Area Network (CAN).

11. The vehicular video camera display system of claim 1, wherein the control circuitry disposed at the interior rearview mirror assembly comprises a microprocessor.

12. The vehicular video camera display system of claim 1, wherein the control circuitry disposed at the interior rearview mirror assembly is operable to control dimming of the electro-optic reflective element.

13. The vehicular video camera display system of claim 12, wherein the control circuitry disposed at the interior rearview mirror assembly, when the electro-optic reflective element is dimmed from a higher reflectivity state to a lower reflectivity state, increases display luminance of video images displayed at the video display device for viewing by the driver of the equipped vehicle.

14. The vehicular video camera display system of claim 13, wherein the interior rearview mirror assembly includes (i) a glare light sensor for sensing glare light at the electro-optic reflective element and (ii) an ambient light sensor for sensing ambient light at the interior rearview mirror assembly, and wherein the control circuitry disposed at the interior rearview mirror assembly controls dimming of the electro-optic reflective element responsive to a glare light output of the glare light sensor and an ambient light output of the ambient light sensor.

15. The vehicular video camera display system of claim 1, wherein the interior rearview mirror assembly comprises a decoder that decodes the digital signal communicated from the rearward-viewing video camera via the shielded twisted pair wire to the control circuitry disposed at the interior rearview mirror assembly.

16. The vehicular video camera display system of claim 15, wherein the decoder interfaces with a vehicular bus network system of the equipped vehicle.

17. The vehicular video camera display system of claim 1, wherein the video display screen comprises a liquid crystal video display screen.

18. The vehicular video camera display system of claim 17, wherein the control circuitry disposed at the interior rearview mirror assembly controls a plurality of light emitting diodes to provide backlighting of the liquid crystal video display screen.

19. The vehicular video camera display system of claim 1, wherein the rearward-viewing video camera comprises a rear backup camera of the equipped vehicle.

20. The vehicular video camera display system of claim 1, wherein the control circuitry disposed at the interior rearview mirror assembly is operable to control the video display device to display video images that are derived, at least in part, from image data communicated via the shielded twisted pair wire from the rearward-viewing video camera to the control circuitry disposed at the interior rearview mirror assembly.

21. The vehicular video camera display system of claim 1, wherein the control circuitry disposed at the interior rearview mirror assembly is operable to generate textual information that is electronically generated and is superimposed on video images displayed at the video display device that are derived, at least in part, from image data communicated via the shielded twisted pair wire from the rearward-viewing video camera to the control circuitry disposed at the interior rearview mirror assembly.

22. The vehicular video camera display system of claim 1, wherein the control circuitry disposed at the interior rearview mirror assembly is operable to generate iconistic information that is electronically generated and is superimposed on video images displayed at the video display device that are derived, at least in part, from the communication via the shielded twisted wire pair of captured image data from the rearward-viewing video camera to the control circuitry disposed at the interior rearview mirror assembly.

23. The vehicular video camera display system of claim 1, wherein the video display screen comprises an organic light emitting diode (OLED) video display screen.

24. The vehicular video camera display system of claim 1, wherein the control circuitry disposed at the interior rearview mirror assembly is operable to control display at the video display device of video images, viewable by the driver of the equipped vehicle while viewing the interior rearview mirror assembly, having a display luminance greater than 700 cd/m$^2$ derived, at least in part, from image data communicated via the shielded twisted pair wire from the rearward-viewing video camera to the control circuitry disposed at the interior rearview mirror assembly.

25. The vehicular video camera display system of claim 1, wherein a transflective mirror reflector is disposed at the rear substrate of the electro-optic reflective element, and wherein the transflective mirror reflector at least partially reflects light incident thereon and at least partially transmits incident light therethrough.

26. The vehicular video camera display system of claim 1, wherein the interior cabin portion of the equipped vehicle comprises a portion of an in-cabin side of a windshield of the equipped vehicle.

27. The vehicular video camera display system of claim 1, wherein the electro-optic reflective element comprises an electrochromic reflective element, and wherein the electro-optic medium comprises an electrochromic medium.

28. The vehicular video camera display system of claim 1, wherein the electro-optic reflective element comprises a liquid crystal reflective element, and wherein the electro-optic medium comprises a liquid crystal medium.

29. A vehicular video camera display system, the vehicular video camera display system comprising:
   an interior rearview mirror assembly comprising a casing and an electrochromic reflective element;
   the interior rearview mirror assembly configured for mounting at an interior cabin portion of a vehicle equipped with the vehicular video camera display system;
   wherein the interior cabin portion of the equipped vehicle comprises a portion of an in-cabin side of a windshield of the equipped vehicle;
   wherein the electrochromic reflective element comprises a front substrate and a rear substrate with an electrochromic medium disposed therebetween;
   wherein the front substrate has a first side and a second side and the rear substrate has a third side and a fourth side, and wherein the second side of the front substrate and the third side of the rear substrate is in contact with the electrochromic medium;

wherein a video display device is disposed in the casing behind the electrochromic reflective element;

wherein, with the interior rearview mirror assembly mounted at the interior cabin portion of the equipped vehicle, a video display screen of the video display device is operable to display video images that are viewable through the electrochromic reflective element by a driver of the equipped vehicle who is viewing the interior rearview mirror assembly mounted in the equipped vehicle;

a rearward-viewing video camera disposed at a rear portion of the equipped vehicle;

the rearward-viewing video camera viewing at least rearward of the equipped vehicle;

the rearward-viewing video camera comprising a CMOS imaging array sensor operable to capture image data representative of a scene viewed by the rearward-viewing video camera;

wherein control circuitry is disposed at the interior rearview mirror assembly;

wherein the control circuitry disposed at the interior rearview mirror assembly links to a vehicular bus network system of the equipped vehicle;

wherein image data captured by the rearward-viewing video camera is communicated as a digital signal from the rearward-viewing video camera via a shielded twisted pair wire to the control circuitry disposed at the interior rearview mirror assembly; and wherein the communication via the shielded twisted pair wire of captured image data from the rearward-viewing video camera to the control circuitry uses low-voltage differential signaling (LVDS).

30. The vehicular video camera display system of claim 29, wherein the shielded twisted pair wire comprises a CAT-3 shielded twisted pair wire.

31. The vehicular video camera display system of claim 29, wherein the control circuitry disposed at the interior rearview mirror assembly is operable to generate at least one graphic overlay that is electronically generated and is superimposed on video images displayed at the video display device that are derived, at least in part, from the image data communicated via the shielded twisted pair wire from the rearward-viewing video camera to the control circuitry disposed at the interior rearview mirror assembly.

32. The vehicular video camera display system of claim 29, wherein the control circuitry disposed at the interior rearview mirror assembly has Universal Asynchronous Receiver/Transmitter (UART) capability.

33. The vehicular video camera display system of claim 29, wherein the control circuitry disposed at the interior rearview mirror assembly has Inter-Integrated Circuit (I2C) capability.

34. The vehicular video camera display system of claim 29, wherein the control circuitry disposed at the interior rearview mirror assembly has Serial Peripheral Interface (SPI) capability.

35. The vehicular video camera display system of claim 29, wherein the control circuitry disposed at the interior rearview mirror assembly comprises a transceiver.

36. The vehicular video camera display system of claim 29, wherein the vehicular bus network system of the equipped vehicle comprises a Local Interconnect Network (LIN).

37. The vehicular video camera display system of claim 29, wherein the vehicular bus network system of the equipped vehicle comprises a Controller Area Network (CAN).

38. The vehicular video camera display system of claim 29, wherein the control circuitry disposed at the interior rearview mirror assembly comprises a microprocessor.

39. The vehicular video camera display system of claim 29, wherein the interior rearview mirror assembly comprises a decoder that decodes the digital signal communicated from the rearward-viewing video camera via the shielded twisted pair wire to the control circuitry disposed at the interior rearview mirror assembly.

40. The vehicular video camera display system of claim 39, wherein the decoder interfaces with the vehicular bus network system of the equipped vehicle.

41. The vehicular video camera display system of claim 29, wherein the control circuitry disposed at the interior rearview mirror assembly is operable to control dimming of the electrochromic reflective element.

42. The vehicular video camera display system of claim 29, wherein the control circuitry disposed at the interior rearview mirror assembly, when the electrochromic reflective element is undimmed from a lower reflectivity state to a higher reflectivity state, decreases display luminance of video images displayed at the video display device.

43. The vehicular video camera display system of claim 42, wherein the interior rearview mirror assembly includes (i) a glare light sensor for sensing glare light at the electrochromic reflective element and (ii) an ambient light sensor for sensing ambient light at the interior rearview mirror assembly, and wherein the control circuitry disposed at the interior rearview mirror assembly controls dimming of the electrochromic reflective element responsive to a glare light output of the glare light sensor and an ambient light output of the ambient light sensor.

44. The vehicular video camera display system of claim 29, wherein the video display screen comprises a liquid crystal video display screen.

45. The vehicular video camera display system of claim 44, wherein the control circuitry disposed at the interior rearview mirror assembly controls a plurality of light emitting diodes to provide backlighting of the liquid crystal video display screen.

46. The vehicular video camera display system of claim 29, wherein the rearward-viewing video camera comprises a rear backup camera of the equipped vehicle.

47. The vehicular video camera display system of claim 29, wherein the control circuitry disposed at the interior rearview mirror assembly is operable to control the video display device to display video images that are derived, at least in part, from image data communicated via the shielded twisted pair wire from the rearward-viewing video camera to the control circuitry disposed at the interior rearview mirror assembly.

48. The vehicular video camera display system of claim 29, wherein the control circuitry disposed at the interior rearview mirror assembly is operable to generate textual information that is electronically generated and is superimposed on video images displayed at the video display device that are derived, at least in part, from image data communicated via the shielded twisted pair wire from the rearward-viewing video camera to the control circuitry disposed at the interior rearview mirror assembly.

49. The vehicular video camera display system of claim 29, wherein the control circuitry disposed at the interior rearview mirror assembly is operable to generate iconistic information that is electronically generated and is superimposed on video images displayed at the video display device that are derived, at least in part, from the communication via the shielded twisted wire pair of captured image data from the rearward-viewing video camera to the control circuitry disposed at the interior rearview mirror assembly.

50. The vehicular video camera display system of claim 29, wherein the video display screen comprises an organic light emitting diode (OLED) video display screen.

51. The vehicular video camera display system of claim 29, wherein the control circuitry disposed at the interior rearview mirror assembly is operable to control display at the video display device of video images, viewable by the driver of the equipped vehicle while viewing the interior rearview mirror assembly, having a display luminance greater than 700 cd/m2 derived, at least in part, from image data communicated via the shielded twisted pair wire from the rearward-viewing video camera to the control circuitry disposed at the interior rearview mirror assembly.

52. The vehicular video camera display system of claim 29, wherein a transflective mirror reflector is disposed at the rear substrate of the electrochromic reflective element, and wherein the transflective mirror reflector at least partially reflects light incident thereon and at least partially transmits incident light therethrough.

53. A vehicular video camera display system, the vehicular video camera display system comprising:
    an interior rearview mirror assembly comprising a casing and an electro-optic reflective element;
    the interior rearview mirror assembly configured for mounting at an interior cabin portion of a vehicle equipped with the vehicular video camera display system;
    wherein the electro-optic reflective element comprises a front substrate and a rear substrate with an electro-optic medium disposed therebetween;
    wherein the front substrate has a first side and a second side and the rear substrate has a third side and a fourth side, and wherein the second side of the front substrate and the third side of the rear substrate is in contact with the electro-optic medium;
    wherein a video display device is disposed in the casing behind the electro-optic reflective element;
    wherein, with the interior rearview mirror assembly mounted at the interior cabin portion of the equipped vehicle, a video display screen of the video display device is operable to display video images that are viewable through the electro-optic reflective element by a driver of the equipped vehicle who is viewing the interior rearview mirror assembly mounted in the equipped vehicle;
    a rearward-viewing video camera disposed at a rear portion of the equipped vehicle;
    the rearward-viewing video camera viewing at least rearward of the equipped vehicle;
    the rearward-viewing video camera comprising a CMOS imaging array sensor operable to capture image data representative of a scene viewed by the rearward-viewing video camera;
    wherein control circuitry is disposed at the interior rearview mirror assembly;
    wherein the control circuitry disposed at the interior rearview mirror assembly links to a vehicular bus network system of the equipped vehicle; and
    wherein image data captured by the rearward-viewing video camera is communicated as an analog signal from the rearward-viewing video camera via a twisted pair wire to the control circuitry disposed at the interior rearview mirror assembly.

54. The vehicular video camera display system of claim 53, wherein the analog signal communicated via the twisted pair wire from the rearward-viewing video camera to the control circuitry comprises a National Television Standards Committee (NTSC) signal.

55. The vehicular video camera display system of claim 54, wherein the control circuitry disposed at the interior rearview mirror assembly is operable to generate at least one graphic overlay that is electronically generated and is superimposed on video images displayed at the video display device that are derived, at least in part, from the image data communicated via the twisted pair wire from the rearward-viewing video camera to the control circuitry disposed at the interior rearview mirror assembly.

56. The vehicular video camera display system of claim 54, wherein the control circuitry disposed at the interior rearview mirror assembly has Universal Asynchronous Receiver/Transmitter (UART) capability.

57. The vehicular video camera display system of claim 54, wherein the control circuitry disposed at the interior rearview mirror assembly has Inter-Integrated Circuit (I²C) capability.

58. The vehicular video camera display system of claim 54, wherein the control circuitry disposed at the interior rearview mirror assembly has Serial Peripheral Interface (SPI) capability.

59. The vehicular video camera display system of claim 54, wherein the control circuitry disposed at the interior rearview mirror assembly comprises a transceiver.

60. The vehicular video camera display system of claim 54, wherein the vehicular bus network system of the equipped vehicle comprises a Local Interconnect Network (LIN).

61. The vehicular video camera display system of claim 54, wherein the vehicular bus network system of the equipped vehicle comprises a Controller Area Network (CAN).

62. The vehicular video camera display system of claim 54, wherein the control circuitry disposed at the interior rearview mirror assembly comprises a microprocessor.

63. The vehicular video camera display system of claim 54, wherein the interior rearview mirror assembly comprises a decoder that decodes the analog signal communicated from the rearward-viewing video camera via the twisted pair wire to the control circuitry disposed at the interior rearview mirror assembly.

64. The vehicular video camera display system of claim 63, wherein the decoder interfaces with the vehicular bus network system of the equipped vehicle.

65. The vehicular video camera display system of claim 54, wherein the control circuitry disposed at the interior rearview mirror assembly is operable to control dimming of the electro-optic reflective element.

66. The vehicular video camera display system of claim 65, wherein the control circuitry disposed at the interior rearview mirror assembly, when the electro-optic reflective element is dimmed from a higher reflectivity state to a lower reflectivity state, increases display luminance of video images displayed at the video display device for viewing by the driver of the equipped vehicle.

67. The vehicular video camera display system of claim 54, wherein the interior rearview mirror assembly includes (i) a glare light sensor for sensing glare light at the electro-optic reflective element and (ii) an ambient light sensor for sensing ambient light at the interior rearview mirror assembly, and wherein the control circuitry disposed at the interior rearview mirror assembly controls dimming of the electro-optic reflective element responsive to a glare light output of the glare light sensor and an ambient light output of the ambient light sensor.

68. The vehicular video camera display system of claim 54, wherein the interior cabin portion of the equipped vehicle comprises a portion of an in-cabin side of a windshield of the equipped vehicle.

69. The vehicular video camera display system of claim 68, wherein the electro-optic reflective element comprises an electrochromic reflective element, and wherein the electro-optic medium comprises an electrochromic medium.

70. The vehicular video camera display system of claim 68, wherein the electro-optic reflective element comprises a liquid crystal reflective element, and wherein the electro-optic medium comprises a liquid crystal medium.

71. The vehicular video camera display system of claim 53, wherein the video display screen comprises a liquid crystal video display screen.

72. The vehicular video camera display system of claim 71, wherein the control circuitry disposed at the interior rearview mirror assembly controls a plurality of light emitting diodes to provide backlighting of the liquid crystal video display screen.

73. The vehicular video camera display system of claim 53, wherein the rearward-viewing video camera comprises a rear backup camera of the equipped vehicle.

74. The vehicular video camera display system of claim 53, wherein the control circuitry disposed at the interior rearview mirror assembly is operable to control the video display device to display video images that are derived, at least in part, from image data communicated via the twisted pair wire from the rearward-viewing video camera to the control circuitry disposed at the interior rearview mirror assembly.

75. The vehicular video camera display system of claim 74, wherein the control circuitry disposed at the interior rearview mirror assembly is operable to generate textual information that is electronically generated and is superimposed on video images displayed at the video display device that are derived, at least in part, from image data communicated via the twisted pair wire from the rearward-viewing video camera to the control circuitry disposed at the interior rearview mirror assembly.

76. The vehicular video camera display system of claim 74, wherein the control circuitry disposed at the interior rearview mirror assembly is operable to generate iconistic information that is electronically generated and is superimposed on video images displayed at the video display device that are derived, at least in part, from the communication via the twisted wire pair of captured image data from the rearward-viewing video camera to the control circuitry disposed at the interior rearview mirror assembly.

77. The vehicular video camera display system of claim 53, wherein the video display screen comprises an organic light emitting diode (OLED) video display screen.

78. The vehicular video camera display system of claim 53, wherein the control circuitry disposed at the interior rearview mirror assembly is operable to control display at the video display device of video images, viewable by the driver of the equipped vehicle while viewing the interior rearview mirror assembly, having a display luminance greater than 700 cd/m$^2$ derived, at least in part, from image data communicated via the twisted pair wire from the rearward-viewing video camera to the control circuitry disposed at the interior rearview mirror assembly.

79. The vehicular video camera display system of claim 53, wherein a transflective mirror reflector is disposed at the rear substrate of the electro-optic reflective element, and wherein the transflective mirror reflector at least partially reflects light incident thereon and at least partially transmits incident light therethrough.

* * * * *